US012660566B2

(12) United States Patent (10) Patent No.: US 12,660,566 B2
Yamauchi (45) Date of Patent: Jun. 16, 2026

(54) BONDING METHOD, SUBSTRATE BONDING DEVICE, AND SUBSTRATE BONDING SYSTEM

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 399 days.

(21) Appl. No.: 18/546,590

(22) PCT Filed: Feb. 24, 2022

(86) PCT No.: PCT/JP2022/007464
§ 371 (c)(1),
(2) Date: Aug. 15, 2023

(87) PCT Pub. No.: WO2022/181655
PCT Pub. Date: Sep. 1, 2022

(65) Prior Publication Data
US 2024/0304594 A1 Sep. 12, 2024

(30) Foreign Application Priority Data
Feb. 26, 2021 (JP) ................................. 2021-029519

(51) Int. Cl.
*H10P 72/70* (2026.01)
*H10P 10/00* (2026.01)

(52) U.S. Cl.
CPC ........ *H10P 72/7432* (2026.01); *H10P 10/128* (2026.01); *H10P 72/7412* (2026.01); *H10P 10/12* (2026.01)

(58) Field of Classification Search
CPC .............. H01L 21/6833; H01L 21/681; H01L 21/68714; H01L 21/97092;
(Continued)

(56) References Cited

U.S. PATENT DOCUMENTS 9,028,628 B2 * 5/2015 Lin ..................... H01L 21/2007
156/64
9,355,882 B2 * 5/2016 Wu ......................... H10P 72/78
(Continued)

FOREIGN PATENT DOCUMENTS

JP 2011-222632 A 11/2011
JP 2013-149725 A 8/2013
(Continued)

OTHER PUBLICATIONS

Office Action from JP patent application No. 2022-562958, JPO, Japan, Jan. 4, 2023, 5 pages.

*Primary Examiner* — David A Zarneke
(74) *Attorney, Agent, or Firm* — ASLAN LAW, P.C.

(57) ABSTRACT
A bonding method includes a substrate holding step of holding substrates (W1, W2), a first contact step of bringing central portions of the substrates (W1, W2) into contact with each other, a second contact step of, enlarging a contact area between the substrates (W1, W2) from central portions toward peripheral portions of the substrates (W1, W2), and a bonding step of, bonding the substrates (W1, W2) to each other by pressing only a peripheral portion of the substrate (W1) against a peripheral portion of the substrate (W2) while the substrates (W1, W2) are in contact with each other over entire bonding surfaces.

23 Claims, 42 Drawing Sheets

(58) Field of Classification Search
CPC ..... H01L 21/68742; H01L 2224/80001; H01L
2224/80121; H01L 2224/80009; H01L
2224/801; H01L 2224/80894; H10P
10/12; H10P 10/128; H10P 10/126; H10P
10/1285; H10P 72/0438; H10P 72/7412;
H10P 72/7432
See application file for complete search history.

(56) References Cited

U.S. PATENT DOCUMENTS

| | | | | |
|---|---|---|---|---|
| 9,613,840 | B2 * | 4/2017 | Wagenleitner | ........ H01L 21/673 |
| 10,109,487 | B2 * | 10/2018 | Kurz | ..................... H10P 10/128 |
| 10,438,918 | B2 * | 10/2019 | Omori | ..................... H01L 21/64 |
| 10,580,752 | B2 * | 3/2020 | Yamauchi | ............... H01L 24/75 |
| 11,004,686 | B2 * | 5/2021 | Mitsuishi | .............. H01L 21/682 |
| 12,094,747 | B2 * | 9/2024 | Yamauchi | ........... H01L 21/6875 |
| 12,136,563 | B2 * | 11/2024 | Lee | ....................... H01L 21/681 |
| 12,249,592 | B2 * | 3/2025 | Chen | ................... H10P 72/0428 |

| | | | | |
|---|---|---|---|---|
| 2013/0183810 | A1 | 7/2013 | Hongo et al. | |
| 2014/0208556 | A1 * | 7/2014 | Sugihara | ............... H01L 21/681 |
| | | | | 29/281.1 |
| 2014/0209230 | A1 | 7/2014 | Wagenleitner | |
| 2018/0076037 | A1 | 3/2018 | Kurz | |
| 2018/0308770 | A1 | 10/2018 | Sugaya et al. | |
| 2020/0075360 | A1 * | 3/2020 | Kim | .................... H01L 21/2007 |
| 2021/0320024 | A1 | 10/2021 | Yamauchi | |
| 2022/0230895 | A1 | 7/2022 | Gregory | |

FOREIGN PATENT DOCUMENTS

| | | | | |
|---|---|---|---|---|
| JP | 2014-529885 A | 11/2014 | | |
| JP | 2019-511830 A | 4/2019 | | |
| KR | 102942297 B1 * | 3/2026 | ......... | H10W 46/503 |
| WO | WO 2013/023708 A1 | 2/2013 | | |
| WO | WO 2017/115684 A1 | 7/2017 | | |
| WO | WO-2017140348 A1 * | 8/2017 | ......... | H10P 90/1914 |
| WO | WO 2020/017314 A1 | 1/2020 | | |
| WO | WO 2020/228940 A1 | 11/2020 | | |

* cited by examiner

BONDING METHOD, SUBSTRATE BONDING DEVICE, AND SUBSTRATE BONDING SYSTEM

CROSS-REFERENCE TO RELATED APPLICATIONS

This application claims priority to JP Patent Application No. 2021-029519 filed on Feb. 26, 2021, and this application claims priority to and is a 371 of international PCT Application No. PCT/JP2022/007464 filed on Feb. 24, 2022, the entire contents of which are hereby incorporated by reference.

TECHNICAL FIELD

The present disclosure relates to a bonding method, a substrate bonding device, and a substrate bonding system.

BACKGROUND ART

Devices that are devices for bonding two substrates to each other and include a mounting device on which substrates are mounted at the time of bonding have been proposed (see, for example, Patent Literature 1). A mounting device described in Patent Literature 1 includes an annular portion that holds a peripheral portion of a substrate, using a vacuum chuck and is located on the outer side and deforming means for deforming the substrate in such a manner as to cause a central portion of the substrate to protrude out of the mounting device. The device brings two substrates into a state in which central portions of bonding surfaces of the substrates are in contact with each other and subsequently releases sucking and holding of a peripheral portion of one of the substrates by the vacuum chuck. Through this processing, due to restoring force and gravitational force acting on the peripheral portion of one of the substrates, a contact area spreads toward the radially outer side with the center of the one of the substrates as a starting point and reaches the circumferential surface of the one of the substrates. In this way, two substrates are bonded to each other.

CITATION LIST

Patent Literature

Patent Literature 1: International Publication No. WO 2013/023708

SUMMARY OF INVENTION

Technical Problem

However, in the case of the device described in Patent Literature 1, when the magnitudes of restoring force and gravitational force acting on the peripheral portion of one of the substrates are insufficient, the substrates are sometimes brought into a state in which the peripheral portion of one of the substrates is lifted from the peripheral portion of the other of the substrates, and, in this case, there is a risk that a void occurs between the peripheral portions of the two substrates bonded to each other and there is also a risk that bonding strength decreases.

The present disclosure has been made in consideration of the above-described conditions, and an objective of the present disclosure is to provide a bonding method, a substrate bonding device, and a substrate bonding system that are capable of preventing a void from occurring between the peripheral portions of substrates bonded to each other and improving bonding strength between the substrates.

Solution to Problem

In order to achieve the above-described objective, a bonding method according to the present disclosure is
a bonding method for bonding a first substrate and a second substrate to each other and includes:
a substrate holding step of holding the first substrate and the second substrate while only a peripheral portion is held with respect to at least one of the first substrate and the second substrate and a bonding surface of the first substrate and a bonding surface of the second substrate face each other;
a first contact step of bringing a central portion of the first substrate and a central portion of the second substrate into contact with each other while bending the first substrate in such a manner that a central portion of the first substrate protrudes toward the second substrate with respect to a peripheral portion of the first substrate;
a second contact step of, after the first contact step, enlarging a contact area between the first substrate and the second substrate from central portions toward peripheral portions of the first substrate and the second substrate; and
a bonding step of, after the second contact step, bonding the first substrate and the second substrate to each other by pressing only a peripheral portion of the first substrate against a peripheral portion of the second substrate while the first substrate and the second substrate are in contact with each other over entire bonding surfaces.
A substrate bonding device according to another aspect of the present disclosure is
a substrate bonding device for bonding a first substrate and a second substrate to each other and includes:
a first substrate holder to hold a peripheral portion of the first substrate and having a recessed portion formed in a second area on an inner side of a first area that faces a peripheral portion of the first substrate while the first substrate holder holds the first substrate;
a second substrate holder to hold the second substrate while a bonding surface of the second substrate is caused to face a bonding surface of the first substrate;
a holder driver to drive at least one of the first substrate holder and the second substrate holder in a direction in which the first substrate holder and the second substrate holder come close to or separate from each other; and
a controller to control the holder driver to enlarge a contact area between the first substrate and the second substrate from central portions toward peripheral portions of the first substrate and the second substrate from a state in which the first substrate is held by the first substrate holder while the first substrate is bent in such a manner that a central portion of the first substrate protrudes toward the second substrate with respect to a peripheral portion of the first substrate and a central portion of the first substrate and a central portion of the second substrate are in contact with each other and press only a peripheral portion of the first substrate against a peripheral portion of the second substrate by pressing the first substrate holder against the second substrate holder while the first substrate and the second substrate are brought into contact with each other over the entire bonding surfaces.

Advantageous Effects of Invention

According to the present disclosure, after a central portion of the first substrate and a central portion of the second substrate are brought into contact with each other while the first substrate is bent in such a manner that a central portion of the first substrate protrudes toward the second substrate with respect to a peripheral portion of the first substrate, a contact area between the first substrate and the second substrate is enlarged from central portions toward peripheral portions of the first substrate and the second substrate. The first substrate and the second substrate are bonded to each other by relatively pressing only a peripheral portion of the first substrate against a peripheral portion of the second substrate while the first substrate and the second substrate are in contact with each other over the entire bonding surfaces. Through this processing, even when enlarging a contact area between the first substrate and the second substrate from the central portions toward the peripheral portions causes the first substrate and the second substrate to be brought into a state in which the peripheral portion of the second substrate is lifted from the peripheral portion of the first substrate, relatively pressing only the peripheral portion of the first substrate against the peripheral portion of the second substrate enables the peripheral portion of the first substrate and the peripheral portion of the second substrate to be brought into contact with each other without a gap. Therefore, it is possible to prevent a void from occurring between the peripheral portion of the first substrate and the peripheral portion of the second substrate while the first substrate and the second substrate are bonded to each other.

BRIEF DESCRIPTION OF DRAWINGS

FIG. 9 is a flowchart illustrating a flow of a substrate bonding step that the substrate bonding device according to Embodiment 1 performs;

FIG. 14 is a schematic configuration diagram of a substrate bonding system according to Embodiment 2 of the present disclosure;

DESCRIPTION OF EMBODIMENTS

Embodiment 1

Figure 1:
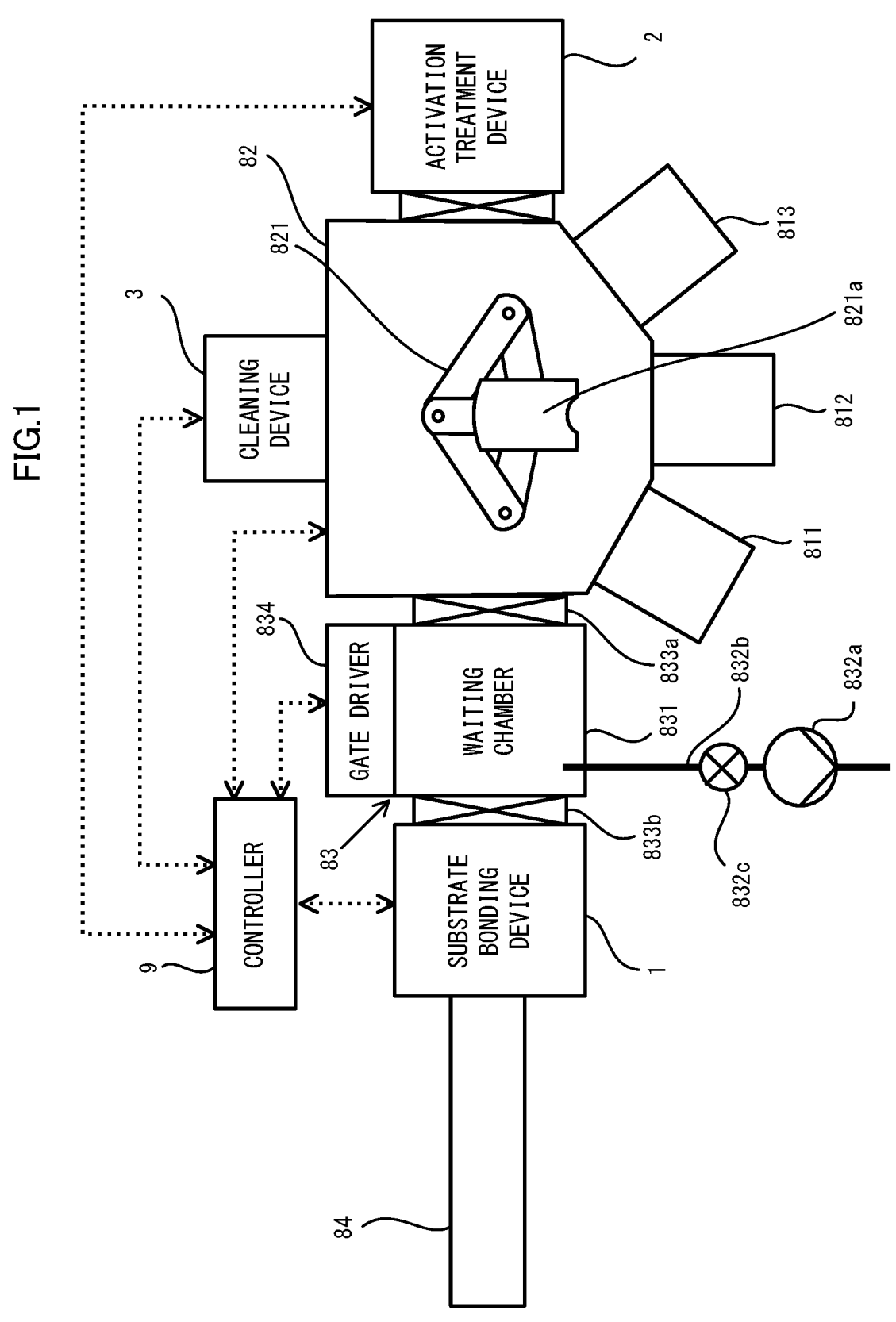
FIG. 1 is a schematic configuration diagram of a substrate bonding system according to Embodiment 1 of the present disclosure.

A substrate bonding system according to an embodiment of the present disclosure is described below, referring to the drawings. The substrate bonding system according to the present embodiment bonds substrates W1 and W2 to each other by so-called hydrophilic bonding. The substrate bonding system performs an activation treatment step of activating bonding surfaces of the substrates W1 and W2 and subsequently performs an aqueous cleaning step of cleaning the bonding surfaces of the substrates W1 and W2 with water. On this occasion, OH groups are generated on the bonding surfaces of the substrates W1 and W2. Subsequently, the substrate bonding system, by bringing the bonding surfaces of the substrates W1 and W2 on the bonding surfaces of which OH groups are generated into contact with each other, bonds the substrates W1 and W2 to each other.

The substrate bonding system according to the present embodiment includes feeding ports 811 and 812, a take-out port 813, a first transportation device 82, an activation treatment device 2, a cleaning device 3, a substrate bonding device 1, a load lock device 83, a second transportation device 84, and a controller 9, as illustrated in FIG. 1. The controller 9 controls the first transportation device 82, the activation treatment device 2, the cleaning device 3, the substrate bonding device 1, and the load lock device 83. In each of the first transportation device 82 and the cleaning device 3, a high efficiency particulate air (HEPA) filter (not illustrated) is installed. Because of this configuration, the insides of the first transportation device 82 and the cleaning device 3 are maintained in an atmospheric pressure environment in which the number of particles is extremely small.

The first transportation device 82 includes a transportation robot 821 including an arm at the tip portion of which a holder 821a to hold a substrate is disposed. The transportation robot 821 is capable of moving along a direction in which the feeding ports 811 and 812 and the take-out port 813 are arranged and also capable of changing the direction of the tip portion of the arm by turning. The holder 821a includes a vacuum chuck, an electrostatic chuck, or the like and sucks and holds the opposite side to the bonding surface side of a substrate.

Figure 2:
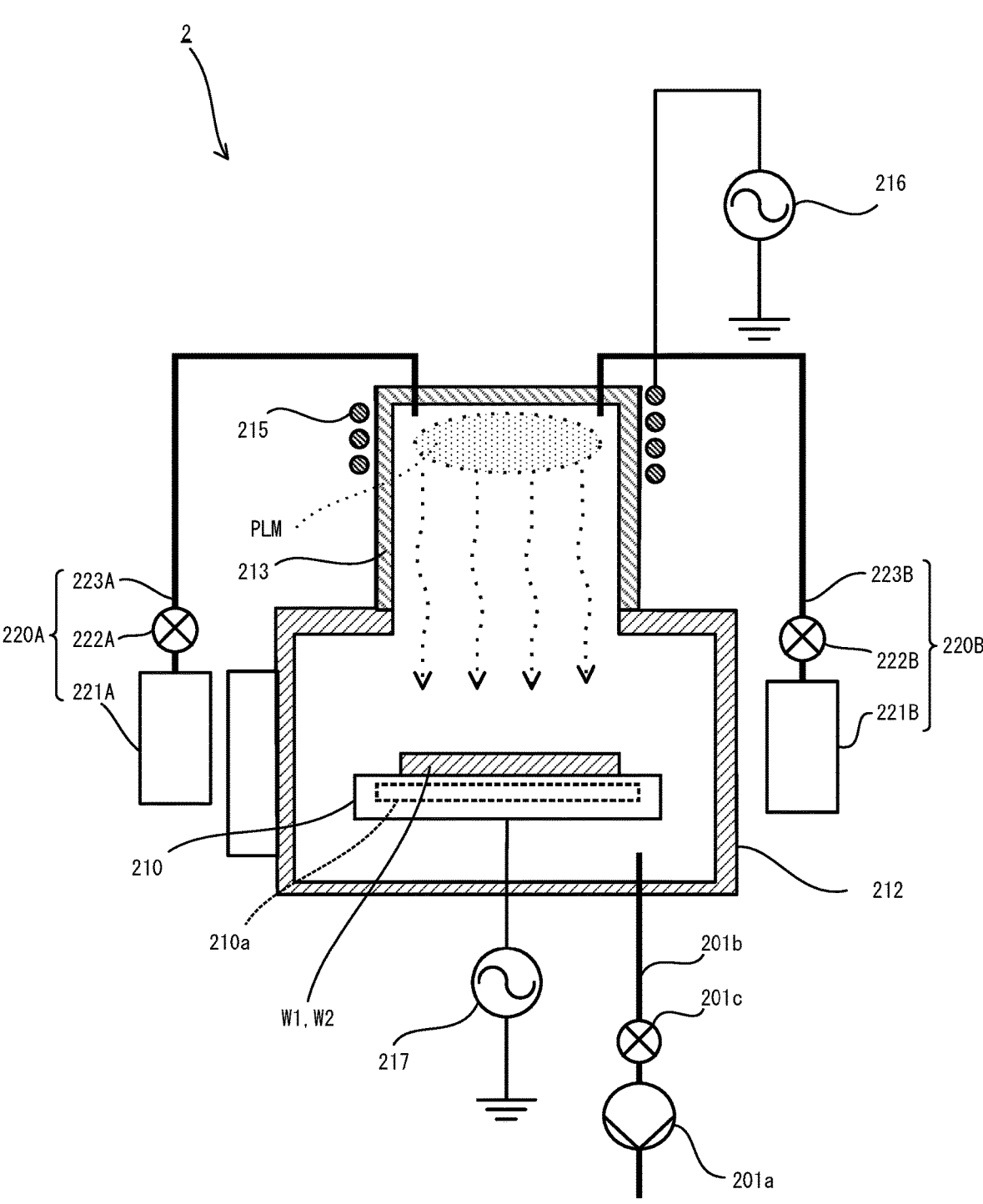
FIG. 2 is a schematic configuration diagram of an activation treatment device according to Embodiment 1.

The activation treatment device 2, by subjecting the bonding surfaces of the substrates W1 and W2 to at least one of reactive ion etching using nitrogen gas and irradiation of nitrogen radicals, performs activation treatment to activate the bonding surfaces. The activation treatment device 2 is a device that generates inductively coupled plasma (ICP) and, as illustrated in FIG. 2, includes a stage 210, a chamber 212, a plasma chamber 213, an induction coil 215 wound on the outer side of the plasma chamber 213, and a high-frequency power source 216 to supply high-frequency current to the induction coil 215. Note that, as the activation treatment device 2, an activation treatment device that uses a system in which, for example, plasma is generated in an upper portion of a chamber and only radicals contained in the plasma are allowed to flow down through holes formed in an ion trap plate may be used. In addition, a plasma generation source may be a plasma generation source of parallel flat plate type or a plasma generation source that makes use of a microwave. The plasma chamber 213 is formed of, for example, quartz glass. The activation treatment device 2002 also includes a nitrogen gas feeder 220A and an oxygen gas feeder 220B. The nitrogen gas feeder 220A includes a nitrogen gas storage 221A, a feeding valve 222A, and a feeding pipe 223A. The oxygen gas feeder 220B includes an oxygen gas storage 221B, a feeding valve 222B, and a feeding pipe 223B. On the stage 210, the substrate W1 or W2 is placed. In addition, in the stage 210, a substrate heater 210a that heats the substrate W1 or W2 is disposed. The chamber 212 communicates with the inside of the plasma chamber 213. The chamber 212 is connected to a vacuum pump 201a via an exhaust pipe 201b and an exhaust valve 201c. When the exhaust valve 201c is put into the open state and the vacuum pump 201a is caused to operate, gas in the chamber 212 is exhausted to the outside of the chamber 212 through the exhaust pipe 201b and gas pressure in the chamber 212 is reduced (decompressed). Note that the gas pressure in the chamber 212 can be reduced to $10^{-2}$ Pa or less.

As the high-frequency power source 216, a power source that supplies the induction coil 215 with a high-frequency current having a frequency of, for example, 27 MHz can be employed. When high-frequency current is supplied to the induction coil 215 while $N_2$ gas has been fed into the plasma chamber 213, plasma PLM is formed in the plasma chamber 213. Since, on this occasion, ions contained in the plasma are trapped in the plasma chamber 213 by the induction coil 215, the activation treatment device 2 may have a configuration in which there is no trap plate at a portion between the plasma chamber 213 and the chamber 212. A bias applier 217 is a high-frequency power source that applies a high-frequency bias to the substrate W1 or W2 supported by the stage 210. As the bias applier 217, a power source that generates a high-frequency bias having a frequency of, for example, 13.56 MHz can be employed. Applying a high-frequency bias to the substrate W1 or W2 by the bias applier 217 as described above causes a sheath region in which ions with kinetic energy repeatedly collide with the substrate W1 or W2 to be generated in a vicinity of the bonding surface of the substrate W1 or W2. The bonding surface of the substrate W1 or W2 is etched by ions with kinetic energy existing in the sheath region.

The cleaning device 3 cleans a transported substrate while discharging water, cleaning fluid, or $N_2$ gas to the substrate. The cleaning device 3 includes a stage (not illustrated) to support a substrate, a rotation driver (not illustrated) to rotate the stage in a plane orthogonal to the vertical direction, and a cleaning nozzle (not illustrated) to discharge water, cleaning fluid, or $N_2$ gas to which ultrasonic waves or megasonic vibration is applied. The cleaning device 3, by rotating the stage while swinging the cleaning nozzle in a radial direction of the substrate W1 or W2 and spraying water to which ultrasonic waves are applied on the bonding surface of the substrate from the cleaning nozzle, cleans the entire bonding surface of the substrate W1 or W2. The cleaning device 3, by rotating the stage while the discharge of water by the cleaning nozzle is suspended, spin-dries the substrate W1 or W2.

The load lock device 83 includes a waiting chamber 831, an exhaust pipe 832b communicating with the inside of the waiting chamber 831, a vacuum pump 832a to exhaust gas in the waiting chamber 831 through the exhaust pipe 832b, and an exhaust valve 832c interposed in the exhaust pipe 832b. When the exhaust valve 832c is put into the open state and the vacuum pump 832a is caused to operate, gas in the chamber 831 is exhausted to the outside of the chamber 831 through the exhaust pipe 832b and gas pressure in the chamber 831 is reduced (decompressed). Note that the gas pressure in the chamber 831 can be reduced to $10^{-2}$ Pa or less. The load lock device 83 also includes a gate 833a arranged on the first transportation device 82 side of the waiting chamber 831, a gate 833b arranged on the bonding device 1 side of the waiting chamber 831, and a gate driver 834 to individually drive opening and closing of the gates 833a and 833b.

Figure 3:
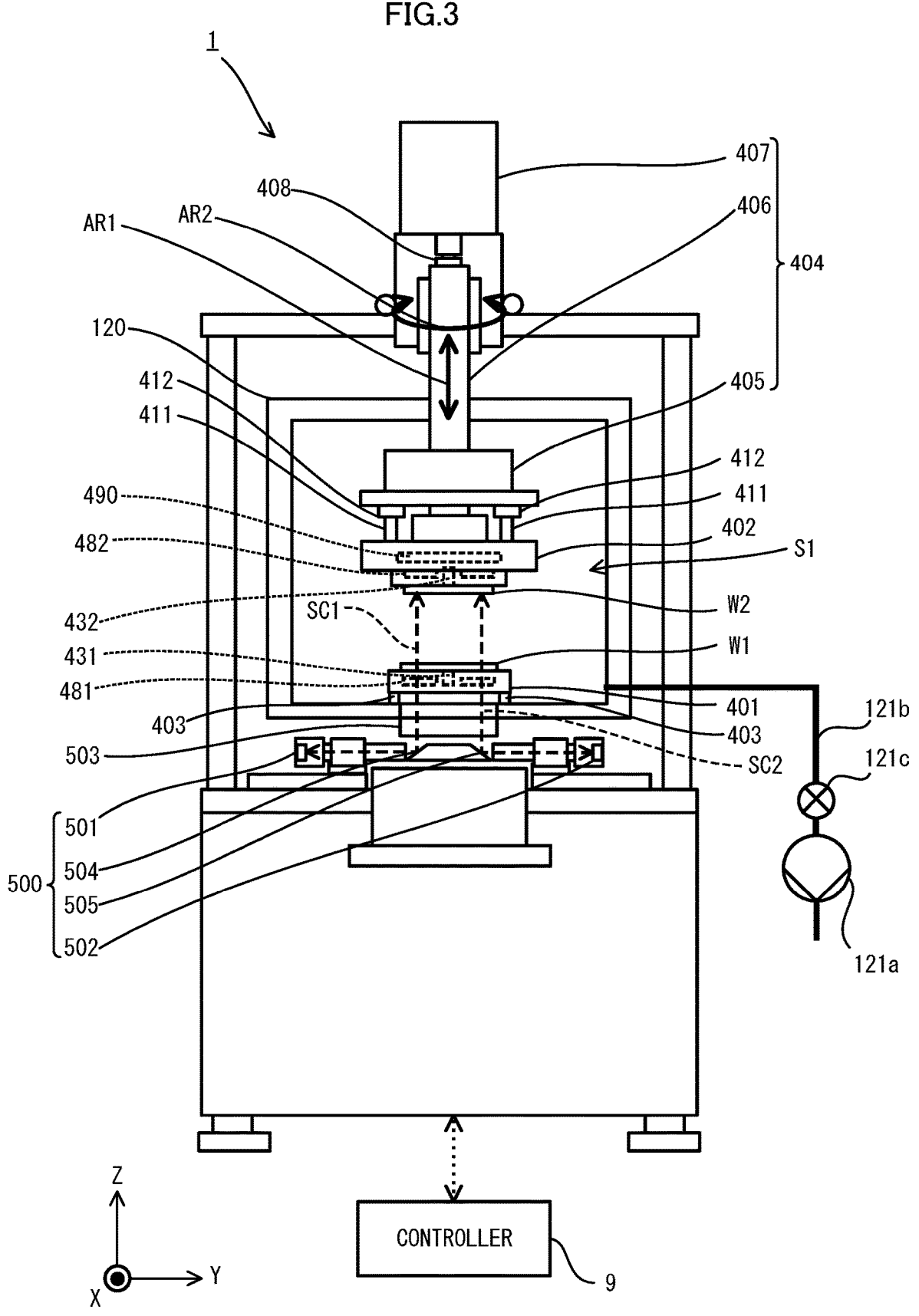
FIG. 3 is a schematic front view of a substrate bonding device according to Embodiment 1.

The substrate bonding device 1 includes a chamber 120, a stage 401 serving as a first support base, a head 402 serving as a second support base, a stage driver 403, a head driver 404, substrate heaters 481 and 482, and a position measurer 500, as illustrated in FIG. 3. The substrate bonding device 1 also includes a distance measurer 490 that measures a distance between the stage 401 and the head 402. Note that the following description is made appropriately assuming that the ±Z-directions and an XY-direction in FIG. 3 are the vertical direction and a horizontal direction, respectively.

The chamber 120 maintains a space S1 in which the substrates W1 and W2 are arranged at a degree of vacuum greater than or equal to a preset reference degree of vacuum. The chamber 120 is connected to a vacuum pump 121a via an exhaust pipe 121b and an exhaust valve 121c. When the exhaust valve 121c is put into the open state and the vacuum pump 121a is caused to operate, gas in the chamber 120 is exhausted to the outside of the chamber 120 through the exhaust pipe 121b and the inside of the chamber 120 is maintained in a reduced pressure atmosphere. In addition, by varying an opening/closing amount of the exhaust valve 121c and thereby adjusting an exhaust amount, gas pressure (a degree of vacuum) in the chamber 120 can be adjusted. On a portion of the chamber 120, a window 503 that is used by the position measurer 500 to measure relative positions between the substrates W1 and W2 is disposed. Note that the gas pressure in the chamber 120 can be set to a pressure within a range of 1 Pa or more and 1000 Pa or less.

The stage driver 403 is a holder driver that is capable of moving the stage 401 in an XY-direction and rotating the stage 401 about the Z-axis.

The head driver 404 includes an ascent/descent driver 406 that causes the head 402 to ascend vertically upward or descend vertically downward (see an arrow AR1 in FIG. 3), an XY-direction driver 405 that moves the head 402 in an XY-direction, and a rotation driver 407 that rotates the head 402 in the rotational direction about the Z-axis (see an arrow AR2 in FIG. 3). The XY-direction driver 405 and the rotation driver 407 constitute the holder driver that moves the head 402 in a direction orthogonal to the vertical direction (an XY-direction or a rotational direction about the Z-axis). The head driver 404 also includes piezo-actuators 411 for adjusting inclination of the head 402 with respect to the stage 401 and first pressure sensors 412 for measuring pressure applied to the head 402. The XY-direction driver 405 and the rotation driver 407 relatively moving the head 402 with respect to the stage 401 in the X-direction, the Y-direction, and the rotational direction about the Z-axis enables alignment between the substrate W1 held by the stage 401 and the substrate W2 held by the head 402.

The ascent/descent driver 406 brings the stage 401 and the head 402 close to each other or moves the head 402 away from the stage 401 by moving the head 402 in the vertical direction. The ascent/descent driver 406 moving the head 402 vertically downward causes the substrate W1 held by the stage 401 and the substrate W2 held by the head 402 to come into contact with each other. When the ascent/descent driver 406 applies driving force to the head 402 in a direction in which the head 402 comes close to the stage 401 while the substrates W1 and W2 are in contact with each other, the substrate W2 is pressed against the substrate W1. In addition, to the ascent/descent driver 406, a second pressure sensor 408 that measures driving force that the ascent/descent driver 406 applies to the head 402 in the direction in which the head 402 comes close to the stage 401 is disposed. From a measured value by the second pressure sensor 408, pressure applied to the bonding surfaces of the substrates W1 and W2 when the substrate W2 is pressed against the substrate W1 by the ascent/descent driver 406 can be detected. The second pressure sensor 408 includes, for example, a load cell.

Figure 4A:
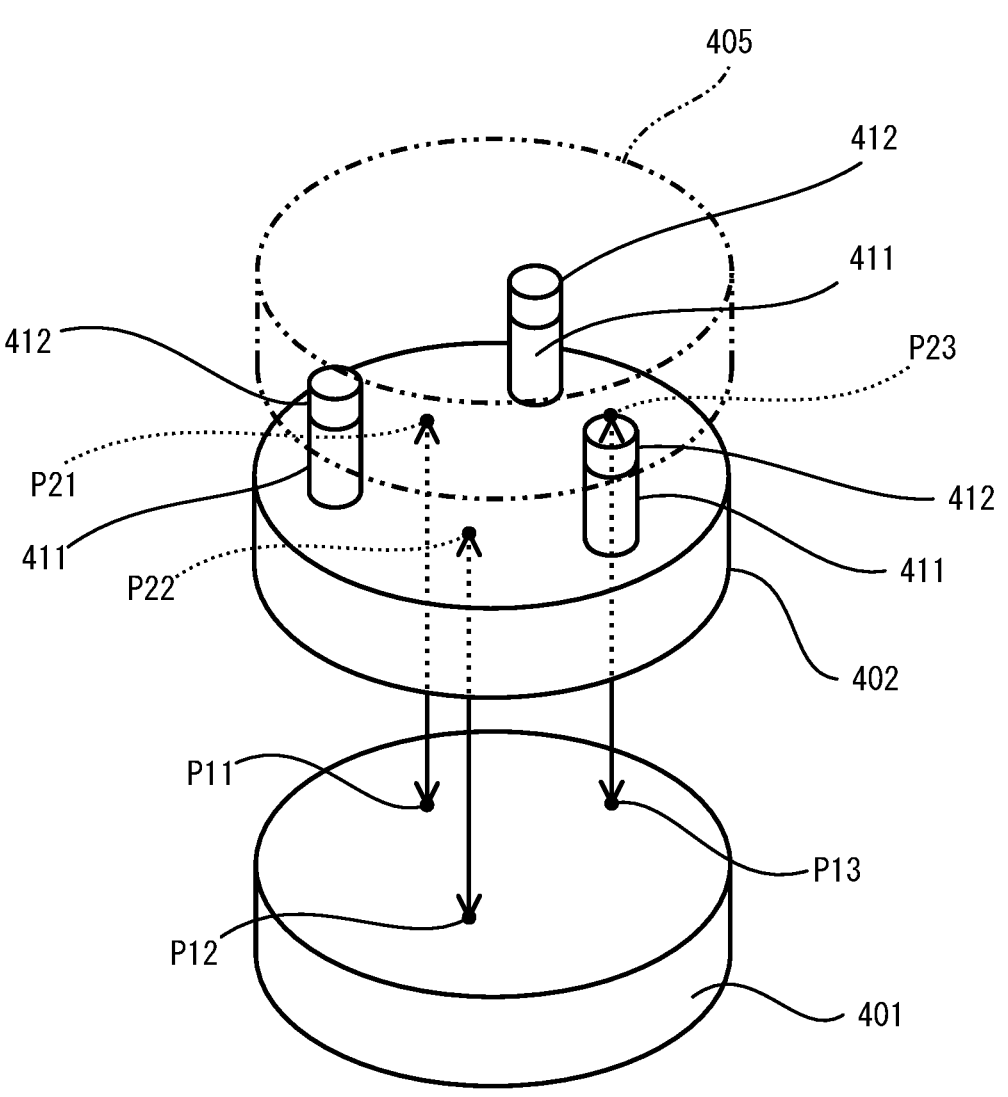
FIG. 4A is a schematic perspective view illustrating a vicinity of a stage and a head according to embodiments.
Figure 4B:
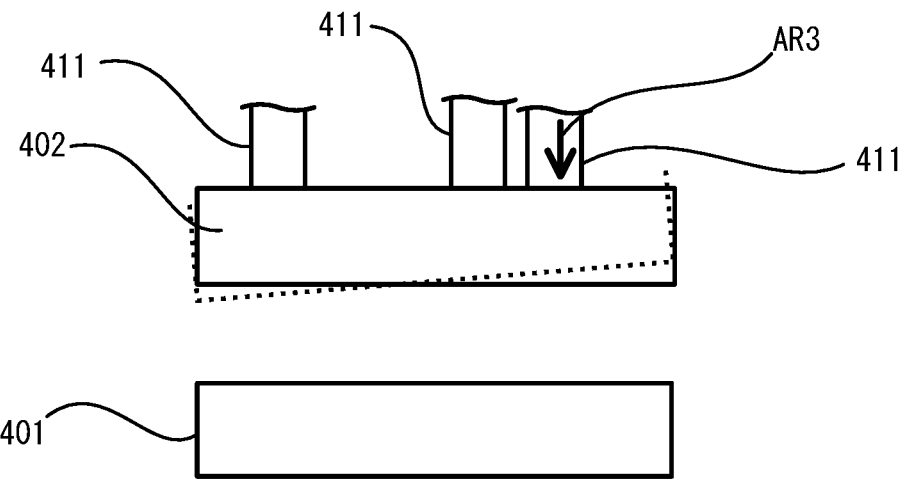
FIG. 4B is a diagram describing a method for finely adjusting the head according to the embodiments.

The piezo-actuators 411 and the first pressure sensors 412 are each provided in the number of three, as illustrated in FIG. 4A. The three piezo-actuators 411 and the three first pressure sensors 412 are arranged between the head 402 and the XY-direction driver 405. The three piezo-actuators 411 are fixed at three positions that are not aligned in an identical straight line on the upper surface of the head 402, that is, three positions that are arranged at substantially equal intervals along the circumferential direction of the head 402 in a peripheral portion of the upper surface of the head 402 that has a substantially circular shape in plan view. Each of the three first pressure sensors 412 connects the top end of one of the piezo-actuators 411 to the under surface of the XY-direction driver 405. The three piezo-actuators 411 are individually extensible and retractable in the vertical direction. The three piezo-actuators 411 extending and retracting causes inclinations about the X-axis and the Y-axis of the head 402 and a position in the vertical direction of the head 402 to be finely adjusted. For example, when the head 402 is inclined with respect to the stage 401 as illustrated by a dashed line in FIG. 4B, extending one of the three piezo-actuators 411 (see an arrow AR3 in FIG. 4B) and thereby finely adjusting attitude of the head 402 enable the under surface of the head 402 and the upper surface of the stage 401 to be made substantially parallel with each other. The three first pressure sensors 412 measure pressing force at three positions on the under surface of the head 402. Driving each of the three piezo-actuators 411 in such a way that pressing forces measured by the three first pressure sensors 412 become equal to one another, while enabling the under surface of the head 402 and the upper surface of the stage 401 to be kept substantially parallel with each other, enables the substrates W1 and W2 to be brought into contact with each other.

Figure 5A:
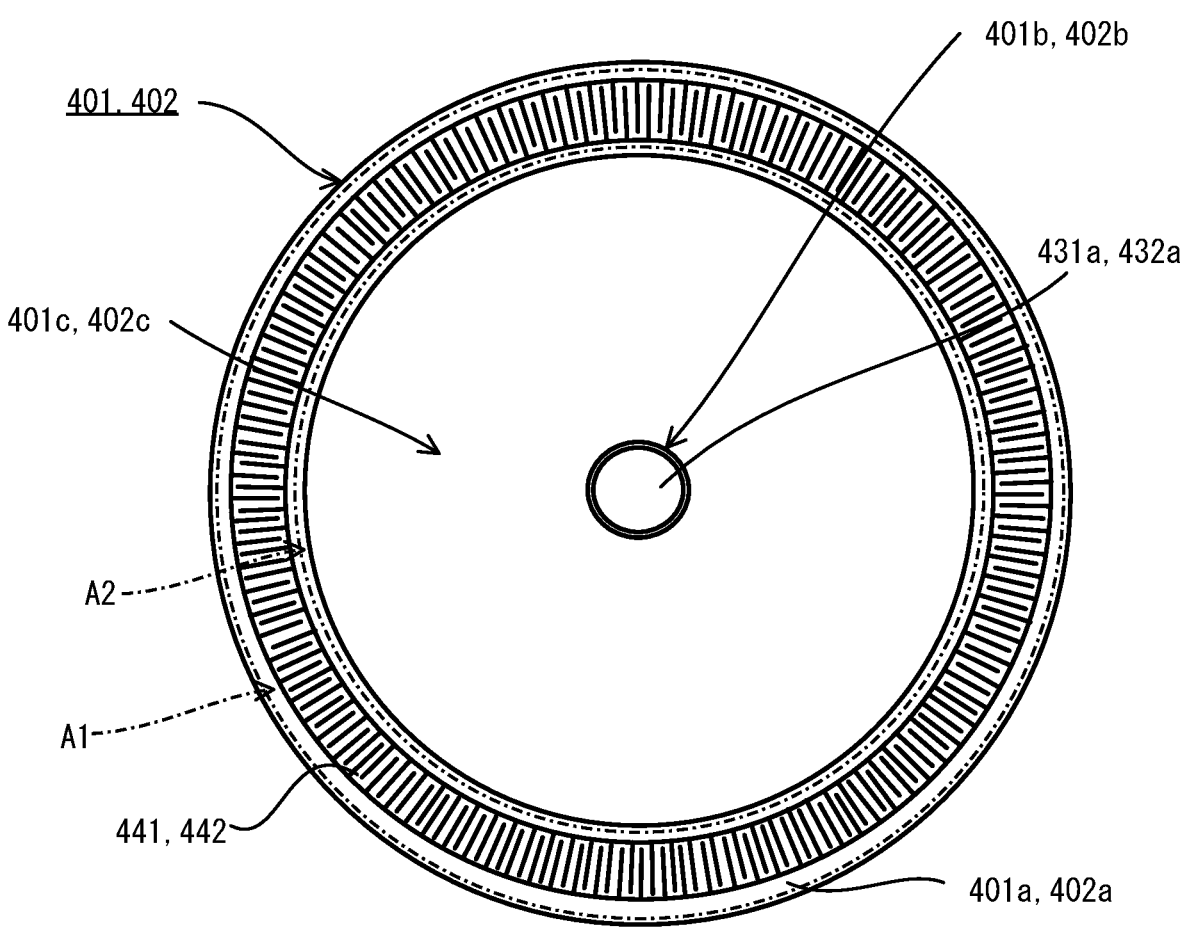
FIG. 5A is a schematic plan view of the stage and the head according to the embodiments.
Figure 5B:
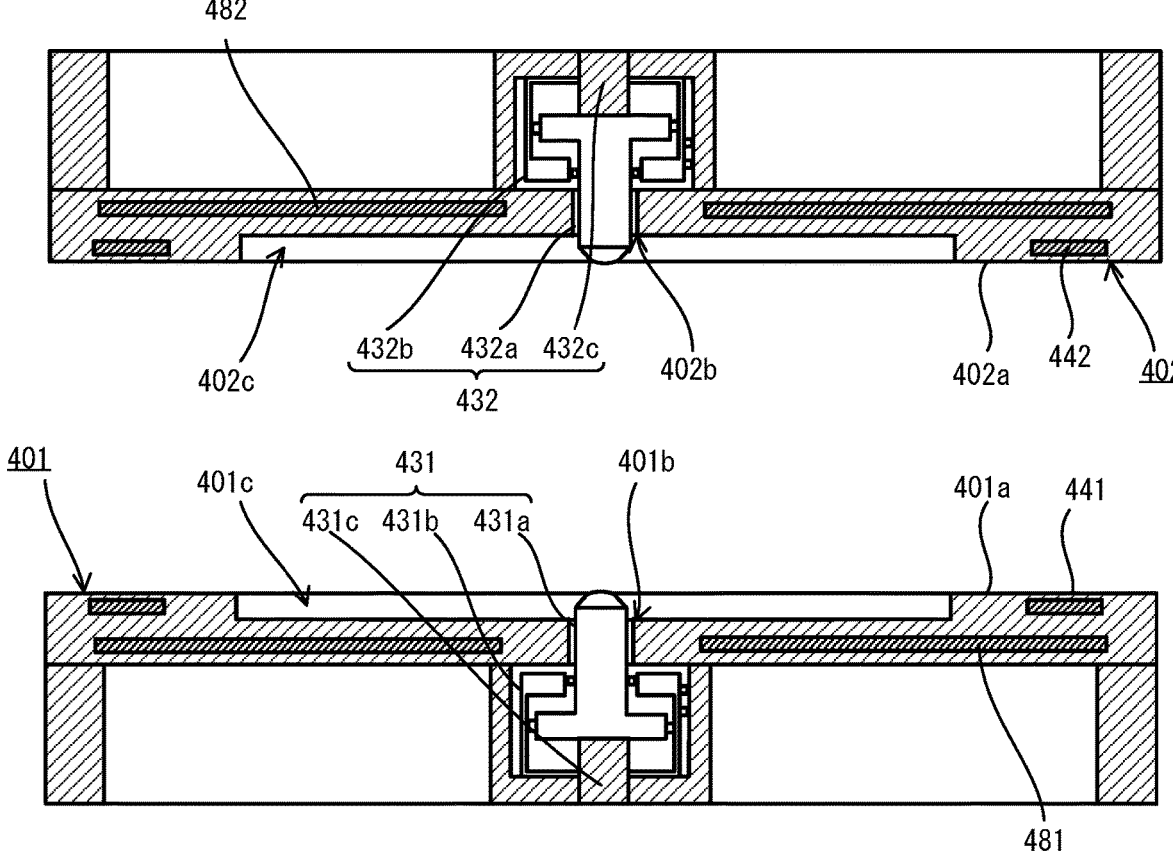
FIG. 5B is a schematic cross-sectional view of the stage and the head according to the embodiments.

The stage 401 and the head 402 are arranged in such a way that the stage 401 and the head 402 face each other in the vertical direction and the stage 401 is located vertically directly below the head 402 in the chamber 120. The stage 401 is a first substrate holder that supports the substrate W1 on an upper surface 401a of the stage 401, and the head 402 is a second substrate holder that supports the substrate W2 on an under surface 402a of the head 402. The stage 401 supports the substrate W1 while the upper surface 401a of the stage 401 is in surface contact with an entire surface of the substrate W1, and the head 402 supports the substrate W2 while the under surface 402a of the head 402 is in surface contact with an entire surface of the substrate W2. The stage 401 and the head 402 are formed of a translucent material, such as glass having translucency. On the stage 401 and the head 402, electrostatic chucks 441 and 442 that hold the substrates W1 and W2 and a first pressing mechanism 431 that presses a central portion of the substrate W1 and a second pressing mechanism 432 that presses a central portion of the substrate W2 are disposed, respectively, as illustrated in FIGS. 5A and 5B. The electrostatic chucks 441 and 442 hold peripheral portions of the substrates W1 and W2, respectively. At the central portions of the stage 401 and the head 402, through-holes 401b and 402b that have a circular shape in plan view are disposed, respectively.

The electrostatic chucks 441 and 442 are disposed in first areas A1 on the stage 401 and the head 402, the first area A1 facing the peripheral portions of the substrates W1 and W2 while the substrates W1 and W2 are supported by the stage 401 and the head 402, respectively. Each of the electrostatic chucks 441 and 442 is formed in an annular shape and has terminal electrodes that are arranged along the circumferential direction on the outer side of a second area A2 located on the inner side of the first area A1 on the stage 401 or the head 402 and a plurality of electrode elements that is formed in a linear shape and the base end portions of which are electrically connected to the terminal electrodes. The terminal electrodes and the pluralities of electrode elements are formed of a transparent conductive film containing a transparent conductive material, such as ITO. The electrostatic chucks 441 and 442 suck and hold the substrates W1 and W2 while voltage is applied to the electrostatic chucks 441 and 442 by chuck drivers (not illustrated), respectively.

In addition, the stage 401 and the head 402 have recessed portions 401c and 402c formed in the second areas A2, respectively. The depth of the recessed portions 401c and 402c is set to a depth large enough to prevent bottoms of the recessed portions 401c and 402c from coming into contact with the substrates W1 and W2 while the stage 401 and the head 402 hold the substrates W1 and W2 and is set to, for example, 1 μm or more, respectively.

As illustrated in FIG. 5B, the first pressing mechanism 431 is disposed at the central portion of the stage 401, and the second pressing mechanism 432 is disposed at the central portion of the head 402. The first pressing mechanism 431 includes a first pressing rod 431a that is projectable and retractable to and from the head 402 side through the through-hole 401b of the stage 401 and a first pressing driver 431b that drives the first pressing rod 431a. The first pressing mechanism 431 also includes a stopper 431c for restricting the first pressing rod 431a from moving a preset retraction amount or more. The second pressing mechanism 432 includes a second pressing rod 432a that is projectable and retractable to and from the stage 401 side through the through-hole 402b of the head 402 and a second pressing driver 432b that drives the second pressing rod 432a. The second pressing mechanism 432 also includes a stopper 432c for restricting the second pressing rod 432a from moving a preset retraction amount or more. Each of the first pressing driver 431b and the second pressing driver 432b includes, for example, a voice coil motor. On each of the first pressing rod 431a and the second pressing rod 432a, either pressure control to control pressure applied to the substrates W1 and W2 to be kept constant or position control to control a contact position between the substrates W1 and W2 to be kept constant is performed. For example, the first pressing rod 431a being subjected to the position control and the second pressing rod 432a being subjected to the pressure control cause the substrates W1 and W2 to be pressed at a constant position and a constant pressure.

Returning to FIG. 3, the distance measurer 490 is, for example, a laser range finder and measures a distance between the stage 401 and the head 402 without coming into contact with the stage 401 and the head 402. The distance measurer 490 measures a distance between the stage 401 and the head 402 from a difference between reflected light reflected by the upper surface of the stage 401 and reflected light reflected by the under surface of the head 402 when laser light is radiated from above the transparent head 402 toward the stage 401. The distance measurer 490 measures distances between three parts P11, P12, and P13 on the upper surface of the stage 401 and three parts P21, P22, and P23 on the under surface of the head 402 that are opposed to the parts P11, P12, and P13 in the Z-direction, respectively, as illustrated in FIG. 4A.

Returning to FIG. 3, the position measurer 500 measures misalignment amounts between the substrate W1 and the substrate W2 in directions orthogonal to the vertical direction (an XY-direction and a rotational direction about the Z-axis). The position measurer 500 includes a first imager 501, a second imager 502, and mirrors 504 and 505. The first imager 501 and the second imager 502 are arranged on the opposite side of the stage 401 to the side thereof on which the substrate W1 is held. Each of the first imager 501 and the second imager 502 includes an imaging element (not illustrated) and a coaxial illumination system (not illustrated). As light sources of the coaxial illumination systems, light sources that emit light (for example, infrared light) that is transmitted through the substrates W1 and W2, the stage 401, and the window 503 disposed to the chamber 120 are used.

Figure 6A:
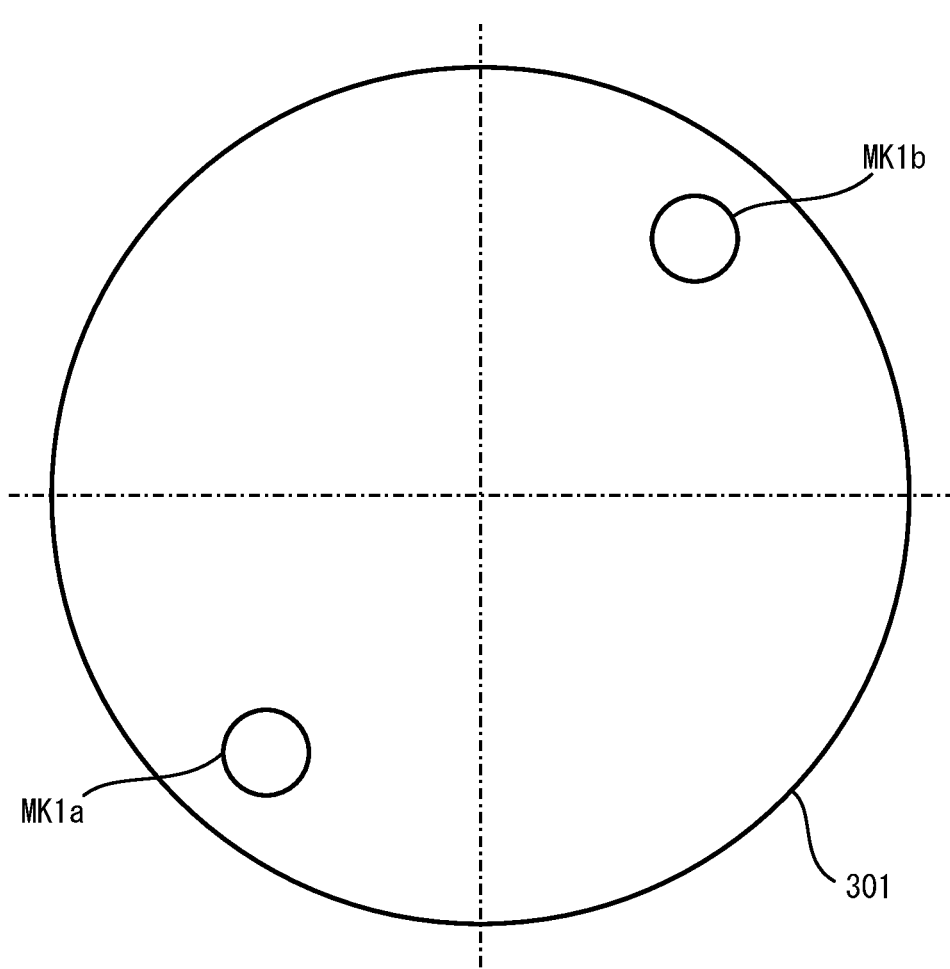
FIG. 6A is a diagram illustrating two alignment marks disposed on one of two substrates to be bonded to each other.
Figure 6B:
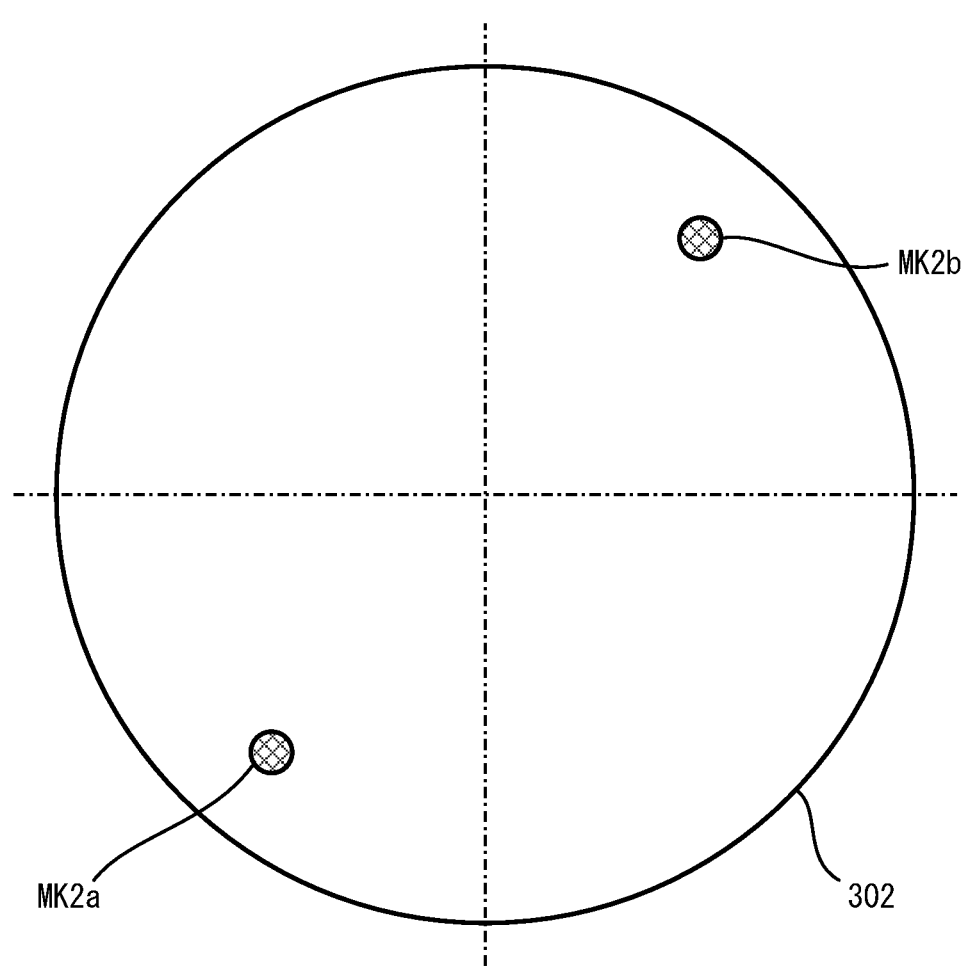
FIG. 6B is a diagram illustrating two alignment marks disposed on the other of the two substrates to be bonded to each other.

For example, as illustrated in FIGS. 6A and 6B, two alignment marks (first alignment marks) MK1a and MK1b are disposed on the substrate W1, and two alignment marks (second alignment marks) MK2a and MK2b are disposed on the substrate W2. The substrate bonding device 1, while recognizing positions of the alignment marks MK1a, MK1b, MK2a, and MK2b, which are disposed on both substrates W1 and W2, by use of the position measurer 500, performs position alignment operation (alignment operation) of both substrates W1 and W2. More specifically, the substrate bonding device 1 first, while recognizing the alignment marks MK1a, MK1b, MK2a, and MK2b, which are disposed on the substrates W1 and W2, by use of the position measurer 500, performs general alignment operation (rough alignment operation) of the substrates W1 and W2 and causes the two substrates W1 and W2 to face each other. Subsequently, the substrate bonding device 1, while simultaneously recognizing the alignment marks MK1a, MK2a, MK1b, and MK2b, which are disposed on the two substrates W1 and W2, by use of the position measurer 500, performs finer alignment operation (fine alignment operation).

Figure 7A:
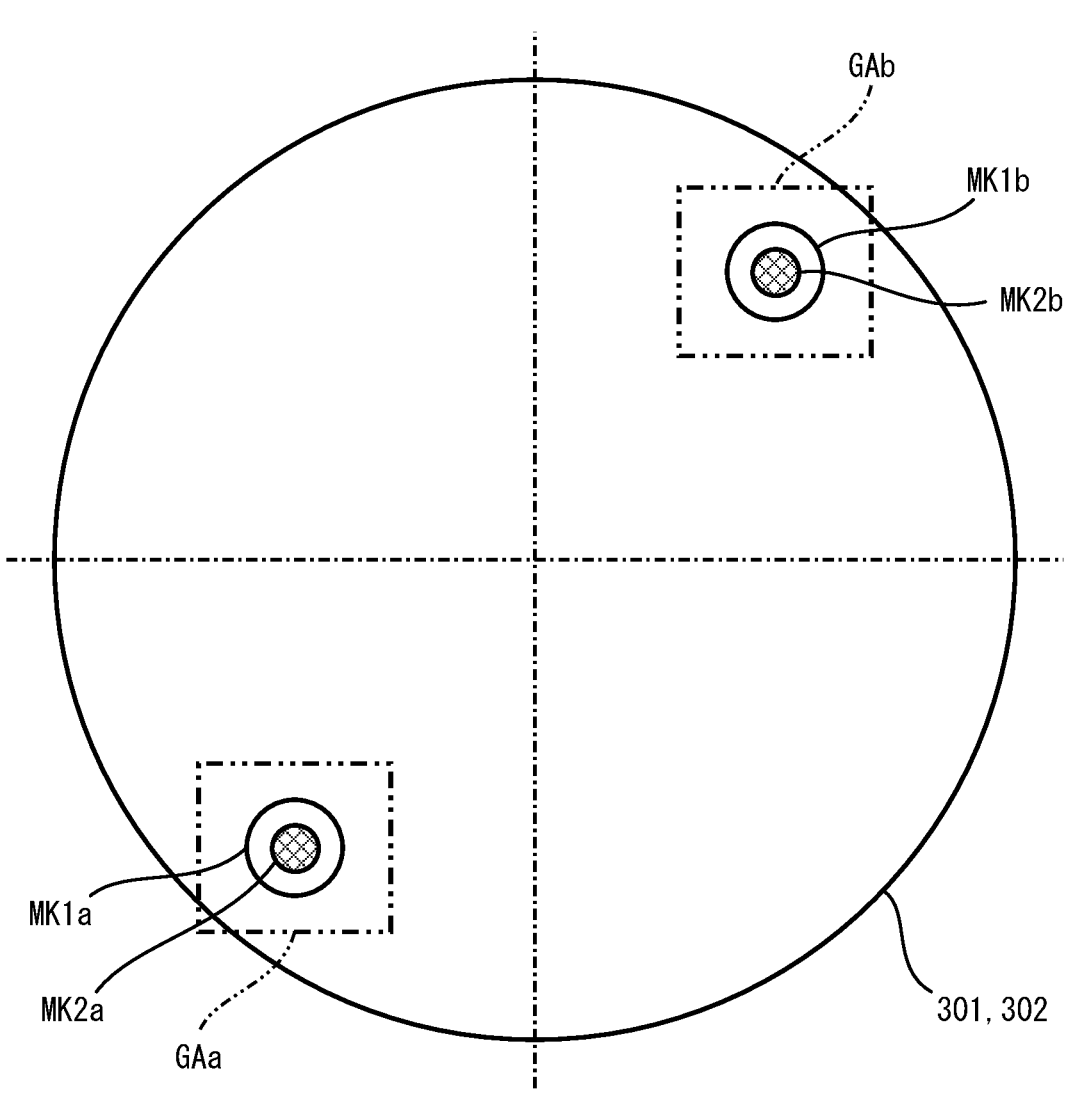
FIG. 7A is a schematic view illustrating a captured image of the alignment marks.
Figure 7B:
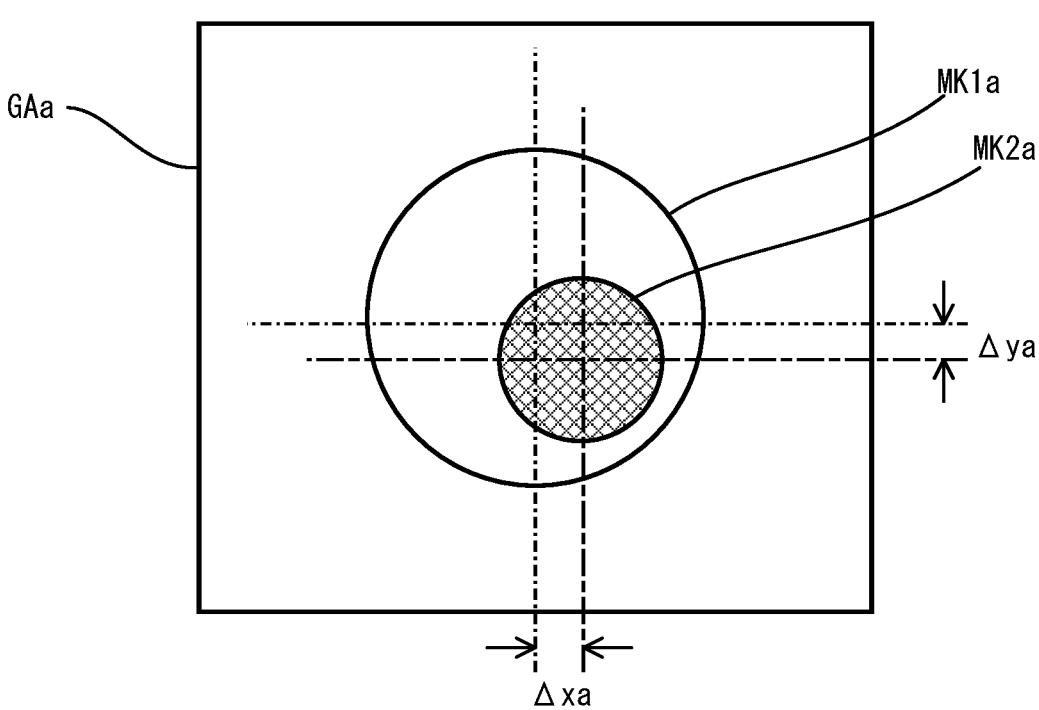
FIG. 7B is a schematic view illustrating a state in which the alignment marks are misaligned from each other.

As illustrated by dashed-line arrows SC1 and SC2 in FIG. 3, light emitted from the light source of the coaxial illumination system of the first imager 501 is reflected by the mirror 504, proceeds upward, and is transmitted through the window 503 and portions or all of the substrates W1 and W2. The light that has been transmitted through portions or all of the substrates W1 and W2 is reflected by the alignment marks MK1a and MK2a on the substrates W1 and W2, proceeds downward, is transmitted through the window 503, is reflected by the mirror 504, and is incident on the imaging element of the first imager 501. In addition, light emitted from the light source of the coaxial illumination system of the second imager 502 is reflected by the mirror 505, proceeds upward, and is transmitted through the window 503 and portions or all of the substrates W1 and W2. The light that has been transmitted through portions or all of the substrates W1 and W2 is reflected by the alignment marks MK1b and MK2b on the substrates W1 and W2, proceeds downward, is transmitted through the window 503, is reflected by the mirror 505, and is incident on the imaging element of the second imager 502. In this way, the position measurer 500 acquires a captured image GAa including the alignment marks MK1a and MK2a on the two substrates W1 and W2 and a captured image GAb including the alignment marks MK1b and MK2b on the two substrates W1 and W2, as illustrated in FIGS. 7A and 7B. Note that image capturing operation of the captured image GAa performed by the first imager 501 and image capturing operation of the captured image GAb performed by the second imager 502 are performed substantially at the same time.

Returning to FIG. 3, the substrate heaters 481 and 482 are, for example, electrothermal heaters and are disposed in the stage 401 and the head 402, respectively, as illustrated in FIG. 5B. The substrate heaters 481 and 482 heat the substrates W1 and W2 by transmitting heat to the substrates W1 and W2 held by the stage 401 and the head 402, respectively. In addition, controlling the amount of heat generation by the substrate heaters 481 and 482 enables temperature of the substrates W1 and W2 and the bonding surfaces thereof to be controlled, respectively. In addition, the substrate heaters 481 and 482 are connected to heater drivers (not illustrated), and the heater drivers supply the substrate heaters 481 and 482 with current and thereby causes the substrate heaters 481 and 482 to generate heat, based on a control signal input from the controller 9 illustrated in FIG. 1.

Returning to FIG. 1, the controller 9 is, for example, a control system including a personal computer and includes a central processing unit (CPU) and a memory. The memory stores programs that the CPU executes. In addition, in the memory, preset misalignment amount threshold values $\Delta xth$, $\Delta yth$, and $\Delta\theta th$ are stored for calculated relative misalignment amounts $\Delta x$, $\Delta y$, and $\Delta\theta$ between the substrates W1 and W2, which are described later. The controller 9 converts measurement signals that are input from the first pressure sensors 412, the second pressure sensor 408, and the distance measurer 490 to measurement information and acquires the measurement information. The controller 9 also converts captured image signals that are input from the first imager 501 and the second imager 502 to captured image information and acquires the captured image information. Further, the controller 9, by outputting a control signal to each of the holder driver, the piezo-actuators 411, the first pressing driver 431b, the second pressing driver 432b, the heater driver, the stage driver 403, and the head driver 404, controls operation of the foregoing components. The controller 9 calculates misalignment amounts $\Delta xa$ and $\Delta ya$ between the pair of alignment marks MK1a and MK2a, which are disposed on the substrates W1 and W2, respectively, based on the captured image GAa acquired from the first imager 501, as illustrated in FIG. 7B. Note that FIG. 7B illustrates a state in which the pair of alignment marks MK1a and MK2a are misaligned from each other. Likewise, the controller 9 calculates misalignment amounts $\Delta xb$ and $\Delta yb$ between the other pair of alignment marks MK1b and MK2b, which are disposed on the substrates W1 and W2, respectively, based on the captured image GAb acquired from the second imager 502. Subsequently, based on the misalignment amounts $\Delta xa$, $\Delta ya$, $\Delta xb$, and $\Delta yb$ of the two pairs of alignment marks and a geometric relationship between the two pairs of marks, the controller 9 calculates the relative misalignment amounts $\Delta x$, $\Delta y$, and $\Delta\theta$ in the X-direction, the Y-direction, and the rotational direction about the Z-axis between the two substrates W1 and W2. The controller 9 causes the head 402 to move in the X-direction and the Y-direction or rotate about the Z-axis in such a way that the calculated misalignment amounts $\Delta x$, $\Delta y$, and $\Delta\theta$ are reduced. This operation causes the relative misalignment amounts $\Delta x$, $\Delta y$, and $\Delta\theta$ between the two substrates W1 and W2 to be reduced. In this way, the substrate bonding device 1 performs the fine alignment operation that corrects the misalignment amounts $\Delta x$, $\Delta y$, and $\Delta\theta$ in horizontal directions between the two substrates W1 and W2.

In addition, the controller 9, by outputting a control signal to each of the activation treatment device 2, the second transportation device 84, and the first transportation device 82, controls operation of the foregoing components.

Figure 8:
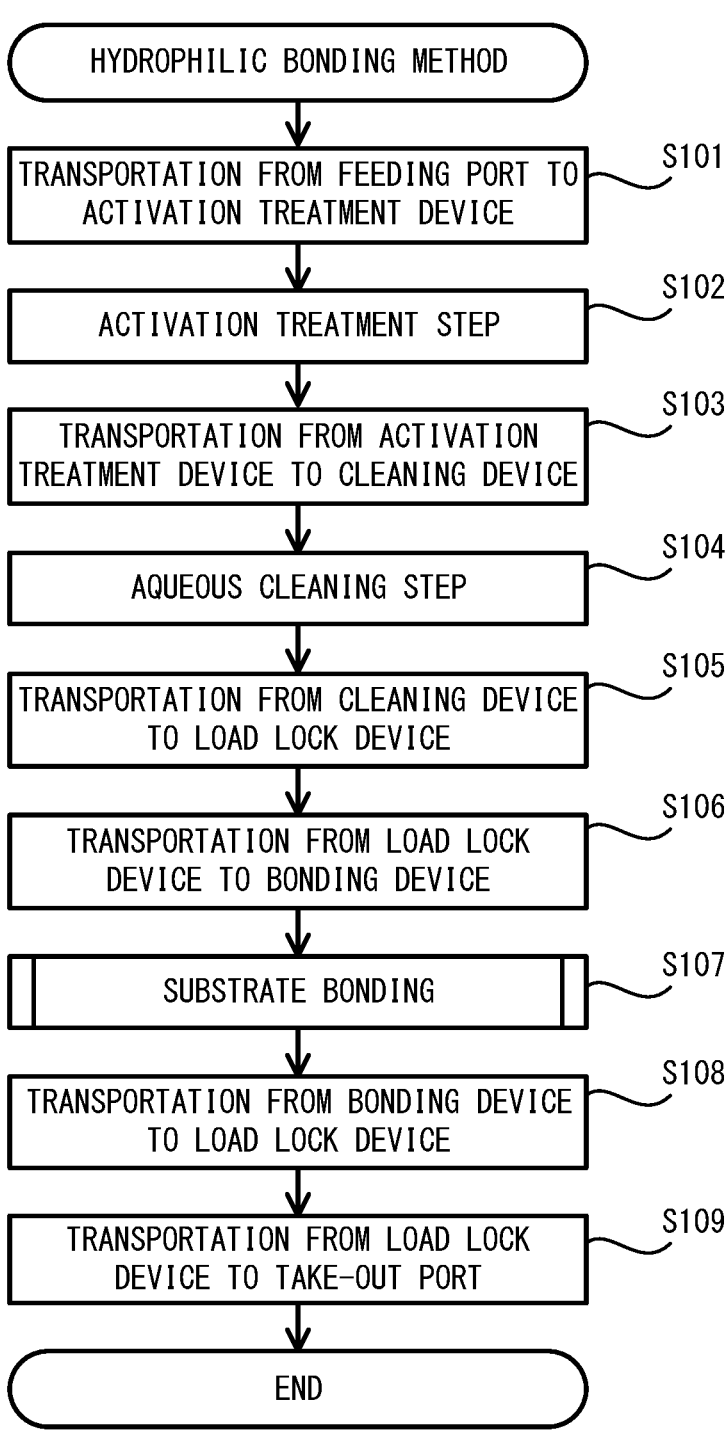
FIG. 8 is a flowchart illustrating a flow of a hydrophilic bonding method according to Embodiment 1.
Figure 9:
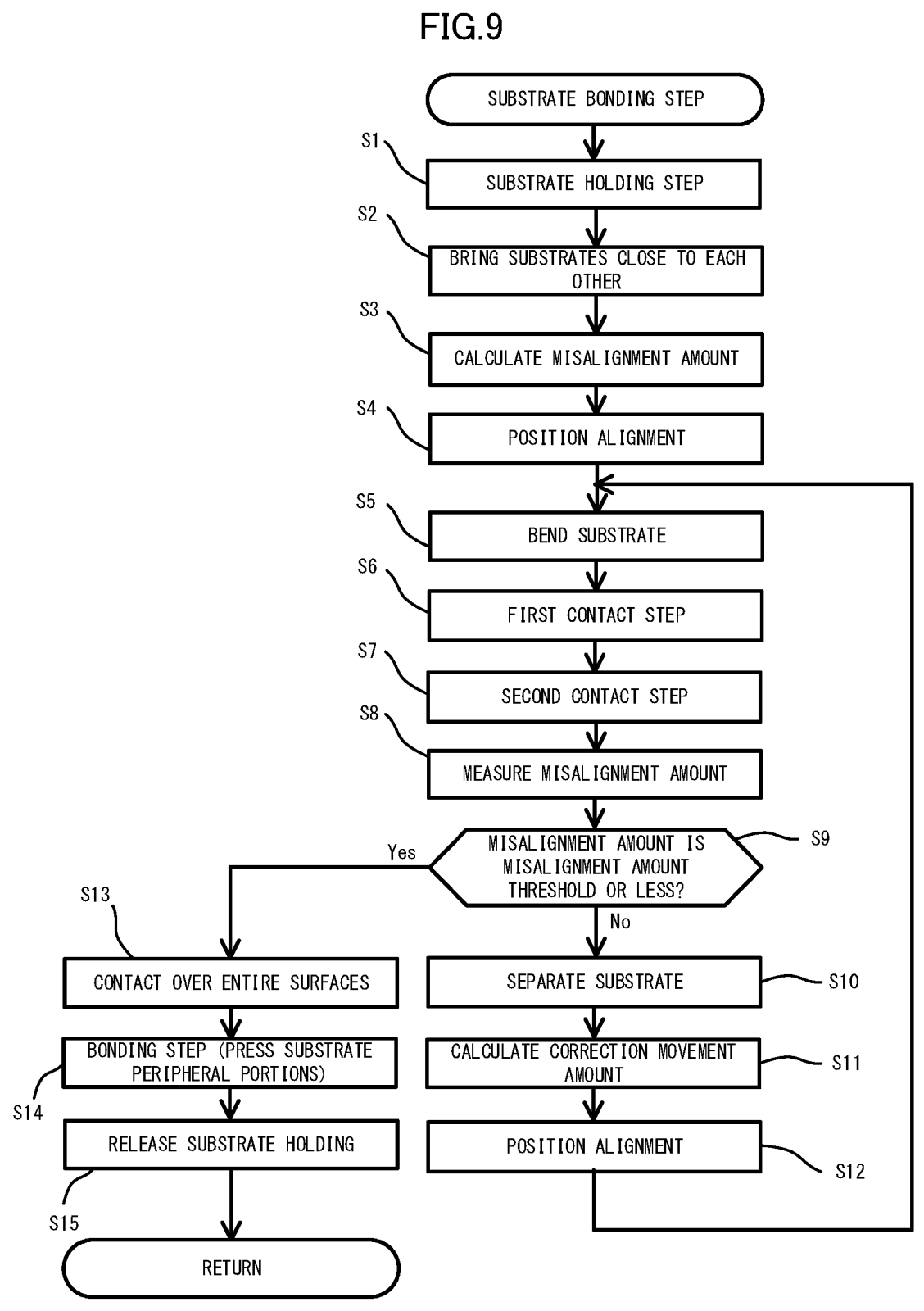

Next, a hydrophilic bonding method that the substrate bonding system according to the present embodiment performs is described, referring to FIGS. 8 and 9. First, the first transportation device 82 takes out the substrates W1 and W2 that are arranged in the feeding port 811 or 812 and transports the substrates W1 and W2 to the activation treatment device 2002 (step S101). In this step, the transportation robot 821 takes the substrates W1 and W2 out of the feeding ports 811 and 812, respectively. When an inlet of the activation treatment device 2 is opened, the transportation robot 821, while holding the substrate W1 or W2, turns in such a way that a tip portion of an arm 821a points to the activation treatment device 2 side. On this occasion, the transportation robot 821 turns while maintaining the substrate W1 or W2 taken out from the feeding port 811 or 812 in an attitude in which the bonding surface side of the substrate W1 or W2 faces vertically upward. Subsequently, the transportation robot 821, by stretching the arm 821a, inserts the tip portion of the arm 821a into the chamber 212. Then, the substrate W1 or W2 is transferred from the tip portion of the arm 821a to the stage 210 in the chamber 212. Next, when the transfer of the substrate W1 or W2 to the stage 210 is finished, the transportation robot 821 contracts the arm 821a.

Next, after pressure in the chamber 212 of the activation treatment device 2 is reduced, the substrate heater 210a heats the substrate W1 or W2 while the substrate W1 or W2 is placed on the stage 210. Succeedingly, an activation treatment step in which the bonding surface of each of the substrates W1 and W2 is activated in a reduced pressure atmosphere is performed (step S102). In this step, the reduced pressure atmosphere means, for example, a state in which gas pressure in the chamber 212 is $1\times10^{-2}$ Pa or less. In addition, the activation treatment device 2 feeds $N_2$ gas into the chamber 212 from the nitrogen gas storage 221A through the feeding pipe 223A by opening, for example, the feeding valve 222A illustrated in FIG. 2. Next, the activation treatment device 2, while suspending the supply of high-frequency current from the high-frequency power source 216 to the induction coil 215, applies high-frequency bias to the substrate W1 or W2 placed on the stage 210 by the bias applier 217. Through this processing, the bonding surfaces of the substrates W1 and W2 are subjected to reactive ion etching (RIE) using $N_2$ gas. Succeedingly, the activation treatment device 2 starts supplying the high-frequency current from the high-frequency power source 216 to the induction coil 215 and thereby generates plasma with the $N_2$ gas. On this occasion, the activation treatment device 2 suspends application of the high-frequency bias to the substrate W1 by the bias applier 217. In this way, the bonding surface of the substrate W1 is irradiated with $N_2$ radicals.

On the other hand, when the activation treatment device 2 subjects the bonding surface of the substrate W2, that is, a Si substrate or a nitride substrate, to the activation treatment, the activation treatment device 2 first feeds $O_2$ gas into the chamber 212 from the oxygen gas storage 221B through the feeding pipe 223B by opening the feeding valve 222B. Next, the activation treatment device 2, while suspending supply of high-frequency current from the high-frequency power source 216 to the induction coil 215, applies high-frequency bias to the substrate W2 placed on the stage 210 by the bias applier 217. Through this processing, the bonding surface of the substrate W2 is subjected to reactive ion etching (RIE) using $O_2$ gas. Succeedingly, the activation treatment device 2, by closing the feeding valve 622B and thereby suspending feeding of $O_2$ gas from the oxygen gas storage 221B into the chamber 212, exhausts the $O_2$ gas in the chamber 212. Subsequently, the activation treatment device 2 feeds $N_2$ gas into the chamber 212 from the nitrogen gas storage 221A through the feeding pipe 223A by opening the feeding valve 222A. Subsequently, the activation treatment device 2 starts supplying the high-frequency current from the high-frequency power source 216 to the induction coil 215 and thereby generates plasma with the $N_2$ gas. On this occasion, the activation treatment device 2002 suspends application of the high-frequency bias to the substrate W2 by the bias applier 217. In this way, the bonding surface of the substrate W2 is irradiated with $N_2$ radicals. Note that, at the same time as the activation treatment step or before the activation treatment step, the activation treatment device 2 may perform, at the same time, a cover heating step of heating a cover (not illustrated) that is arranged in the chamber 212 in such a manner as to include an activation treatment area in a peripheral portion of the substrate W1 or W2 to be subjected to activation treatment.

Subsequently, the transportation robot 821 transports the substrate W1 or W2 to the cleaning device 3 (step S103). In this step, when the inlet of the activation treatment device 2 is opened, the transportation robot 821 takes out the substrate W1 or W2 placed on the stage 210 in the chamber 212 of the activation treatment device 2. When the cleaning device 3 opens a carrying in/out port for the substrate W1 or W2, the transportation robot 821, while holding the substrate W1 or W2, turns in such a way that the tip portion of the arm 821a points to the cleaning device 3 side. Subsequently, the transportation robot 821, by stretching the arm 821a, inserts the tip portion of the arm 821a into the cleaning device 3. Then, the substrate W1 or W2 is transferred from the tip portion of the arm 821a of the transportation robot 821 to a stage in the cleaning device 3.

Succeedingly, the cleaning device 3 performs an aqueous cleaning step of cleaning the substrate W1 or W2 with water (step S104). Subsequently, the first transportation device 82 transports the substrate W1 or W2 for which the aqueous cleaning step is finished from the cleaning device 3 to the load lock device 83 (step S105). In this step, the transportation robot 821 of the first transportation device 82, while the carrying in/out port for the substrate W1 or W2 in the cleaning device 3 is opened, stretches the arm 821a and thereby inserts the tip portion of the arm 821a into the cleaning device 3 and receives the substrate W1 or W2 from the stage in the cleaning device 3. Next, the transportation robot 821, by contracting the arm 821a, takes the substrate W1 or W2 out of the cleaning device 3. Succeedingly, when the gate driver 834 of the load lock device 83 opens the gate 833a on the first transportation device 82 side of the waiting chamber 831, the transportation robot 821, while holding the substrate W1 or W2, turns in such a way that the tip portion of the arm 821a points to the load lock device 83 side. Subsequently, the transportation robot 821, by stretching the arm 821a, inserts the tip portion of the arm 821a into the waiting chamber 831. Then, the substrate W1 or W2 is transferred from the tip portion of the arm 821a into the waiting chamber 831. Next, when the transfer of the substrate W1 or W2 to a cassette 8361 of a substrate holding mechanism 836 is finished, the transportation robot 821 contracts the arm 821a. Then, the gate driver 834 closes the gate 833a of the waiting chamber 831. Succeedingly, the load lock device 83 brings the inside of the waiting chamber 831 to a reduced pressure atmosphere. In this step, the reduced pressure atmosphere means, for example, a state in which gas pressure in the waiting chamber 831 is $1 \times 10^{-2}$ Pa or less. Subsequently, the second transportation device 84 transports the substrates W1 and W2 that are arranged in the waiting chamber 831 to the substrate bonding device 1 (step S106). Next, a substrate bonding step of bonding the substrates W1 and W2 to each other is performed (step S107). Details of the substrate bonding step is described later.

Next, the second transportation device 84 transports the substrates W1 and W2 bonded to each other from the bonding device 1 to the load lock device 83 (step S108). Subsequently, the second transportation device 84 transports the substrates W1 and W2 bonded to each other from the load lock device 83 to the take-out port 813 (step S109). In this step, first, the load lock device 83 opens the inside of the waiting chamber 831 to the atmosphere. Next, the gate driver 834 of the load lock device 83 opens the gate 833a on the first transportation device 82 side in the waiting chamber 831 and the transportation robot 821, while pointing the tip portion of the arm 821a to the load lock device 83 side, stretches the arm 821a and inserts the tip portion of the arm 821a into the waiting chamber 831. Then, the substrates W1 and W2 bonded to each other are transferred to the tip portion of the arm 821a of the transportation robot 821 in the waiting chamber 831. Succeedingly, after the transportation robot 821, by contracting the arm 821a, takes the substrates W1 and W2 bonded to each other out of the waiting chamber 831, the gate driver 834 of the load lock device 83 closes the gate 833a. Subsequently, the transportation robot 821 turns in such a way that the tip portion of the arm 821a points to the take-out port 813 side. Next, the transportation robot 821, while holding the substrates W1 and W2 bonded to each other, stretches the arm 821a and thereby inserts the tip portion of the arm 821a into the take-out port 813 and arranges the substrates W1 and W2 bonded to each other in the take-out port 813. Then, the substrates W1 and W2 bonded to each other, after having been taken out of the take-out port 813, is subjected to heat treatment by being exposed to an environment of a temperature of 200° C. for two hours.

Next, the aforementioned substrate bonding step that the substrate bonding device 1 performs is described, referring to FIGS. 9 to 11. Note that it is assumed that, in FIG. 9, the substrate bonding device 1 has already finished measurement of distance between the upper surface of the stage 401 and the under surface of the head 402 while the substrates W1 and W2 were not held by the stage 401 and the head 402, respectively, by use of the distance measurer 490 and stored a result of the measurement in a memory of a CPU unit or an input/output control unit. It is further assumed that measurement results of thicknesses of the substrates W1 and W2 have already been stored in the memory of the CPU unit or the input/output control unit.

First, the substrate bonding device 1 performs a substrate holding step of causing the stage 401 to hold only a peripheral portion of the substrate W1 and also causing the head 402 to hold only a peripheral portion of the substrate W2 while the bonding surfaces of the substrates W1 and W2 face each other (step S1). In this step, the controller 9 drives the electrostatic chuck 441 arranged in the first area A1 of the stage 401 while, for example, the substrate W1 is placed on the stage 401, and thereby causes the stage 401 to hold only the peripheral portion of the substrate W1. In addition, the controller 9 drives the electrostatic chuck 442 arranged in the first area A1 of the head 402 while the head 402 is brought into contact with the opposite side to the bonding surface side of the substrate W2 arranged vertically directly below the head 402 by, for example, a transportation robot (not illustrated), and thereby causes the head 402 to hold only the peripheral portion of the substrate W2.

Next, the substrate bonding device 1 calculates a distance between the bonding surface of the substrate W1 and the bonding surface of the substrate W2, based on the distance between the upper surface of the stage 401 and the under surface of the head 402 while the substrates W1 and W2 are not held by the stage 401 and the head 402, respectively, and the thicknesses of the substrates W1 and W2. Then, the substrate bonding device 1 moves the head 402 vertically downward based on the calculated distance and thereby brings the substrates W1 and W2 close to each other (step S2).

Figure 10A:
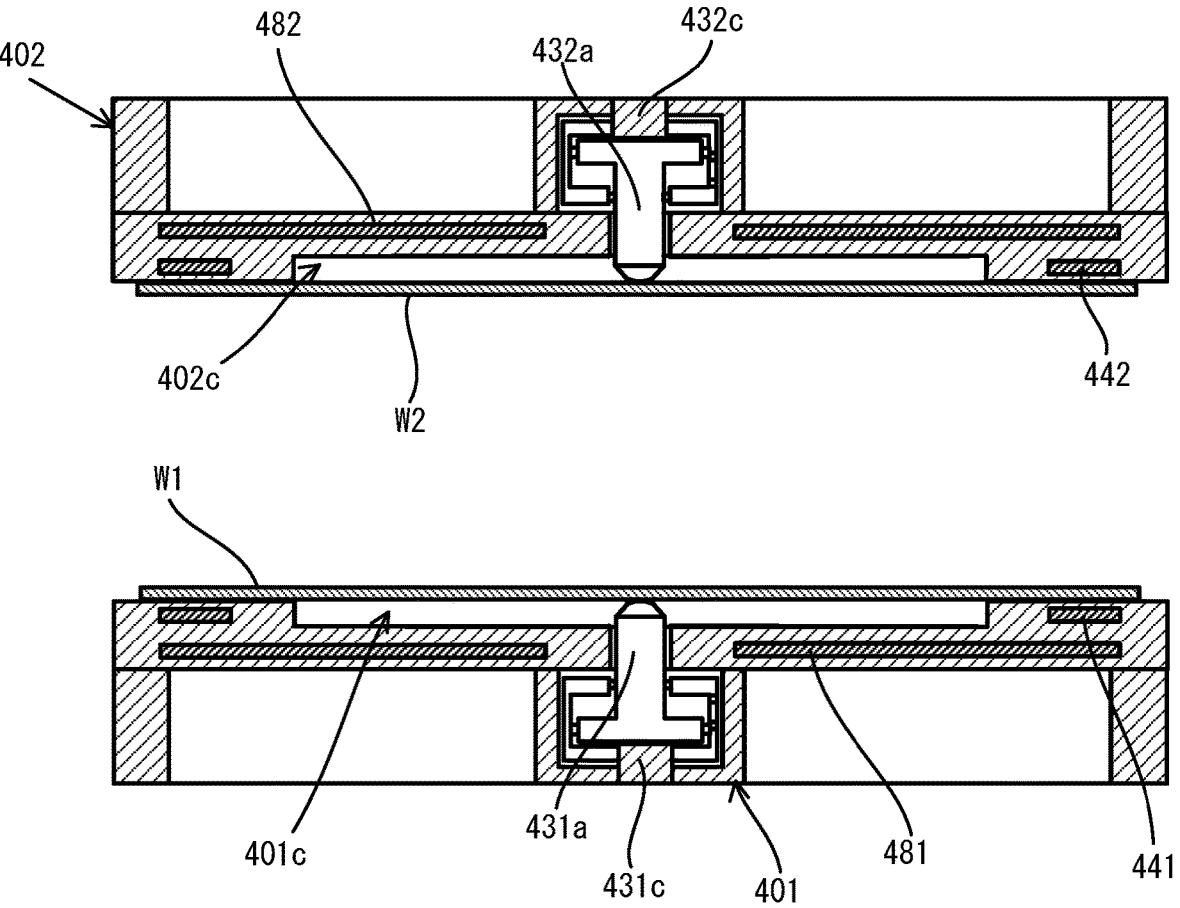
FIG. 10A is a schematic cross-sectional view illustrating a state in which substrates are held by the stage and the head according to Embodiment 1.

Next, the substrate bonding device 1 calculates misalignment amounts of the substrate W1 with respect to the substrate W2 while the substrates W1 and W2 are separated from each other as illustrated in FIG. 10A (step S3). In this step, the controller 9 first acquires captured images GAa and GAb (see FIG. 7A) of the two substrates W1 and W2 in the non-contact state from the first imager 501 and the second imager 502 in the position measurer 500. The controller 9 calculates each of misalignment amounts $\Delta x$, $\Delta y$, and $\Delta \theta$ in the X-direction, the Y-direction, and the rotational direction about the Z-axis between the two substrates W1 and W2, based on the two captured images GAa and GAb. Specifically, the controller 9 calculates misalignment amounts $\Delta xa$ and $\Delta ya$ (see FIG. 7B), using a vector correlation method, based on, for example, the captured image GAa in which the alignment marks MK1a and MK2a, which are separated from each other in the Z-direction, are captured at the same time. Likewise, the controller 9 calculates misalignment amounts $\Delta xb$ and $\Delta yb$, using the vector correlation method, based on the captured image GAb in which the alignment marks MK1b and MK2b, which are separated from each other in the Z-direction, are captured at the same time. Then, the controller 9 calculates misalignment amounts $\Delta x$, $\Delta y$, and $\Delta \theta$ in horizontal directions between the two substrates W1 and W2, based on the misalignment amounts $\Delta xa$, $\Delta ya$, $\Delta xb$, and $\Delta yb$.

Returning to FIG. 9, the substrate bonding device 1 succeedingly performs position alignment by relatively moving the substrate W2 with respect to the substrate W1 in such a way as to correct the calculated misalignment amounts $\Delta x$, $\Delta y$, and $\Delta \theta$ (step S4). In this processing, the substrate bonding device 1 moves the head 402 in the X-direction, the Y-direction, and the rotational direction about the Z-axis while the stage 401 is fixed in such a way as to eliminate the misalignment amounts $\Delta x$, $\Delta y$, and $\Delta \theta$.

Subsequently, the substrate bonding device 1, by bringing the head 402 close to the stage 401, arranges the head 402 at a position at which a gap between the substrates W1 and W2 becomes an optimal gap to bring central portions W1c and W2c into contact with each other while the substrates W1 and W2 are bent. Then, the substrate bonding device 1 causes the substrates W1 and W2 to bend while the substrates W1 and W2 are separated from each other (step S5). The substrate bonding device 1 causes the W1 to bend in such a manner that the central portion W1c of the substrate W1 protrudes toward the substrate W2 with respect to a peripheral portion W1s of the substrate W1, as illustrated in, for example, FIG. 10B. On this occasion, the substrate bonding device 1 causes the first pressing rod 431a to press the central portion of the substrate W1 toward the substrate W2 while causing the electrostatic chuck 441 to hold the substrate W1 by causing the holder driver to apply voltage to the electrostatic chuck 441. This processing causes the substrate W1 to bend in such a way that the central portion W1c of the substrate W1 protrudes toward the substrate W2. In addition, the substrate bonding device 1 bends the substrate W2 in such a manner that the central portion W2c of the substrate W2 protrudes toward the substrate W1 with respect to a peripheral portion W2s of the substrate W2. On this occasion, the substrate bonding device 1 causes the second pressing rod 432a to press the central portion W2c of the substrate W2 toward the substrate W1 while causing the electrostatic chuck 442 to hold the substrate W2 by causing the holder driver to apply voltage to the electrostatic chuck 442. This processing causes the substrate W2 to bend in such a way that the central portion W2c of the substrate W2 protrudes toward the substrate W1.

Figure 10B:
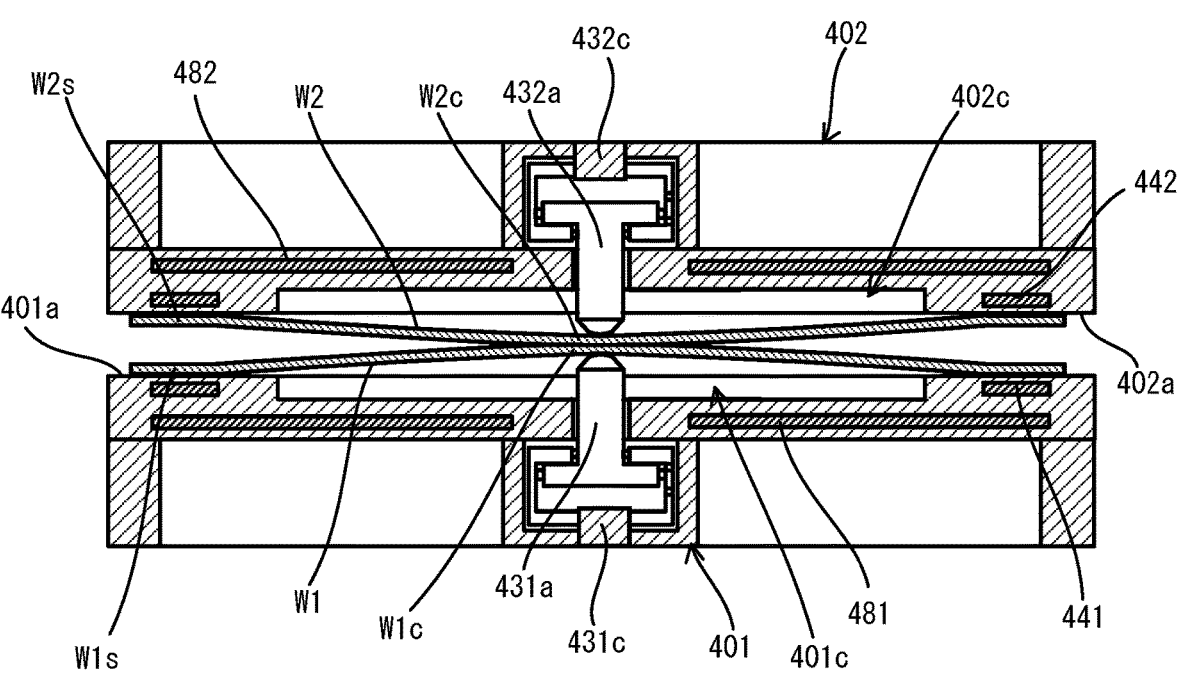
FIG. 10B is a schematic cross-sectional view illustrating a state in which central portions of the substrate bonding surfaces held by the stage and the head according to Embodiment 1 are brought into contact with each other.
Figure 11A:
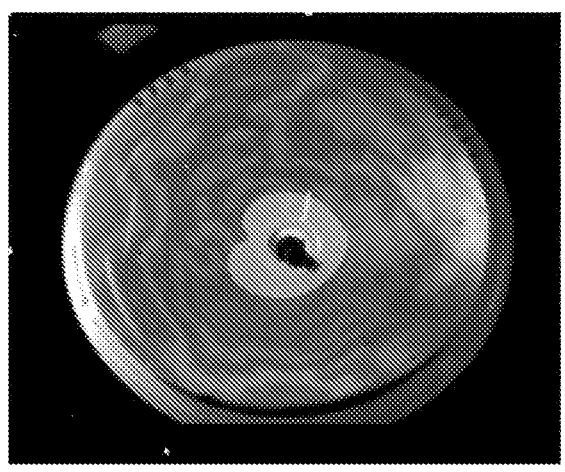
FIG. 11A is an appearance photograph of substrates immediately after central portions of two substrates are brought into contact with each other.
Figure 11B:
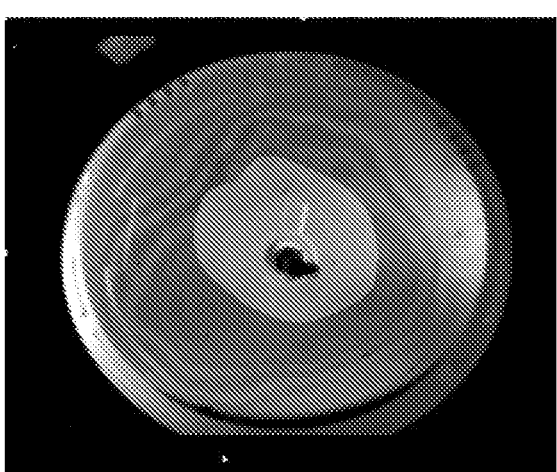
FIG. 11B is an appearance photograph of the substrates at a time point later than a time point in FIG. 11A.
Figure 11C:
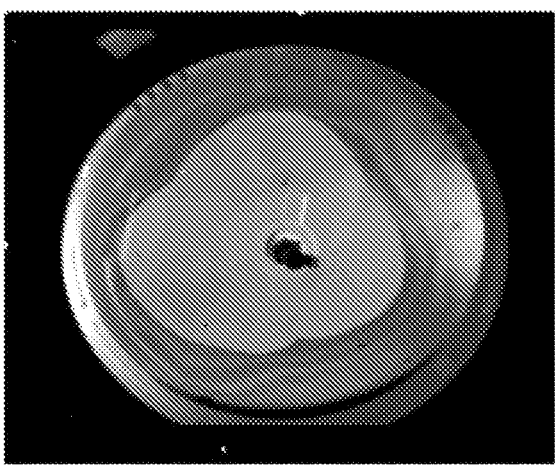
FIG. 11C is an appearance photograph of the substrates at a time point later than the time point in FIG. 11B.
Figure 11D:
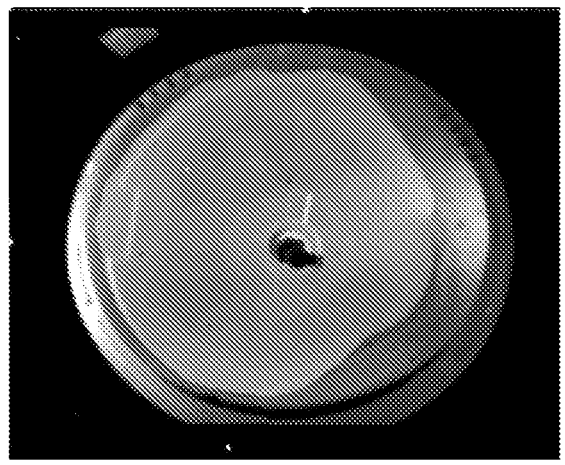
FIG. 11D is an appearance photograph of the substrates at a time point later than the time point in FIG. 11C.
Figure 11E:
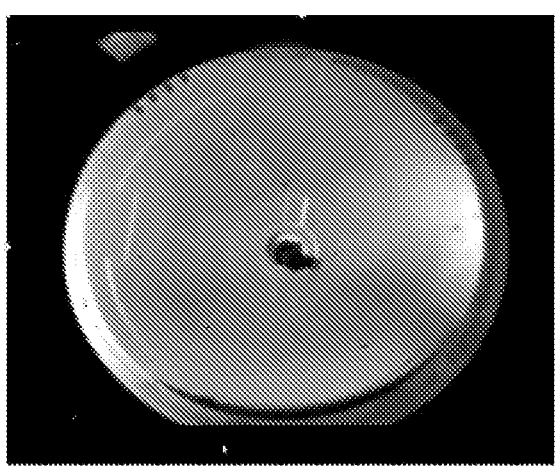
FIG. 11E is an appearance photograph of the substrates at a time point later than the time point in FIG. 11D.
Figure 12A:
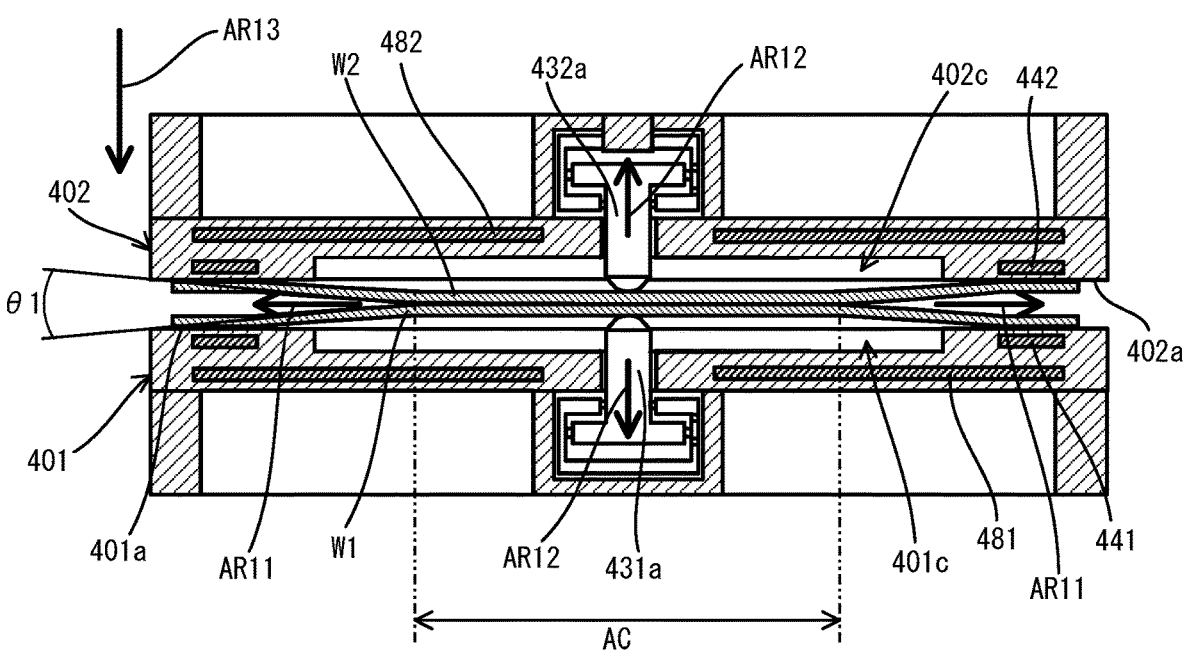
FIG. 12A is a schematic cross-sectional view illustrating a manner in which the substrates held by the stage and the head according to Embodiment 1 are brought close to each other.

Returning to FIG. 9, next, the substrate bonding device 1 performs a first contact step of bringing the central portion W1c of the substrate W1 and the central portion W2c of the substrate W2 into contact with each other (step S6). On this occasion, the substrates W1 and W2 have the central portions W1c and W2c thereof coming into contact with each other, as illustrated in FIG. 10B. Succeedingly, the substrate bonding device 1 performs a second contact step of, by causing the ascent/descent driver 406 to move the head 402 downward, enlarging a contact area between the substrates W1 and W2 from the central portions W1c and W2c toward the peripheral portions W1s and W2s of the substrates W1 and W2, as illustrated in FIG. 9 (step S7). In this step, while the central portions W1c and W2c of the substrates W1 and W2 are butted against each other and a distance between the peripheral portions W1s and W2s of the substrates W1 and W2 is maintained constant, the contact area between the substrates W1 and W2 expands from the central portions W1c and W2c toward the peripheral portions W1s and W2s of the substrates W1 and W2 by intermolecular force (the van der Waals force) generated between the substrates W1 and W2. In this processing, the substrate bonding device 1, while the substrates W1 and W2 are separated from each other by 50 $\mu$m, applies point pressure to the central portions W1c and W2c of the substrates W1 and W2 by the first pressing rod 431a and the second pressing rod 432a, respectively. With the point pressure application functioning as a trigger, a so-called bonding wave naturally spreads to the peripheral portions of the substrates W1 and W2 without the substrates W1 and W2 being pressed against each other from the outside in a direction in which the substrates W1 and W2 come close to each other. The bonding wave spreads to the peripheral portions of the substrates W1 and W2 by bonding force due to water or OH groups existing on the bonding surfaces of the substrates W1 and W2 even without the substrates W1 and W2 being pressed against each other from the outside in a direction in which the substrates W1 and W2 come close to each other. As illustrated in, for example, FIGS. 11A to 11E, the contact area between the substrates W1 and W2 expands from the central portions W1$c$ and W2$c$ toward the peripheral portions W1$s$ and W2$s$ of the substrates W1 and W2. FIG. 11A illustrates a state immediately after the central portions W1$c$ and W2$c$ of the substrates W1 and W2 are brought into contact with each other, and standing time after the central portions W1$c$ and W2$c$ of the substrates W1 and W2 are brought into contact with each other becomes longer as it proceeds from FIG. 11B to FIG. 11E. The substrate bonding device 1 causes the first pressing rod 431$a$ to move in a direction in which the first pressing rod 431$a$ is caused to retract into the stage 401 and causes the second pressing rod 432$a$ to move in a direction in which the second pressing rod 432$a$ is caused to retract into the head 402, as illustrated by arrows AR12 in FIG. 12A. At the same time, the substrate bonding device 1 causes the head 402 to move in a direction in which the head 402 comes close to the stage 401, as illustrated by an arrow AR13. In this processing, by the first pressing driver 431$b$, while position-controlling the first pressing rod 431$a$ in such a manner that the tip portion of the first pressing rod 431$a$ is maintained at a preset position, causing the first pressing rod 431$a$ to retract as the head 402 descends and the second pressing driver 432$b$ controlling application of pressure in such a manner that pressure applied to the second pressing rod 432$a$ becomes constant, the contact area between the substrates W1 and W2 is controlled to be maintained at a middle position in the direction in which the substrates W1 and W2 face each other. Because of this configuration, it is possible to prevent a warp from occurring in the substrates W1 and W2 when the substrates W1 and W2 are bonded to each other. The substrate bonding device 1, while the central portions W1$c$ and W2$c$ of the substrates W1 and W2 are butted against each other, reduces the distance between the peripheral portions W1$s$ and W2$s$ of the substrates W1 and W2. Then, as illustrated by arrows AR11 in FIG. 12A, the contact area between the substrates W1 and W2 further expands from the central portions W1$c$ and W2$c$ toward the peripheral portions W1$s$ and W2$s$ of the substrates W1 and W2.

The substrate bonding device 1 drives the stage 401 and the head 402 in such a way that an angle θ1 formed by the bonding surface of the substrate W1 and the bonding surface of the substrate W2 at the periphery of a contact area AC between the substrates W1 and W2 is less than or equal to a preset reference angle. Note that the reference angle is set to, for example, 45 degrees, and preferably set to 15 degrees or less. This configuration causes distortion generated at the peripheral portion of the contact area AC between the substrates W1 and W2 when the substrates W1 and W2 come into contact with each other to be mitigated. Note that, on this occasion, the substrate W1 and the substrate W2 are in a so-called temporarily bonded state in which the substrate W1 and the substrate W2 are bonded while being separable from each other. The reference angle θ1 is set based on bonding force bonding the substrates W1 and W2 to each other while the substrates W1 and W2 are in the temporarily bonded state and peel force required to peel the substrates W1 and W2 from the stage 401 and the head 402, respectively. Note that the aforementioned bonding force, adsorption force, and peel force are required to be measured in advance before bonding processing of bonding the substrates W1 and W2 to each other is performed.

Returning to FIG. 9, subsequently, the substrate bonding device 1 measures misalignment amounts of the substrate W2 with respect to the substrate W1 while the bonding surface of the substrate W1 and the bonding surface of the substrate W2 are in contact with each other (step S8). On this occasion, the substrate bonding device 1 measures the misalignment amounts between the substrates W1 and W2 while movement of the substrate W2 with respect to the substrate W1 is restricted by advancing temporary bonding between the substrate W1 and the substrate W2. Next, the substrate bonding device 1 determines whether or not all of the calculated misalignment amounts Δx, Δy, and Δθ are less than or equal to the preset misalignment amount threshold values Δxth, Δyth, and Δθth, respectively (step S9).

In this step, it is assumed that, by the substrate bonding device 1, one of the calculated misalignment amounts Δx, Δy, and Δθ is determined to be greater than a corresponding one of the preset misalignment amount threshold values Δxth, Δyth, and Δθth (step S9: No). In this case, the substrate bonding device 1 separates the substrate W2 from the substrate W1 (step S10). On this occasion, the substrate bonding device 1, while causing the head 402 to ascend and thereby widening the distance between the substrates W1 and W2, causes the first pressing rod 431$a$ to move in a direction in which the first pressing rod 431$a$ is caused to retract into the stage 401 and also causes the second pressing rod 432$a$ to move in a direction in which the second pressing rod 432$a$ is caused to retract into the head 402. In this processing, the substrate bonding device 1 controls ascent of the head 402 in such a way that tensile pressure on the substrate W2 when the substrate W2 is peeled from the substrate W1 is constant. This configuration causes the substrate W2 to be separated from the substrate W1 and the contact state between the substrate W1 and the substrate W2 to be released.

Succeedingly, the substrate bonding device 1 calculates correction movement amounts of the substrates W1 and W2 required to decrease all of the calculated misalignment amounts Δx, Δy, and Δθ to the misalignment amount threshold values Δxth, Δyth, and Δθth or less, respectively (step S11). In this step, the controller 9 calculates correction movement amounts that cause the substrates W1 and W2 to move by movement amounts equivalent to differences between the misalignment amounts Δx, Δy, and Δθ between the substrate W1 and the substrate W2 while the substrate W2 is in contact with the substrate W1 and misalignment amounts between the substrate W1 and the substrate W2 while the substrate W2 is not in contact with the substrate W1. Aligning the substrates W1 and W2 with the positions thereof offset from each other by the correction movement amounts enables misalignment between the substrates W1 and W2 to be eliminated if similar misalignment caused by the substrates W1 and W2 coming into contact with each other occurs when the substrates W1 and W2 come into contact with each other again.

Subsequently, the substrate bonding device 1 performs position alignment in such a way as to correct the relative misalignment amounts Δx, Δy, and Δθ between the two substrates W1 and W2 while the two substrates W1 and W2 are not in contact with each other (step S12). In this processing, the substrate bonding device 1 moves the head 402 in the X-direction, the Y-direction, and the rotational direction about the Z-axis by the correction movement amounts calculated in step S11 while the stage 401 is fixed. In this way, the substrate bonding device 1 adjusts the relative position of the substrate W2 with respect to the substrate W1 in such a way that the misalignment amounts Δx, Δy, and Δθ decrease while the substrates W1 and W2 are separated from each other. Subsequently, the substrate bonding device 1 performs the processing in step S5 again.

On the other hand, it is assumed that, by the substrate bonding device 1, all of the calculated misalignment amounts $\Delta x$, $\Delta y$, and $\Delta\theta$ are determined to be less than or equal to the preset misalignment amount threshold values $\Delta xth$, $\Delta yth$, and $\Delta\theta th$, respectively (step S9: Yes). In this case, the substrate bonding device 1 further enlarges the contact area between the substrates W1 and W2 from the central portions W1c and W2c toward the peripheral portions W1s and W2s of the substrates W1 and W2 and brings the substrates W1 and W2 into contact with each other over the entire bonding surfaces (step S13). In this processing, the substrate bonding device 1 reduces the distance between the peripheral portions of the substrates W1 and W2 by causing the first pressing rod 431a to move in a direction in which the first pressing rod 431a is caused to retract into the stage 401 and causing the second pressing rod 432a to move in a direction in which the second pressing rod 432a is caused to retract into the head 402 and, at the same time, causing the head 402 to move in a direction in which the head 402 comes close to the stage 401. In this way, the substrate bonding device 1 brings the peripheral portion of the substrate W1 into contact with the peripheral portion of the substrate W2 and thereby brings the bonding surfaces of the substrates W1 and W2 into contact with each other over the entire bonding surfaces.

Figure 12B:
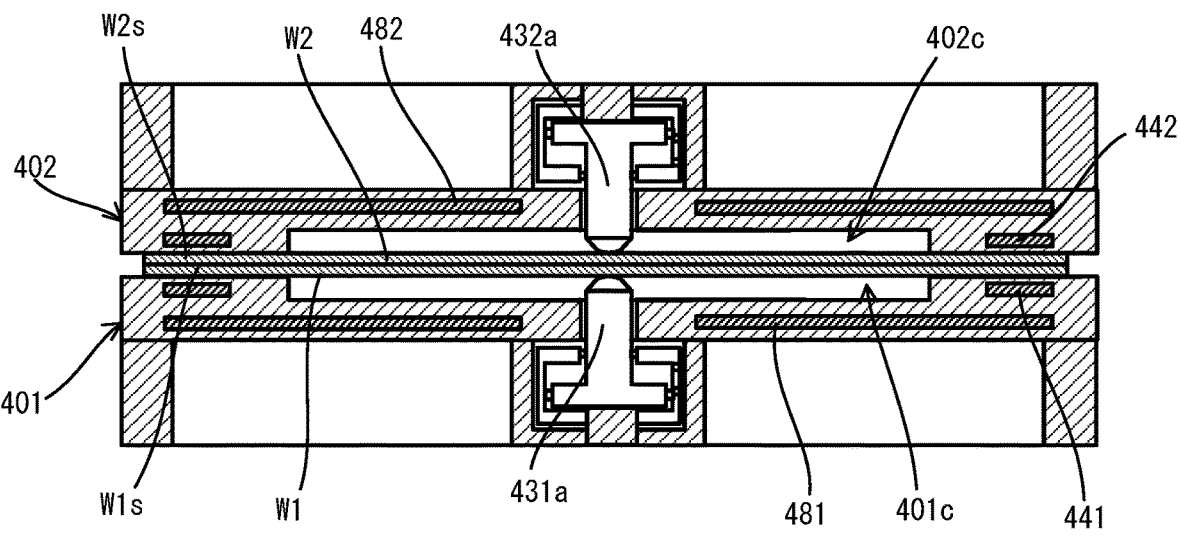
FIG. 12B is a schematic cross-sectional view illustrating a state in which peripheral portions of bonding surfaces of the substrates held by the stage and the head according to Embodiment 1 are brought into contact with each other.
Figure 12C:
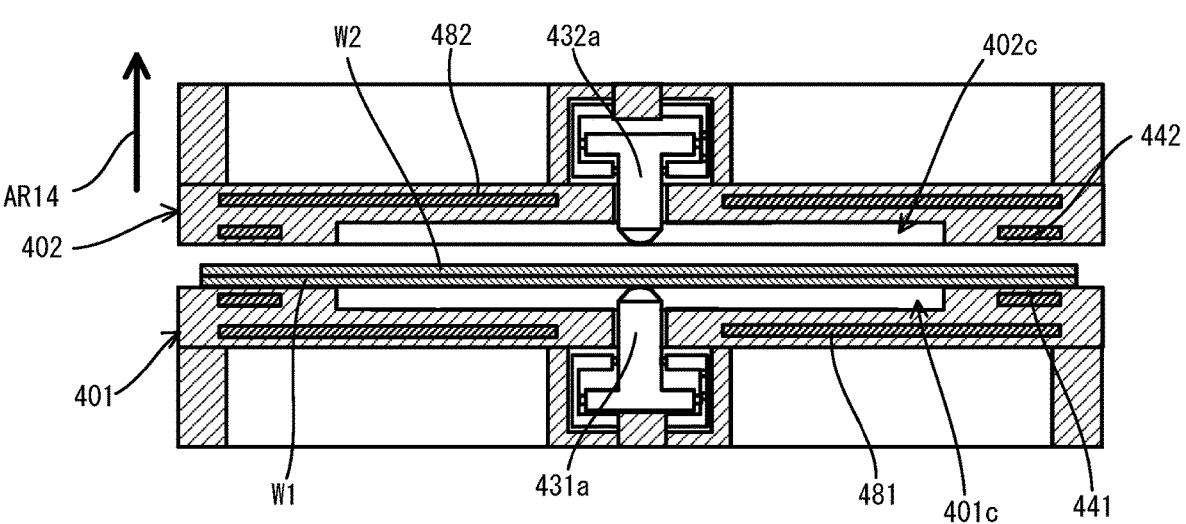
FIG. 12C is a schematic cross-sectional view illustrating a manner in which the head is separated from the stage according to Embodiment 1.

Next, the substrate bonding device 1 performs a bonding step of bonding the substrates W1 and W2 to each other by pressing the peripheral portions W1s and W2s of the substrates W1 and W2 against each other through pressing only the peripheral portion W1s of the substrate W1 against the peripheral portion W2s of the substrate W2 while the substrates W1 and W2 are in contact with each other over the entire bonding surfaces, as illustrated in FIG. 12B (step S14). Succeedingly, the substrate bonding device 1 releases holding of the substrate W2 by the head 402 by suspending operation of the electrostatic chuck 442 of the head 402, as illustrated in FIG. 9 (step S15). Subsequently, the substrate bonding device 1 separates the head 402 from the substrate W2 by causing the head 402 to ascend, as illustrated by an arrow AR14 in FIG. 12C.

Figure 13A:
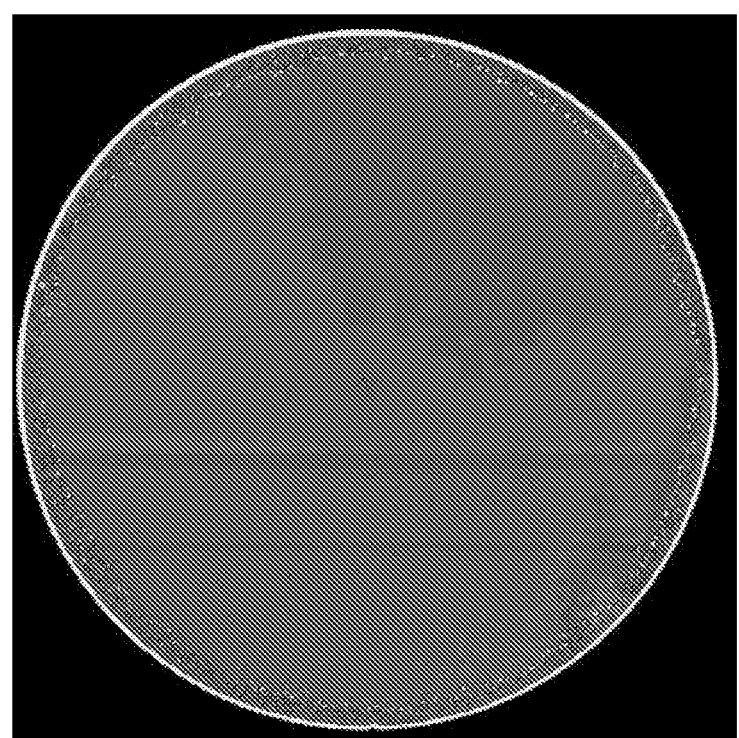
FIG. 13A is an appearance photograph of two substrates bonded to each other when peripheral portions of the two substrates are not pressed against each other.
Figure 13B:
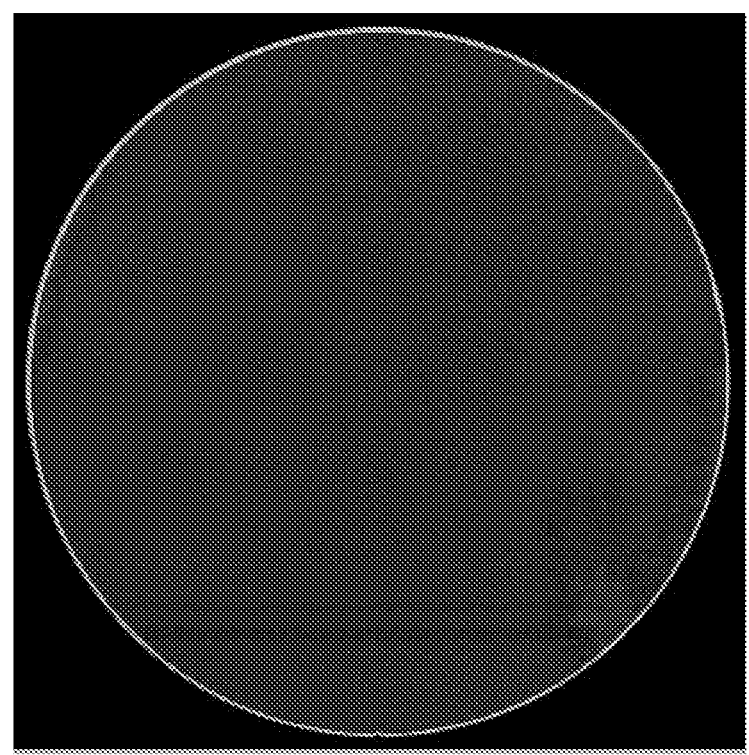
FIG. 13B is an appearance photograph of two substrates bonded to each other when peripheral portions of the two substrates are pressed against each other.

It is now assumed that, in step S14 in the substrate bonding step that was described using FIGS. 9 to 12, the peripheral portions W1s and W2s of the substrates W1 and W2 are not pressed against each other while the substrates W1 and W2 are in contact with each other over the entire bonding surfaces. In this case, the aforementioned bonding wave does not reach the peripheries of the substrates W1 and W2, and lifting occurs particularly on the peripheral portions of the substrates W1 and W2. In a conventional method for bonding the substrates W1 and W2 to each other, it is common practice that the peripheral portions W1s and W2s of the substrates W1 and W2 are bonded to each other by releasing holding of the peripheral portions of the substrates W1 and W2 and causing one of the peripheral portions W1s and W2s of the substrates W1 and W2 to fall freely onto the other of the peripheral portions W1s and W2s. In this case, when the substrates W1 and W2 are released from the chamber 120 into the atmosphere outside the chamber 120 for heat treatment of the substrates W1 and W2, moisture contained in the atmosphere infiltrates between the peripheral portions of the substrates W1 and W2 and microvoids occur caused by the moisture at the time of heat treatment. For example, as illustrated in FIG. 13A, voids occur on the peripheral portions of the substrates W1 and W2 bonded to each other. In contrast, in the substrate bonding step according to the present embodiment, the peripheral portions W1s and W2s of the substrates W1 and W2 are pressed against each other by pressing only the peripheral portion W1s of the substrate W1 against the peripheral portion W2s of the substrate W2 while the substrates W1 and W2 are in contact with each other over the entire bonding surfaces. Because of this configuration, it is possible to prevent a void from occurring between the peripheral portions of the substrates W1 and W2, as illustrated in FIG. 13B. By preventing a void from occurring between the peripheral portions of the substrates W1 and W2 as described above, it is possible to prevent separation between the substrates W1 and W2 when, for example, the substrates W1 and W2 are polished by making use of a chemical mechanical polishing (CMP) technology in a step after the step in which the substrates W1 and W2 are bonded to each other and, in association with this effect, it is possible to prevent, for example, excessive polishing and the like caused by the separation between the substrates W1 and W2.

As described in the foregoing, according to the bonding method according to the present embodiment, after bringing the central portion W1c of the substrate W1 and the central portion W2c of the substrate W2 into contact with each other while the substrate W1 is bent in such a manner that the central portion W1c of the substrate W1 protrudes toward the substrate W2 with respect to the peripheral portion of the substrate W1, a contact area between the substrates W1 and W2 is enlarged from the central portions W1c and W2c toward the peripheral portions W1s and W2s of the substrates W1 and W2. The substrates W1 and W2 are bonded to each other by relatively pressing only the peripheral portion W1s of the substrate W1 against the peripheral portion W2s of the substrate W2 while the substrates W1 and W2 are in contact with each other over the entire bonding surfaces. Through this processing, enlarging the contact area between the substrates W1 and W2 from the central portions W1c and W2c toward the peripheral portions W1s and W2s enables the peripheral portions W1s and W2s of the substrates W1 and W2 to be brought into contact with each other without a gap even when the substrates W1 and W2 are brought into a state in which the peripheral portion W2s of the substrate W2 is lifted from the peripheral portion W1s of the substrate W1. Therefore, it is possible to prevent a void from occurring between the peripheral portions W1s and W2s of the substrates W1 and W2 while the substrates W1 and W2 are bonded to each other.

It is now assumed that surfaces of the stage 401 and the head 402 that hold the substrates W1 and W2, respectively, are flat. In this case, when, in the bonding step, the substrate W1 is relatively pressed against the substrate W2 while the substrates W1 and W2 are brought into contact with each other, distortion arising in the substrates W1 and W2 is generated. Then, when, for example, a device portion serving as a basis for a semiconductor device is formed in each of the substrates W1 and W2, there is a risk that a position of the device portion in the substrate W2 is shifted with respect to the device portion in the substrate W1. In contrast, the stage 401 and the head 402 according to the present embodiment have the recessed portions 401c and 402c formed in the second areas A2, respectively. Because of this configuration, when, in the bonding step, the substrate W1 is relatively pressed against the substrate W2 while the substrates W1 and W2 are brought into contact with each other, the recessed portions 401c and 402c formed in the second areas A2 of the stage 401 and the head 402 cause distortion generated in the substrates W1 and W2 to be mitigated. Therefore, the device portion in the substrate W1 and the device portion in the substrate W2 can be bonded to each other with high positional precision.

In addition, in the case where placement surfaces of the stage and the head on which the substrates W1 and W2 are placed are flat, when the substrates W1 and W2 are brought into contact with each other, the entire bonding surfaces of the substrates W1 and W2 do not necessarily come into contact with each other at the same time, and bonding advances from portions that first come into contact with each other and distortion is generated between the portions that first come into contact with each other. In addition, in this case, when the substrates W1 and W2 are pressed against each other while the substrates W1 and W2 are brought into contact with each other, pressure irregularity occurs, which also becomes a factor causing distortion to be generated in the substrates W1 and W2. In this case, for example, a distortion of approximately 0.5 μm occurs. In contrast, bringing the substrates W1 and W2 into point contact with each other at the central portions W1c and W2c of the substrates W1 and W2 and naturally enlarging the contact area between the substrates W1 and W2 to the peripheral portions W1s and W2s of the substrates W1 and W2 without the substrates W1 and W2 being pressed against each other from the outside in a direction in which the substrates W1 and W2 come close to each other as in the substrate bonding step according to the present embodiment enable the substrates W1 and W2 to be bonded to each other without distortion. In practice, the amount of distortion was able to be reduced to 0.1 μm or less.

In addition, when the central portions W1c and W2c of the substrates W1 and W2 are brought into contact with each other, the contact area between the substrates W1 and W2 expands from the central portions W1c and W2c toward the peripheral portions W1s and W2s of the substrates W1 and W2 by intermolecular force (the van der Waals force) generated between the substrates W1 and W2. Conventionally, a technology of bringing the substrates W1 and W2 into contact with each other over the entire bonding surfaces and bonding the substrates W1 and W2 to each other by releasing holding of the substrates W1 and W2 when the contact area between the substrates W1 and W2 has expanded to a vicinity of the peripheral portions W1s and W2s of the substrates W1 and W2 and causing the peripheral portion of the substrate W2 to fall onto the peripheral portion of the substrate W1 has been provided. However, in this case, there is a risk that when the substrates W1 and W2 are released into the atmosphere outside the chamber 120 for, for example, subjecting the substrates W1 and W2 to heat treatment, moisture contained in the atmosphere infiltrates between the peripheral portions W1s and W2s of the substrates W1 and W2 and microvoids occur caused by the moisture at the time of heat treatment. In contrast, in the bonding method according to the present embodiment, after the substrates W1 and W2 are brought into contact with each other over the entire bonding surfaces, the peripheral portions of the substrates W1 and W2 are pressed against each other. Because of this configuration, even when the substrates W1 and W2 are exposed to the atmosphere while the peripheral portions of the substrates W1 and W2 are lifted, no water infiltrates between the peripheral portions W1s and W2s of the substrates W1 and W2 and it is possible to prevent a void from occurring.

In addition, in the stage 401 and the head 402 according to the present embodiment, the recessed portions 401c and 402c are formed, respectively. Because of this configuration, the stage 401 and the head 402 have structures that prevent pressure from being applied to the central portions of the substrates W1 and W2 even when the substrates W1 and W2 are pressed against each other. Since, because of this configuration, when the central portions W1c and W2c of the substrates W1 and W2 are brought into contact with each other, the aforementioned bonding wave naturally spreads, no distortion is generated in the substrates W1 and W2. Note that although distortion is generated in the peripheral portions of the substrates W1 and W2 since, after the substrates W1 and W2 are brought into contact with each other over the entire bonding surfaces, the peripheral portions W1s and W2s of the substrates W1 and W2 are pressed against each other in a direction in which the peripheral portions W1s and W2s come close to each other, it is considered that a significant problem does not occur since, in many cases, no portion serving as a basis for a semiconductor device is formed in the peripheral portions of the substrates W1 and W2.

In addition, in the substrate bonding step according to the present embodiment, a series of processing in steps S7 to S12 is performed. Through this processing, relative positional precision when the substrates W1 and W2 are bonded to each other can be improved.

Embodiment 2

A substrate bonding system according to the present embodiment differs from Embodiment 1 in that, after bonding surfaces of two substrates are activated, the two substrates are bonded to each other without performing hydrophilic treatment. The substrate bonding system bonds two substrates to each other by bringing the two substrates the bonding surfaces of which, which are to be bonded to each other, have been subjected to activation treatment into contact with each other in a chamber having a degree of vacuum greater than or equal to a preset reference degree of vacuum. In the activation treatment, a bonding surface of a substrate is activated by irradiating the bonding surface of the substrate with specific energy particles.

Figure 14:
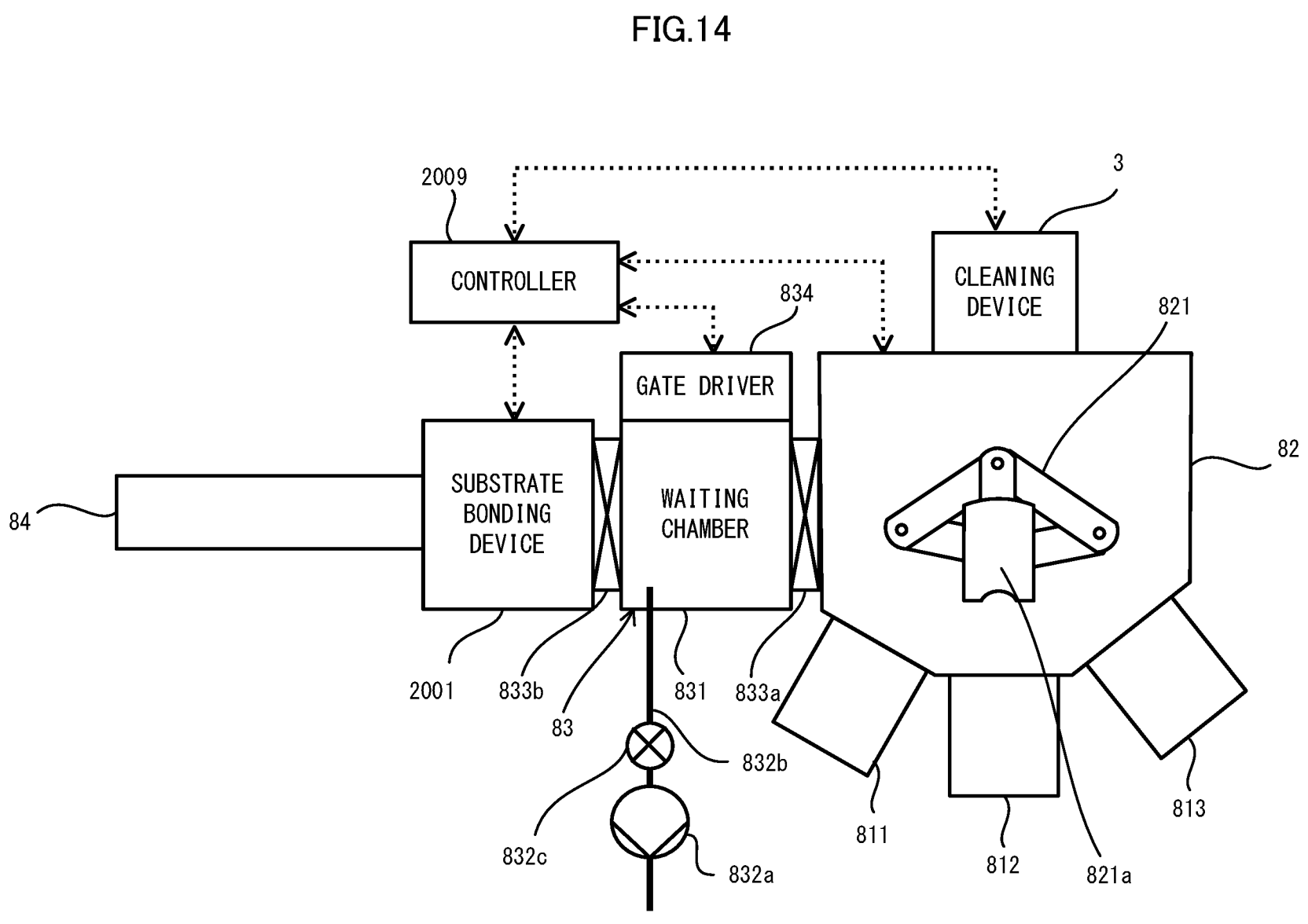

The substrate bonding system according to the present embodiment includes feeding ports 811 and 812, a take-out port 813, a first transportation device 82, a cleaning device 3, a substrate bonding device 2001, a load lock device 83, a second transportation device 84, and a controller 2009, as illustrated in FIG. 14. The controller 2009 controls the first transportation device 82, the cleaning device 3, the substrate bonding device 2001, and the load lock device 83. Note that the following description is made using the same reference signs as those in FIG. 1 for the same constituent components as those in Embodiment 1.

Figure 15:
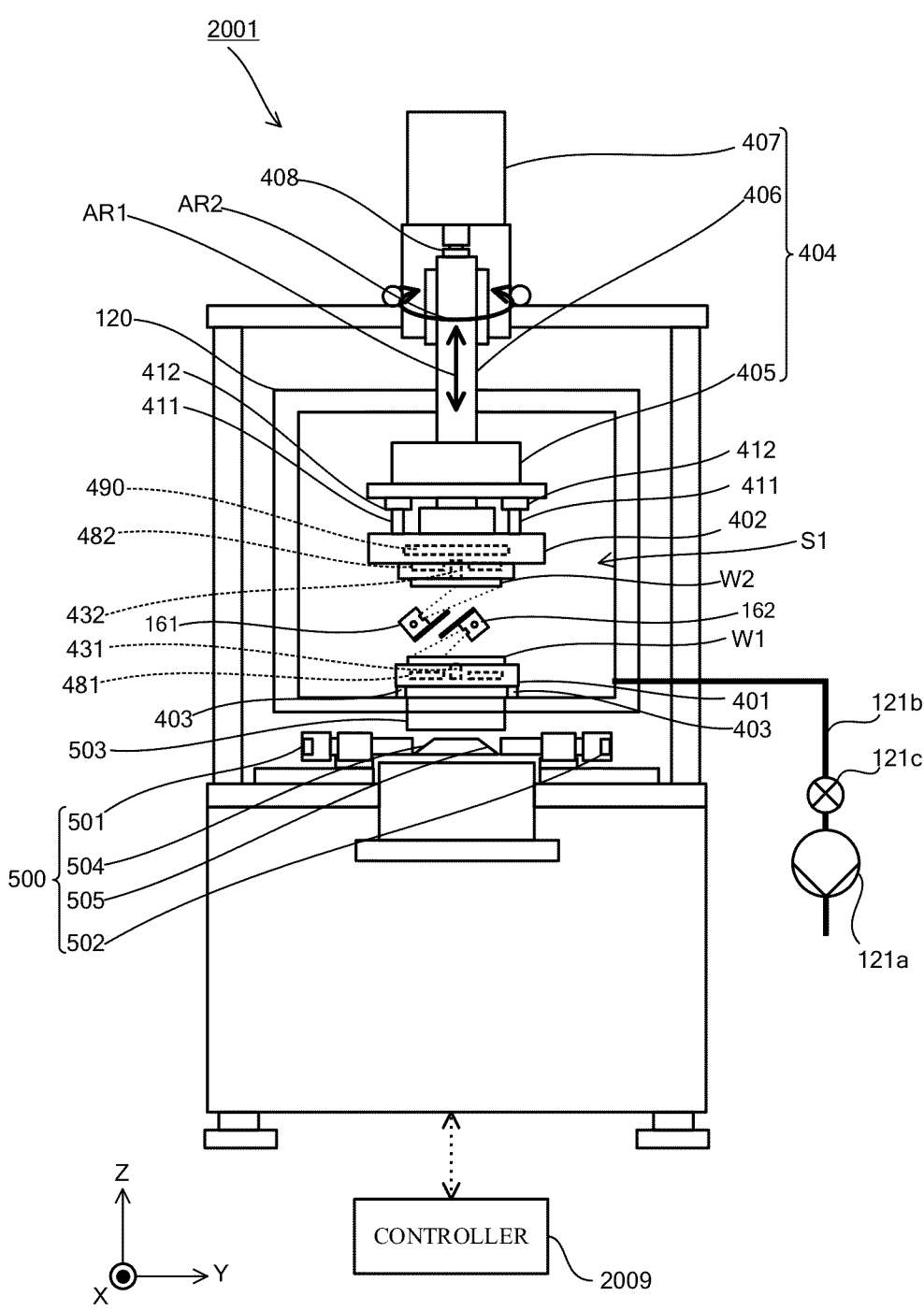
FIG. 15 is a schematic front view of a substrate bonding device according to Embodiment 2.

The substrate bonding device 2001 differs from the substrate bonding device 2001 according to Embodiment 1 in that the substrate bonding device 2001 includes particle beam sources 161 and 162, as illustrated in FIG. 15. Note that, in FIG. 15, the same constituent components as those in Embodiment 1 are provided with the same reference signs as those in FIG. 3. In addition, a degree of vacuum in a chamber 120 of the substrate bonding device 2001 is set to, for example, a degree of vacuum higher than $10^{-5}$ Pa.

Figure 16:
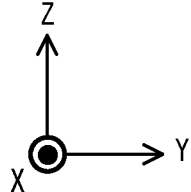
FIG. 16 is a schematic diagram of particle beam sources according to Embodiment 2.

The particle beam sources 161 and 162 are each, for example, a fast atom beam (FAB) source and each include a discharge chamber 1601 and electrodes 1602 arranged in the discharge chamber 1601 and include a beam source driver 1603 and a gas feeder 1604 to feed argon gas into the discharge chambers 1601, as illustrated in FIG. 16. In a peripheral wall of each of the discharge chambers 1601, FAB radiation ports 1601a for emitting neutral atoms are formed. The discharge chambers 1601 are formed of a carbon material. In this configuration, each of the discharge chambers 1601 is formed in a long box shape, and a plurality of FAB radiation ports 1601a is arranged side by side in a straight line in the longitudinal direction of the discharge chamber 1601. The beam source driver 1603 includes a plasma generator (not illustrated) to generate plasma of argon gas in each of the discharge chambers 1601 and a DC power source (not illustrated) to apply DC voltage between the electrodes 1602 and the peripheral wall of each of the discharge chambers 1601. The beam source driver 1603, while generating plasma of argon gas in each of the discharge chambers 1601, applies DC voltage between the peripheral wall and the electrodes 1602 in each of the discharge chambers 1601. On this occasion, argon ions in the plasma are attracted to the peripheral wall of each of the discharge chambers 1601. On this occasion, argon ions moving to the FAB radiation ports 1601a receive electrons from the peripheral wall of outer peripheral portions of the FAB radiation ports 1601a on each of the discharge chambers 1601 formed of a carbon material when the argon ions pass through the FAB radiation ports 1601a. The argon ions are converted to electrically neutralized argon atoms and are discharged to the outside of each of the discharge chambers 1601. As illustrated by arrows AR21, particle beams of argon atoms are radiated on the bonding surfaces of substrates W1 and W2.

Figure 17:
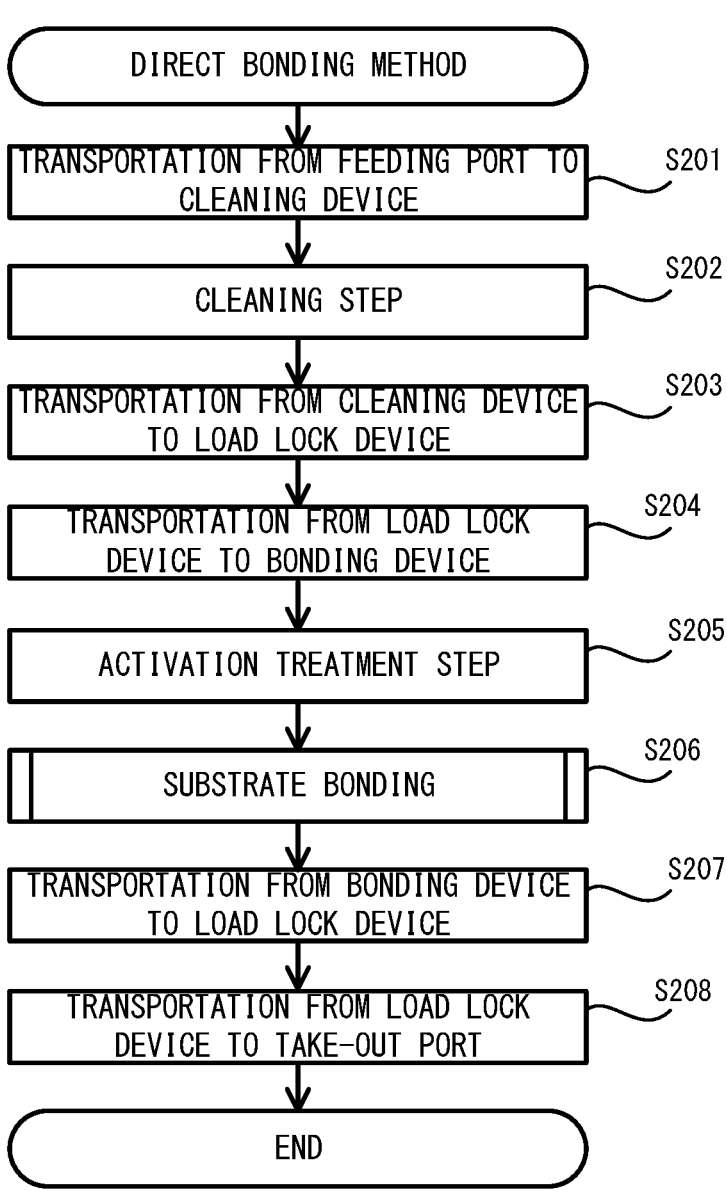
FIG. 17 is a flowchart illustrating a flow of a direct bonding method according to Embodiment 2.

Next, a so-called direct bonding method that uses the substrate bonding system according to the present embodiment and in which the substrates W1 and W2 are bonded to each other by directly bonding molecules constituting the substrates W1 and W2 without involving OH groups or the like at a comparatively high degree of vacuum is described, referring to FIG. 17. First, the first transportation device 82 takes out the substrates W1 and W2 that are arranged in the feeding port 811 or 812 and transports the substrates W1 and W2 to the cleaning device 3 (step S201). Next, the cleaning device 3 performs an aqueous cleaning step of cleaning the substrate W1 or W2 with water (step S202). The processing in step S202 is the same as the processing in step S104 that was described in Embodiment 1. When the aqueous cleaning processing is finished, the cleaning device 3 opens a carrying in/out port for the substrate W1 or W2.

Succeedingly, the first transportation device 82 transports the substrate W1 or W2 for which the aqueous cleaning step is finished from the cleaning device 3 to the load lock device 83 (step S203). In this step, a transportation robot 821 of the first transportation device 82, while the carrying in/out port for the substrate W1 or W2 in the cleaning device 3 is opened, stretches an arm 821a and thereby inserts a tip portion of the arm 821a into the cleaning device 3 and receives the substrate W1 or W2 from a stage in the cleaning device 3. Next, the transportation robot 821, by contracting the arm 821a, takes the substrate W1 or W2 out of the cleaning device 3. Succeedingly, when a gate driver 834 of the load lock device 83 opens a gate 833a on the first transportation device 82 side of a waiting chamber 831, the transportation robot 821, while holding the substrate W1 or W2, turns in such a way that the tip portion of the arm 821a points to the load lock device 83 side. Subsequently, the transportation robot 821, by stretching the arm 821a, inserts the tip portion of the arm 821a into the waiting chamber 831. Then, the substrate W1 or W2 is transferred from the tip portion of the arm 821a into the waiting chamber 831. Next, when the transfer of the substrate W1 or W2 into the waiting chamber 831 is finished, the transportation robot 821 contracts the arm 821a. Then, the gate driver 834 closes the gate 833a of the waiting chamber 831.

Subsequently, the second transportation device 84 transports the substrates W1 and W2 that are arranged in the waiting chamber 831 from the load lock device 83 to the substrate bonding device 2001 (step S204). Next, an activation treatment step in which the bonding surface of each of the two substrates W1 and W2 is activated in a reduced pressure atmosphere is performed (step S205). In this step, the substrate bonding device 2001, by radiating particle beams emitted from the particle beam sources 161 and 162 on the bonding surfaces of the substrates W1 and W2 as illustrated by the arrows AR21 in FIG. 16, performs the activation treatment on the bonding surfaces of the substrates W1 and W2.

Figure 18:
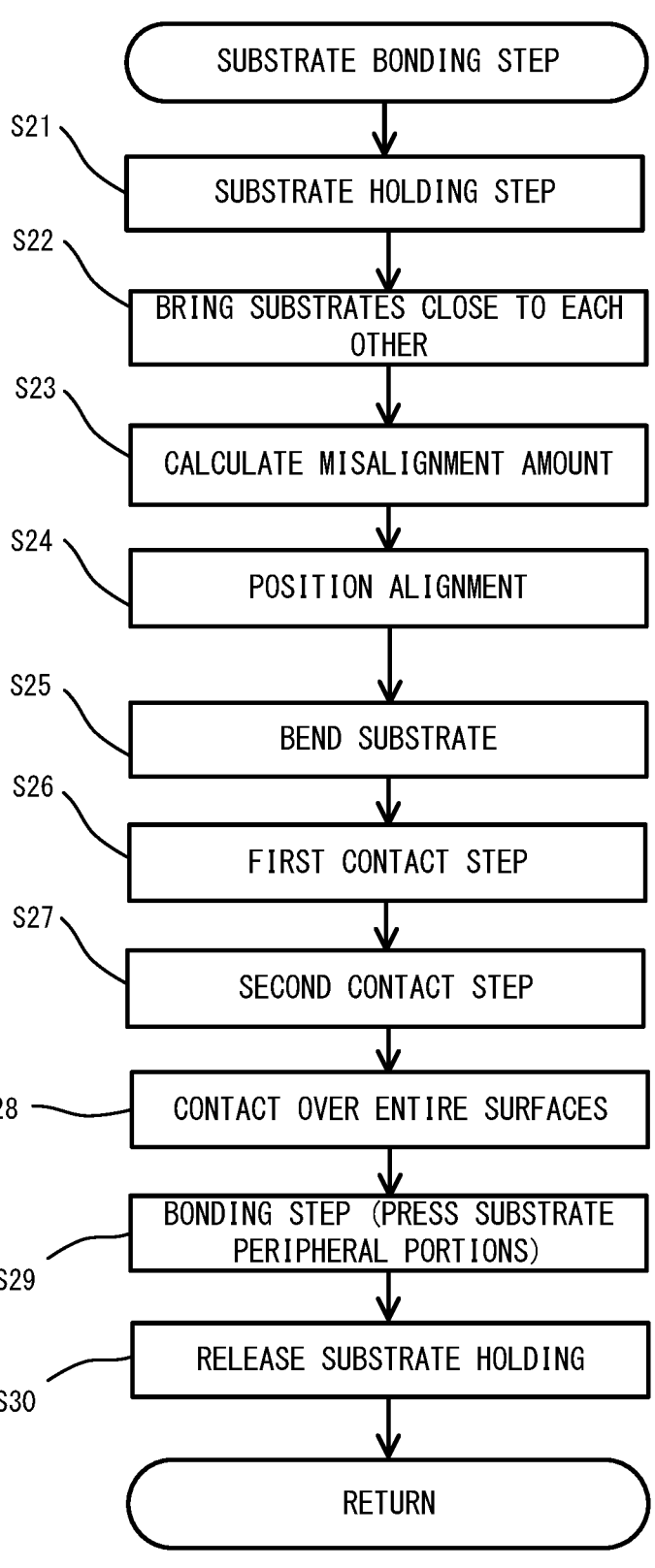
FIG. 18 is a flowchart illustrating a flow of a substrate bonding step that the substrate bonding device according to Embodiment 2 performs.

Returning to FIG. 17, subsequently, a substrate bonding step of bonding the substrates W1 and W2 to each other is performed (step S206). Details of the substrate bonding step is described below, referring to FIG. 18. First, the substrate bonding device 2001 performs a series of steps from step S21 to step S25. The series of steps from step S21 to step S25 is the same as the series of steps from step S1 to step S25 that was described in Embodiment 1, using FIG. 9. Next, the substrate bonding device 2001 performs a first contact step of bringing a central portion W1c of the substrate W1 and a central portion W2c of the substrate W2 into contact with each other (step S26). In this step, the substrate bonding device 2001 bends the substrates W1 and W2 while the substrates W1 and W2 are brought close to each other in such a way that a gap between the substrates W1 and W2 becomes approximately 10 μm in step S5 and brings the substrates W1 and W2 into contact with each other.

In the present embodiment, dangling bonds that serve as bonds and are formed by bonds between molecules of material itself of the substrates W1 and W2 being disconnected due to impurities that have adhered to the bonding surfaces of the substrates W1 and W2 being etched by particle beams are exposed on the bonding surfaces of the substrates W1 and W2. Therefore, in a first contact step in step S26 and a second contact step in step S27 in FIG. 18, a bonding wave spreads to peripheral portions of the substrates W1 and W2 by van der Waals force or ionic bonding force acting between dangling bonds having appeared on the bonding surface of each of the substrates W1 and W2 even without the substrates W1 and W2 being pressed against each other from the outside in a direction in which the substrates W1 and W2 come close to each other.

Succeedingly, the substrate bonding device 2001 performs a series of steps from step S27 to step S30. Step S27 is the same as the step in step S7 that was described in Embodiment 1, using FIG. 9, and the series of steps from step S28 to step S30 is the same as the series of steps from step S13 to step S15 that was described in Embodiment 1, using FIG. 9.

Returning to FIG. 17, next, the second transportation device 84 transports the substrates W1 and W2 bonded to each other from the substrate bonding device 2001 to the load lock device 83 (step S207). Succeedingly, the first transportation device 84 transports the substrates W1 and W2 bonded to each other from the load lock device 83 to the take-out port 813 (step S208). The processing in steps S207 and S208 is the same as the processing in steps S108 and S109 that was described in Embodiment 1.

As described in the foregoing, according to the bonding method according to the present embodiment, in the substrate bonding step, as with Embodiment 1, after bringing the central portion W1c of the substrate W1 and the central portion W2c of the substrate W2 into contact with each other while the substrate W1 is bent in such a manner that the central portion W1c of the substrate W1 protrudes toward the substrate W2 with respect to the peripheral portion of the substrate W1, a contact area between the substrates W1 and W2 is enlarged from the central portions W1c and W2c toward the peripheral portions W1s and W2s of the substrates W1 and W2. The substrates W1 and W2 are bonded to each other by relatively pressing only the peripheral portion W1s of the substrate W1 against the peripheral portion W2s of the substrate W2 while the substrates W1 and W2 are in contact with each other over the entire bonding surfaces. Through this processing, enlarging the contact area between the substrates W1 and W2 from the central portions W1c and W2c toward the peripheral portions W1s and W2s enables the peripheral portions W1s and W2s of the substrates W1 and W2 to be brought into contact with each other without a gap even when the substrates W1 and W2 are brought into a state in which the peripheral portion W2s of the substrate W2 is lifted from the peripheral portion W1s of the substrate W1. Therefore, occurrence of a void due to a gap being generated between the peripheral portions W1s and W2s of the substrates W1 and W2 and reduction in bonding strength between the substrates W1 and W2 are prevented.

When a gap is generated between the peripheral portions W1s and W2s of the substrates W1 and W2, bonding strength between the substrates W1 and W2 is reduced or a void occurs between the peripheral portions W1s and W2s of the substrates W1 and W2. In contrast, in the substrate bonding step according to the present embodiment, as with Embodiment 1, there is an advantage that, by causing the peripheral portions of the substrates W1 and W2 to closely adhere to each other through pressing the peripheral portions W1s and W2s of the substrates W1 and W2 against each other while the peripheral portions W1s and W2s of the substrates W1 and W2 are in contact with each other and eliminating so-called floating, bonding strength between the substrates W1 and W2 is improved.

In addition, in the direct bonding method according to the present embodiment, as described afore, after an activation treatment step is performed in a super-high vacuum environment that has a degree of vacuum of $10^{-5}$ Pa or less and in which molecules scarcely exist by means of a particle beam, such as an atom beam and an ion beam, plasma exposure, or the like, the substrates W1 and W2 are bonded to each other by bringing the bonding surfaces of the substrates W1 and W2 into contact with each other while dangling bonds exist on the bonding surfaces of the substrates W1 and W2. In contrast, in the present embodiment, the bonding step is performed immediately after the activation treatment step in the same chamber 120 in the substrate bonding device 2001. Since this configuration enables other molecules to be prevented from adsorbing to dangling bonds having appeared on the bonding surfaces of the substrates W1 and W2, the substrates W1 and W2 can be firmly bonded to each other.

Figure 19:
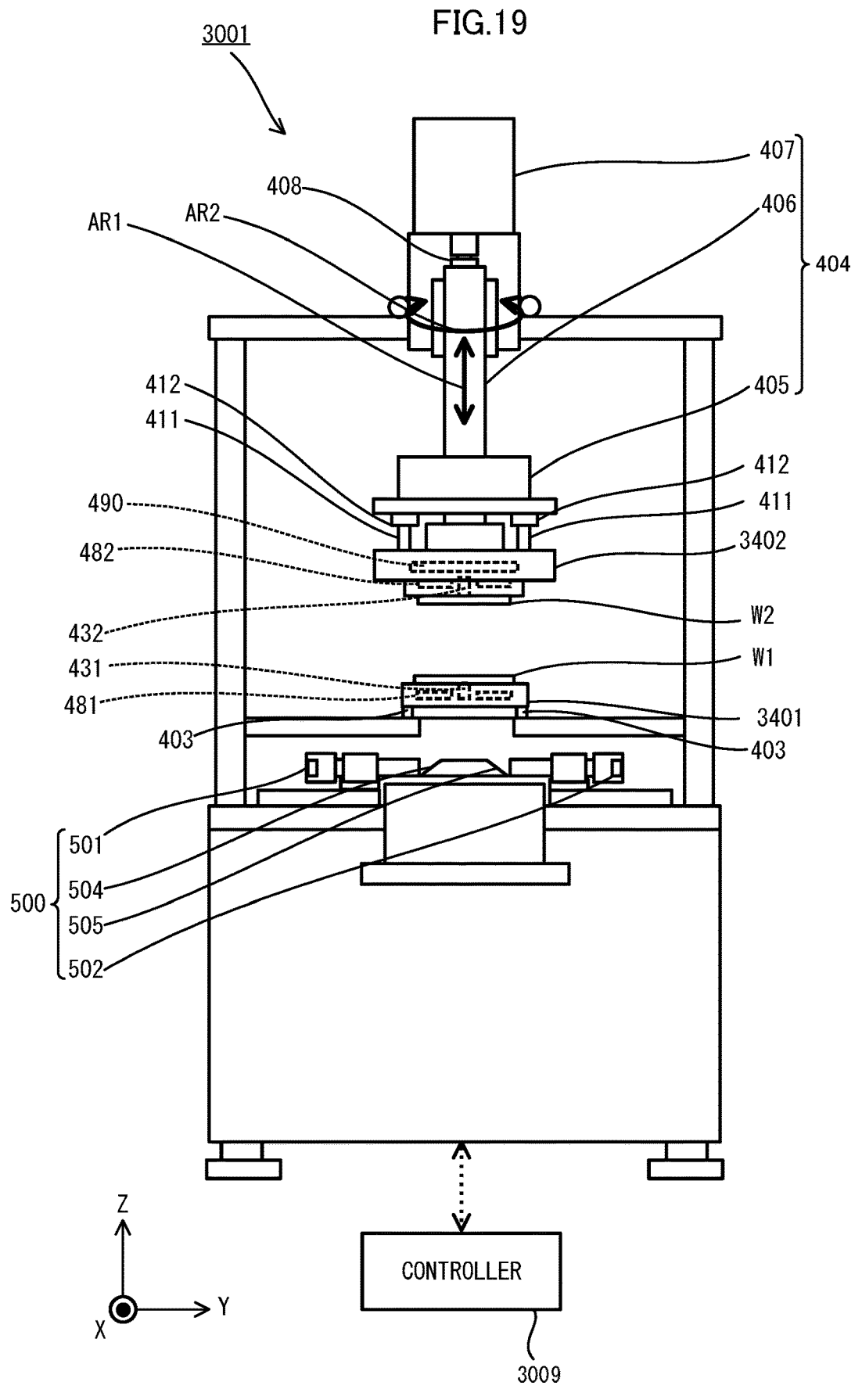
FIG. 19 is a schematic front view of a substrate bonding device according to a variation.

Although the embodiments of the present disclosure were described above, the present disclosure is not limited to the configuration of the aforementioned embodiments. For example, as illustrated in FIG. 19, a substrate bonding device 3001 may be a substrate bonding device that does not include a chamber and bonds two substrates W1 and W2 to each other by bringing the two substrates W1 and W2 the bonding surfaces of which, which are to be bonded to each other, have been subjected to hydrophilic treatment into contact with each other and pressing the two substrates W1 and W2 against each other under atmospheric pressure. Note that, in FIG. 19, the same constituent components as those in Embodiment 1 are provided with the same reference signs as those in FIG. 3.

Figure 20A:
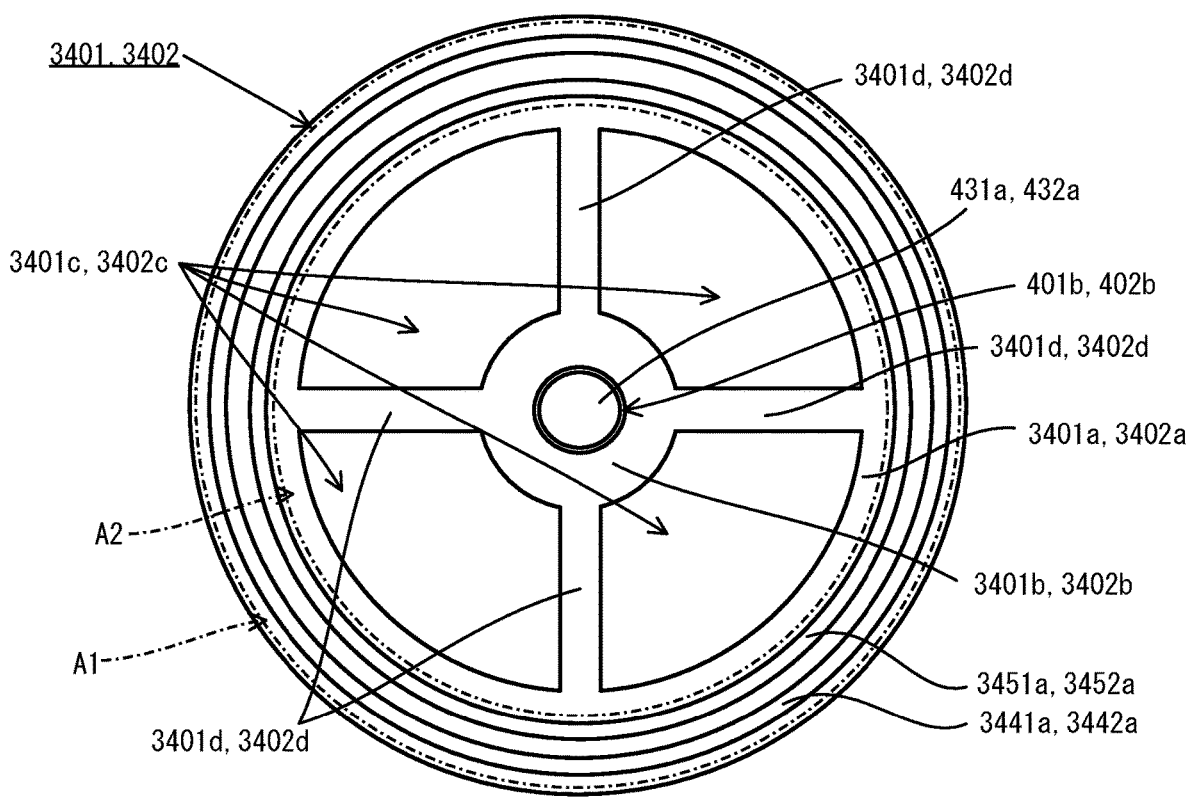
FIG. 20A is a schematic plan view of a stage and a head according to the variation.
Figure 20B:
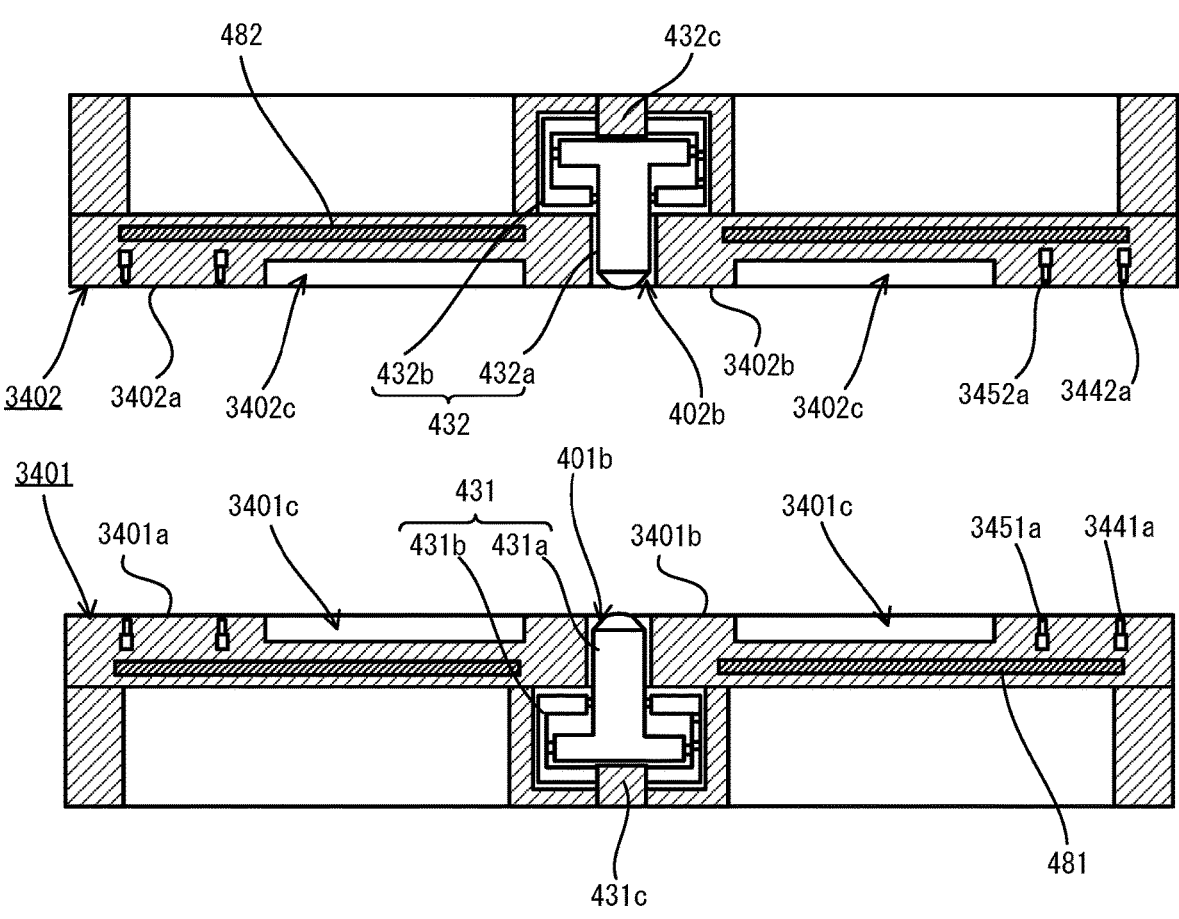
FIG. 20B is a schematic cross-sectional view of the stage and the head according to the variation.

Stages 3401 and 3402 are arranged to face each other in the vertical direction. The stage 3401 and the head 3402 are formed of a translucent material, such as glass having translucency. In addition, on the stage 3401 and the head 3402, suction holes 3441a and 3451a and suction holes 3442a and 3452a are arranged in first areas A1 and recessed portions 3401c and 3402c and long plate-shaped ribs 3401d and 3402d are disposed in second areas A2, respectively, as illustrated in FIGS. 20A and 20B. The suction holes 3441a and 3451a can be individually switched between a state of sucking and holding a substrate W1 or a state of not sucking and holding the substrate W1. The suction holes 3442a and 3452a can also be individually switched between a state of sucking and holding a substrate W2 and a state of not sucking and holding the substrate W2. Each of the suction holes 3441a, 3451a, 3442a, and 3452a is connected to, for example, a vacuum pump (not illustrated) via an individual exhaust pipe (not illustrated). In addition, in the stage 3401 and the head 3402, a first pressing mechanism 431 that presses a central portion of the substrate W1 and a second pressing mechanism 432 that presses a central portion of the substrate W2 are disposed, respectively.

In addition, the substrate bonding device according to the present embodiment includes opening/closing valves (not illustrated) each of which is interposed in one of exhaust pipes connected to the suction holes 3441a, 3451a, 3442a, and 3452a and that individually open and close the exhaust pipes and a holder driver (not illustrated) that, by changing open/closed states of the opening/closing valves, switches states of the suction holes 3441a, 3451a, 3442a, and 3452a between a state of holding the substrates W1 and W2 and a state of not holding the substrates W1 and W2. The holder driver changes the open/closed state of each opening/closing valve, based on a control signal input from a controller 3009.

Returning to FIG. 19, a controller 3009 has a similar configuration to the configuration of the controller 9 described in Embodiment 1. The controller 3009, as with the controller 9, converts measurement signals that are input from first pressure sensors 412, a second pressure sensor 408, and a distance measurer 490 to measurement information and acquires the measurement information. The controller 3009 also converts captured image signals that are input from a first imager 501 and a second imager 502 to captured image information and acquires the captured image information. Further, the controller 3009, by reading programs stored in an auxiliary storage into a main storage and executing the programs, outputs a control signal to each of the holder driver, piezo-actuators 411, a first pressing driver 431b, a second pressing driver 432b, a heater driver, a stage driver 403, and a head driver 404.

Next, a bonding method that the substrate bonding device according to the present embodiment performs is described. Since the substrate bonding step according to the present embodiment is similar to the bonding method that was described in Embodiment 1, using FIG. 9, the description is made referring to FIG. 9. In addition, in the bonding method according to the present variation, a hydrophilization step of hydrophilizing the bonding surfaces of the substrates W1 and W2 may be performed before the first contact step in the aforementioned step S6, as described in the embodiment. In the bonding method according to the present variation, a series of steps from step S1 to step S9 illustrated in FIG. 9 is first performed. The substrate bonding device 3001 bends the substrates W1 and W2 while the substrates W1 and W2 are brought close to each other in such a manner that a gap between the substrates W1 and W2 becomes approximately several hundred μm, in step S5 in FIG. 9. It is assumed that, by the substrate bonding device 3001, all of calculated misalignment amounts Δx, Δy, and Δθ are determined to be less than or equal to preset misalignment amount threshold values Δxth, Δyth, and Δθth, respectively (step S9: Yes). In this case, the substrate bonding device 3001 further enlarges the contact area between the substrates W1 and W2 from central portions W1*c* and W2*c* toward peripheral portions W1*s* and W2*s* of the substrates W1 and W2 and brings the substrates W1 and W2 into contact with each other over the entire bonding surfaces (step S13). Next, the substrate bonding device 1 performs the bonding step of bonding the substrates W1 and W2 to each other by pressing the peripheral portions W1*s* and W2*s* of the substrates W1 and W2 against each other through pressing only the peripheral portion W1*s* of the substrate W1 against the peripheral portion W2*s* of the substrate W2 while the substrates W1 and W2 are in contact with each other over the entire bonding surfaces (step S14). Succeedingly, the substrate bonding device 3001 releases holding of the substrate W2 by suspending sucking and holding by the suction holes 3442A and 3452*a* of the head 3402 (step S15). Subsequently, the substrate bonding device 3001 separates the head 3402 from the substrate W2 by causing the head 3402 to ascend.

Since, according to the present configuration, drawing-in of gas between the peripheral portions of the substrates W1 and W2 can be prevented when the substrates W1 and W2 are bonded to each other under atmospheric pressure, occurrence of a void between the peripheral portions of the substrates W1 and W2 that are bonded to each other can be prevented.

Note that, in the present variation, there is a risk that some of the suction holes 3441*a*, 3442*a*, 3451*a*, and 3452*a* communicate with the recessed portion 3401*c* or 3402*c* while the stage 3401 and the head 3402 hold the substrates W1 and W2, respectively, and internal pressure of the recessed portion 3401*c* or 3402*c* is reduced. In addition, there is a risk that when through-holes 401*b* and 402*b* inside the second areas A2 on the stage 3401 and the head 3402 communicate with the insides of the recessed portions 3401*c* and 3402*c*, gas flows into the insides of the recessed portions 3401*c* and 3402*c* through the through-holes 401*b* and 402*b* and the internal pressure of the recessed portions 3401*c* and 3402*c* rises, respectively. Thus, in the stage 3401 and the head 3402, communication holes for atmosphere release (not illustrated) that communicate with the insides of the recessed portions 3401*c* and 3402*c* are preferably formed, respectively.

Figure 21A:
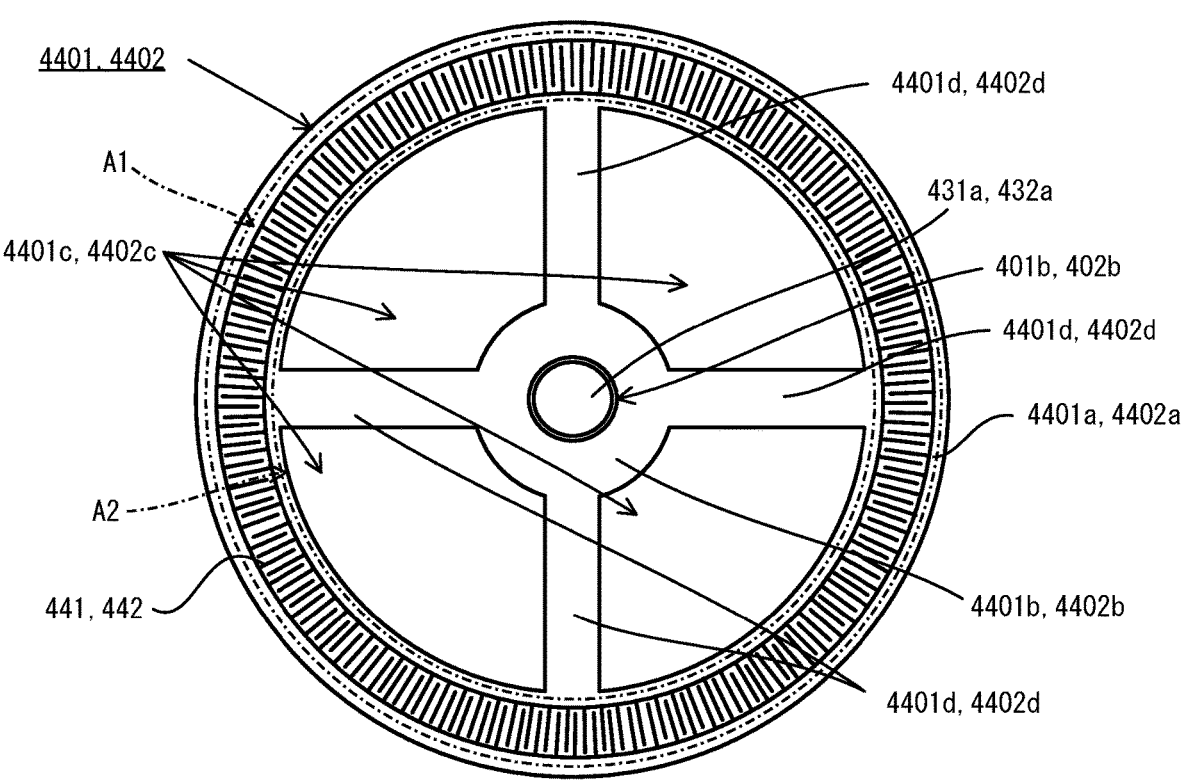
FIG. 21A is a schematic plan view of a stage and a head according to another variation.
Figure 21B:
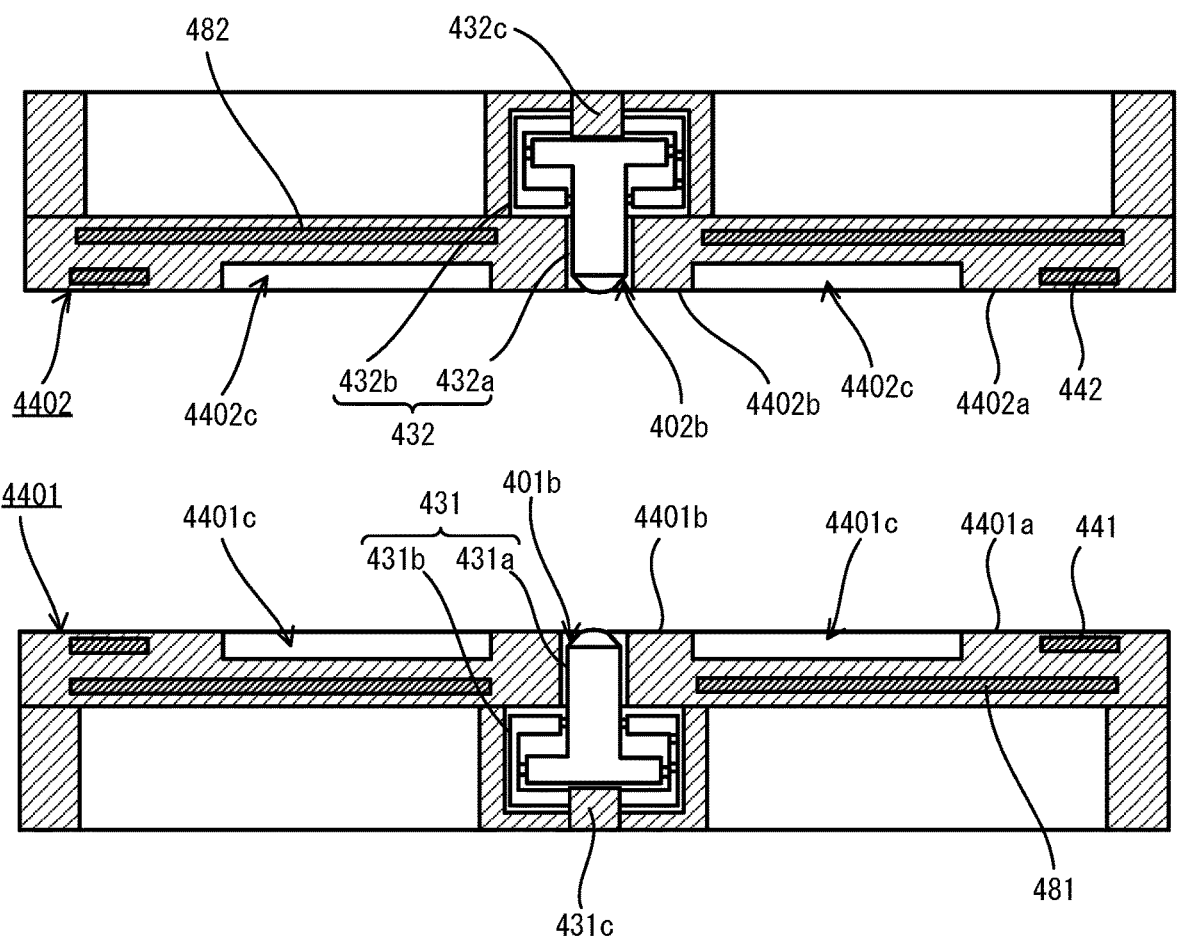
FIG. 21B is a schematic cross-sectional view of the stage and the head according to the another variation.

The substrate bonding device 1 according to Embodiment 1 may be a substrate bonding device that includes a stage 4401 and a head 4402 as illustrated in, for example, FIGS. 21A and 21B. The stage 4401 and the head 4402 are arranged in such a way as to face each other in the vertical direction in the chamber 120. The stage 4401 and the head 4402 have recessed portions 4401*c* and 4402*c* that are formed in second areas A2 located on the inner side of first areas A1, respectively, as illustrated in FIG. 21A. The first areas A1 are equivalent to areas on the stage 4401 and the head 4402 that face the peripheral portions of substrates W1 and W2 while the substrates W1 and W2 are supported by the stage 4401 and the head 4402, respectively. The stage 4401 and the head 4402 have four ribs 4401*d* and four ribs 4402*d* that extend from central portions of the recessed portions 4401*c* and 4402*c* to the peripheries of the recessed portions 4401*c* and 4402*c* and come into contact with the substrates W1 and W2, respectively. The four ribs 4401*d* and the four ribs 4402*d* extend from the central portions of the recessed portions 4401*c* and 4402*c* in a radial manner.

Peripheral portions 4401*a* and 4402*a* of the stage 4401 and the head 4402, inner side parts 4401*b* and 4402*b* that are equivalent to outer peripheral portions of the through-holes 401*b* and 402*b* inside the second areas A2 on the stage 4401 and the head 4402, and the ribs 4401*d* and 4402*d* support the substrates W1 and W2, respectively.

According to the present configuration, the stage 4401 and the head 4402 have four ribs 4401*d* and four ribs 4402*d* that extend from central portions of the recessed portions 4401*c* and 4402*c* formed in the second area A2 on the stage 4401 and the head 4402 to the peripheries of the recessed portions 4401*c* and 4402*c* and come into contact with the substrates W1 and W2, respectively. Since, because of this configuration, the substrates W1 and W2 can be supported by the four ribs 4401*d* and the four ribs 4402*d*, respectively, it is possible to prevent bending of the substrates W1 and W2 while the substrates W1 and W2 are held by the stage 4401 and the head 4402.

Figure 22:
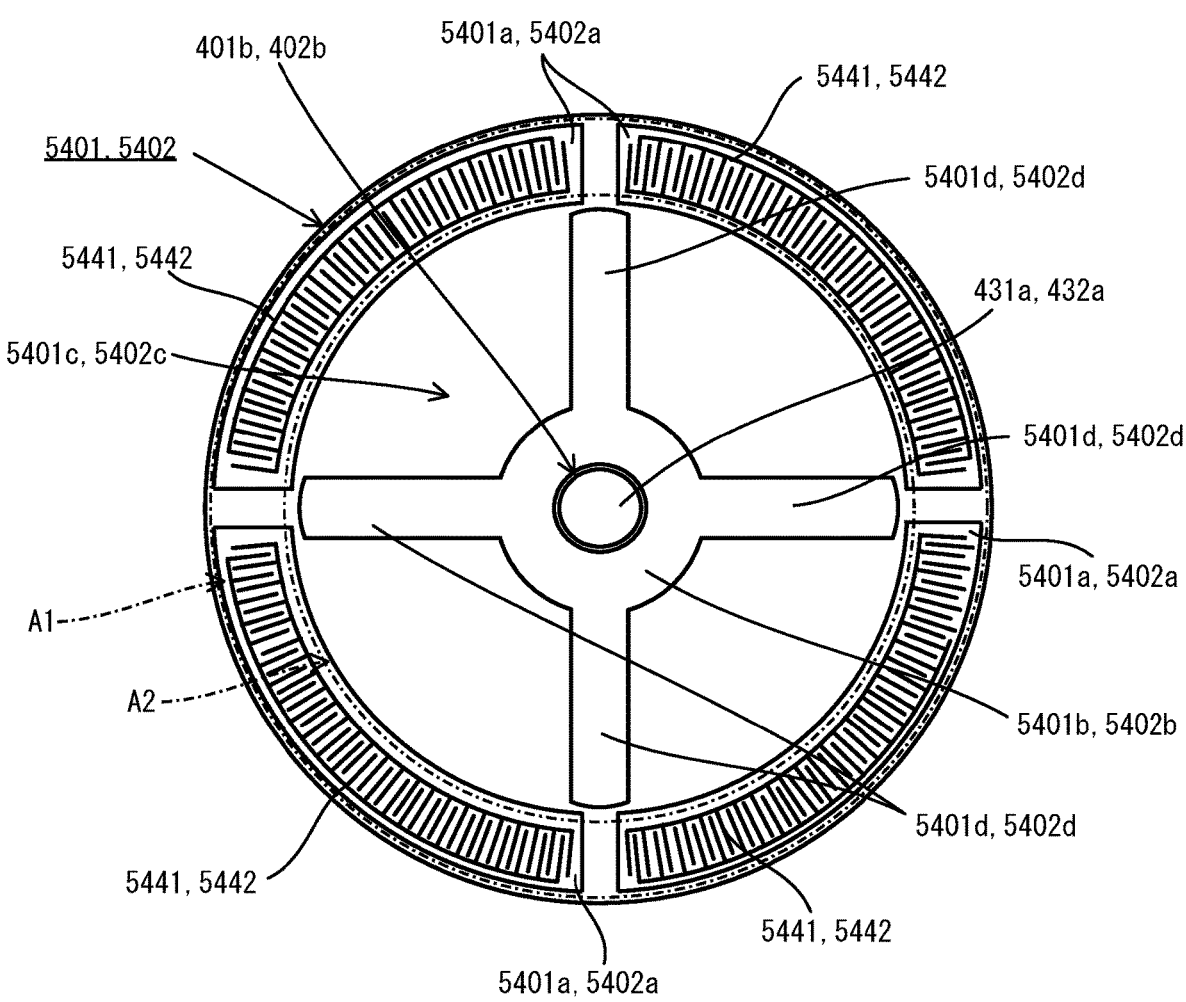
FIG. 22 is a schematic plan view of a stage and a head according to still another variation.

The substrate bonding device 1 according to Embodiment 1 may be a substrate bonding device that includes a stage 5401 and a head 5402 as illustrated in, for example, FIG. 22. Note that, in FIG. 22, the same constituent components as those in Embodiment 3 are provided with the same reference signs as those in FIG. 5A. The stage 5401 and the head 5402 have four circular-arc-shaped first protruding portions 5401*a* and four circular-arc-shaped first protruding portions 5402*a* that are arranged along annular first area A1 and four long plate-shaped ribs 5401*d* and four long plate-shaped ribs 5402*d* that are disposed in the interiors of recessed portions 5401*c* and 5402*c* that are formed in second area A2 located on the inner side of the first area A1, respectively. On the first protruding portions 5401*a* and 5402*a*, electrostatic chucks 5441 and 5442 are arranged, respectively. The stage 5401 and the head 5402 also have, on the outer peripheries of through-holes 401*b* and 402*b* thereof, annular second protruding portions 5401*b* and 5402*b* from which one end portions on the through-holes 401*b* side and the through-hole 402*b* side in the longitudinal directions of the four ribs 5401*d* and the four ribs 5402*d* continue, respectively. At spaces between the other end portions in the longitudinal directions of the four ribs 5401*d* and the four ribs 5402*d* and the first protruding portions 5401*a* and 5402*a*, gaps are formed, respectively. Heights of the first protruding portions 5401*a* and 5402*a*, the ribs 5401*d* and 5402*d*, and the second protruding portions 5401*b* and 5402*b* in the thickness direction of the stage 5401 and the head 5402 are configured to be equal to one another, respectively. When the stage 5401 and the head 5402 are caused to support substrates W1 and W2 while a first pressing rod 431*a* and a second pressing rod 432*a* are caused to retract into the stage 5401 and the head 5402, this configuration causes the first protruding portions 5401*a* and 5402*a*, the ribs 5401*d* and 5402*d*, and the second protruding portions 5401*b* and 5402*b* to come into contact with the substrates W1 and W2, respectively.

According to the present configuration, since a contact area between the substrates W1 and W2 and the first protruding portions 5401*a* and 5402*a* in the first area A1 being small enables stress exerted on the substrates W1 and W2 while the substrates W1 and W2 are held to be reduced accordingly, distortions generated in the substrates W1 and W2 can be reduced, respectively.

Figure 23:
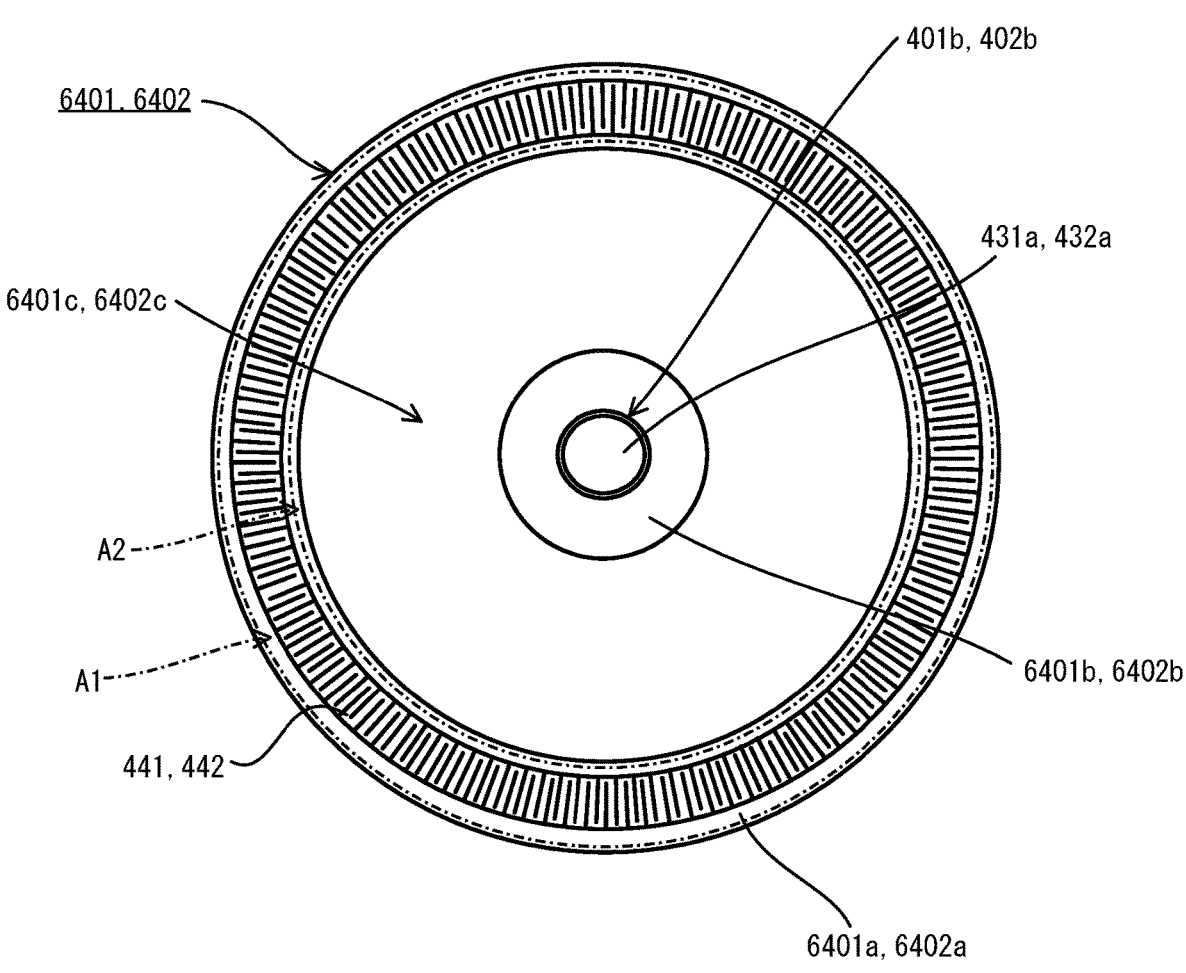
FIG. 23 is a schematic plan view of a stage and a head according to still another variation.

In the embodiment, an example in which the electrostatic chucks 441 and 442 are arranged in the first areas A1 on the stage 401 and the head 402, respectively, was described. However, without being limited to the example, the substrate bonding device according to the present disclosure may be a substrate bonding device in which, in second areas A2 on a stage 6401 and a head 6402, annular recessed portions 6401*c* and 6402*c* are disposed, respectively, and no electrostatic chuck is arranged, as illustrated in FIG. 23. Note that, in FIG. 23, the same constituent components as those in Embodiment 1 are provided with the same reference signs as those in FIG. 5A. The stage 6401 and the head 6402 have peripheral portions 6401*a* and 6402*a* including first areas A1 and inner side parts 6401*b* and 6402*b* that are equivalent to outer peripheral portions of through-holes 401*b* and 402*b* inside the second areas A2, respectively. In this case, when the stage 6401 and the head 6402 are caused to support substrates W1 and W2 while a first pressing rod 431*a* and a second pressing rod 432*a* are caused to retract into the stage 6401 and the head 6402, the peripheral portions 6401*a* and 6402*a* and the inner side parts 6401*b* and 6402*b* come into contact with the substrates W1 and W2, respectively.

According to the present configuration, since the substrates W1 and W2 can be supported by the central portions of the stage 6401 and the head 6402, respectively, bending of the substrates W1 and W2 can be reduced.

In each embodiment, by adjusting the position of the stopper 431*c* of the first pressing mechanism 431 or the stopper 432*c* of the second pressing mechanism 432 and thereby adjusting the positions of tip portions of the first pressing rod 431*a* and the second pressing rod 432*a* before pressing by the first pressing rod 431*a* and the second pressing rod 432*a*, the first pressing rod 431*a* and the second pressing rod 432*a* may be configured to support single points in the central portions W1*c* and W2*c* of the substrates W1 and W2, respectively. In addition, the first pressing mechanism 431 or the second pressing mechanism 432 may be a pressing mechanism that does not have the stopper 431*c* or 432*c* and in which the first pressing driver 431*b* or the second pressing driver 432*b* is capable of adjusting the position of the tip portion of the first pressing rod 431*a* or the second pressing rod 432*a*.

Figure 24A:
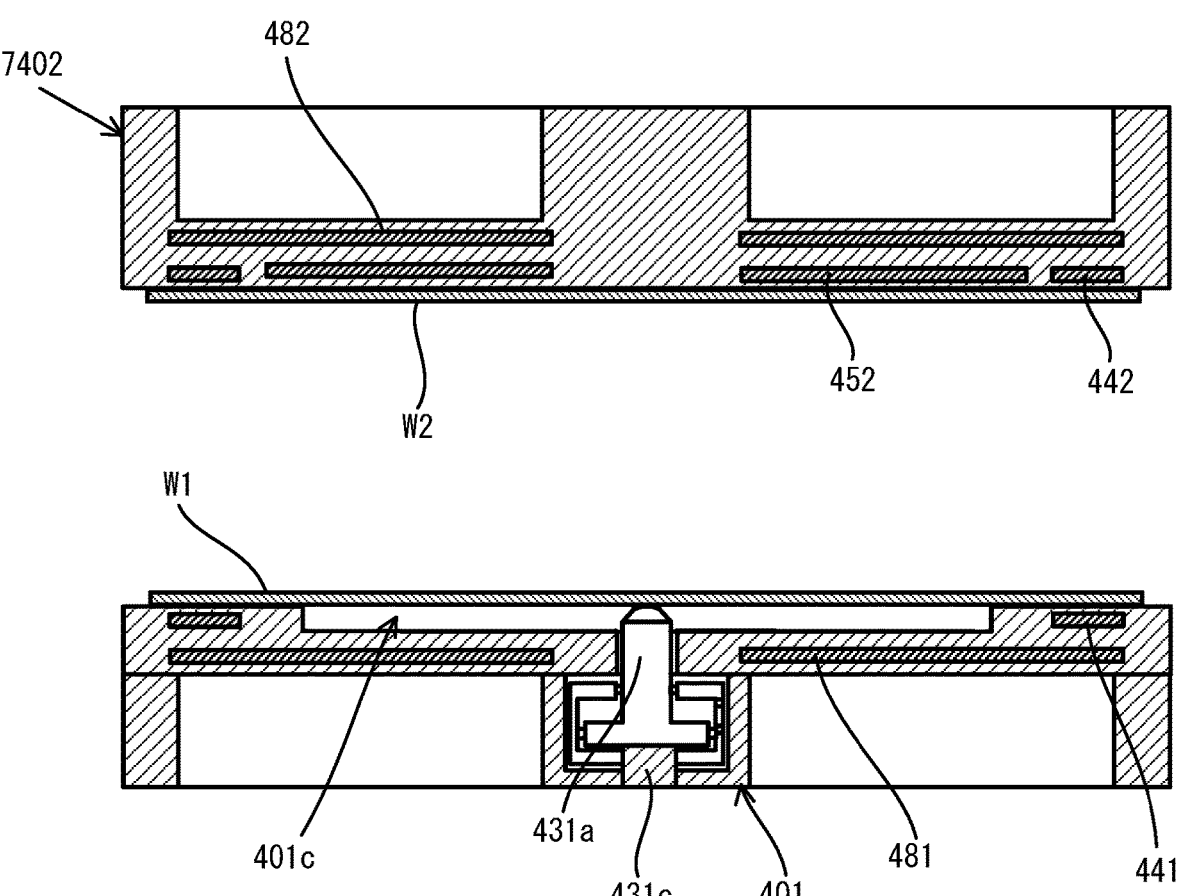
FIG. 24A is a schematic cross-sectional view of a stage and a head according to still another variation.
Figure 24B:
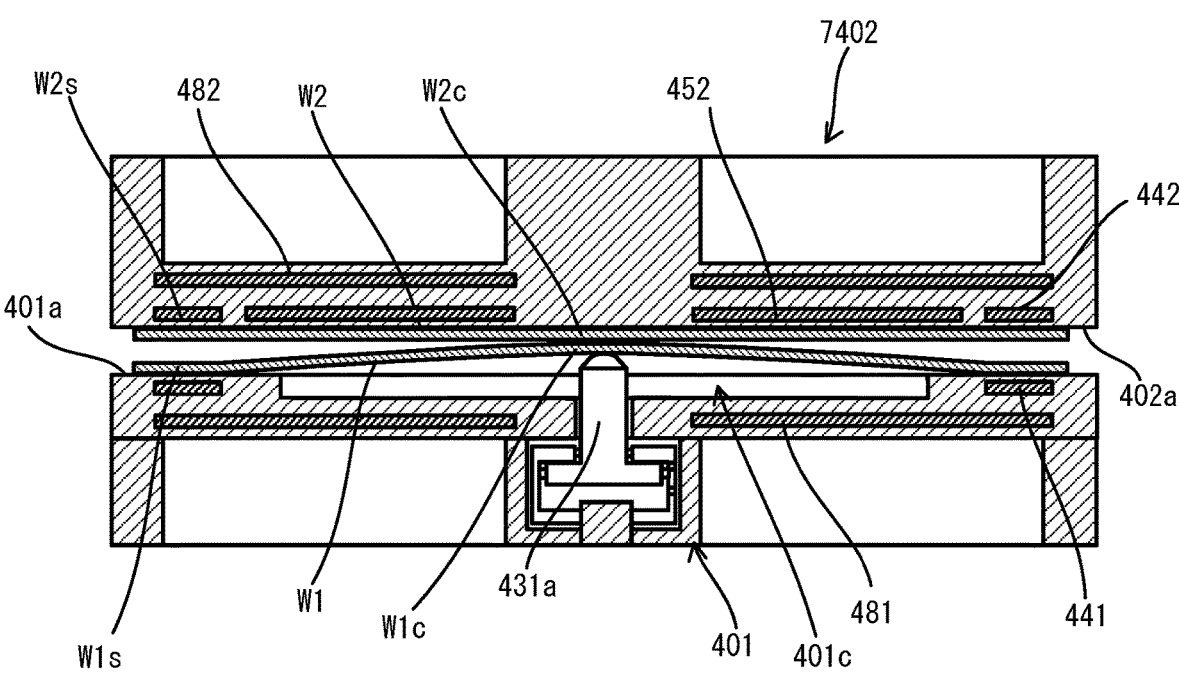
FIG. 24B is a schematic cross-sectional view illustrating a state in which central portions of substrate bonding surfaces held by the stage and the head according to the still another variation are brought into contact with each other.

Although, in each embodiment, an example in which both substrates W1 and W2 are bent was described, the present disclosure is not limited to the example and it may be configured such that, for example, only one of the substrates W1 and W2 is bent. For example, the substrate bonding device may be a substrate bonding device that includes a stage 401 and a head 7402 as illustrated in FIG. 24A. In this configuration, the stage 401 includes a first pressing rod 431*a* and has a recessed portion 401*c* disposed, and the head 7402 neither includes a pressing rod nor has a recessed portion disposed. In other words, a first pressing mechanism 431 is disposed only in the stage 401 and no pressing mechanism is disposed in the head or 7402. The head 7402 has a flat surface on a side that holds the substrate W2 and has an electrostatic chuck 442 arranged in a third area that faces a peripheral portion of the substrate W2 while the head 7402 holds the substrate W2. In addition, an electrostatic chuck 452 is arranged in a fourth area located on the inner side of the aforementioned third area on the head 7402. In this case, the substrate bonding device is capable of causing the substrate W1 to bend in such a manner that a central portion W1*c* of the substrate W1 protrudes toward the substrate W2 with respect to a peripheral portion W1*s* of the substrate W1, as illustrated in, for example, FIG. 24B. The substrate bonding device is only required to bring the central portion W1*c* of the substrate W1 into contact with a central portion W2*c* of the substrate W2. Alternatively, the substrate bonding device may be a substrate bonding device that includes a head 402 including a second pressing rod 432*a* and having a recessed portion 402*c* disposed and a stage having neither a pressing rod nor a recessed portion disposed. In other words, the substrate bonding device according to the present disclosure may be a substrate bonding device in which a second pressing mechanism 432 is disposed only in the head 402 and no pressing mechanism is disposed in the stage. In this case, only the substrate W2 can be bent. Note that the substrate bonding devices described in the aforementioned variations may be substrate bonding devices in which first pressing mechanisms 431 are disposed only in the stages 3401 and 4401 and no pressing mechanism is disposed in the heads 3402 and 4402. Alternatively, the substrate bonding devices described in the aforementioned variations may be substrate bonding devices in which second pressing mechanisms 432 are disposed only in the heads 3402 and 4402 and no pressing mechanism is disposed in the stages 3401 and 4401.

According to the present configuration, there is an advantage that since a placement surface of one of the stage 401, 3401, or 4401 and the head 402, 3402, or 4402 on which the substrate W1 or W2 is placed is formed flat and the substrate W1 or W2 that is held by the one the placement surface of which is flat is thus held without bending, precision of alignment between the substrates W1 and W2 is improved.

For example, when the substrate bonding device according to the present disclosure has a configuration in which the substrate W2 is bent by pressing the central portion W2*c* of the substrate W2 on the head, the head is required to hold the substrate W2 by a portion of the head facing the peripheral portion of the substrate W2 with holding force strong enough to be able to resist the self-weight of the substrate W2. Thus, stress applied to the substrate W2 increases and distortion is likely to be generated in the substrate W2. In contrast, in the configuration in which the head 7402 has a flat surface on the side that holds the substrate W2 and only the stage 401 that is arranged vertically directly below the head 7402 has the recessed portion 401*c*, as illustrated in FIG. 24A, only the central portion W1*c* of the substrate W1 that is arranged vertically directly below the substrate W2 is pressed vertically upward from the vertically lower side of the substrate W1. In this case, since the peripheral portion W1*s* of the substrate W1 is held on the stage 401 by self-weight, holding force of the substrate W1 by the stage 401 can be reduced. Since this configuration enables stress applied to the substrate W1 to be reduced, distortion generated in the substrate W1 can be reduced.

In addition, even when the above-described present configuration is employed, as with Embodiment 1, pressure is not applied to the central portions W1*c* and W2*c* of the substrates W1 and W2 even when the substrates W1 and W2 are pressed against each other. Because of this configuration, since, when the central portions W1*c* and W2*c* of the substrates W1 and W2 are brought into contact with each other, the aforementioned bonding wave naturally spreads, no distortion is generated in the substrates W1 and W2. Note that although distortion is generated in the peripheral portions of the substrates W1 and W2 since, after the substrates W1 and W2 are brought into contact with each other over the entire bonding surfaces, the peripheral portions W1*s* and W2*s* of the substrates W1 and W2 are pressed against each other in a direction in which the peripheral portions W1*s* and W2*s* come close to each other, it is considered that a significant problem does not occur since, in many cases, no portion serving as a basis for a semiconductor device is formed in the peripheral portions of the substrates W1 and W2.

Figure 25A:
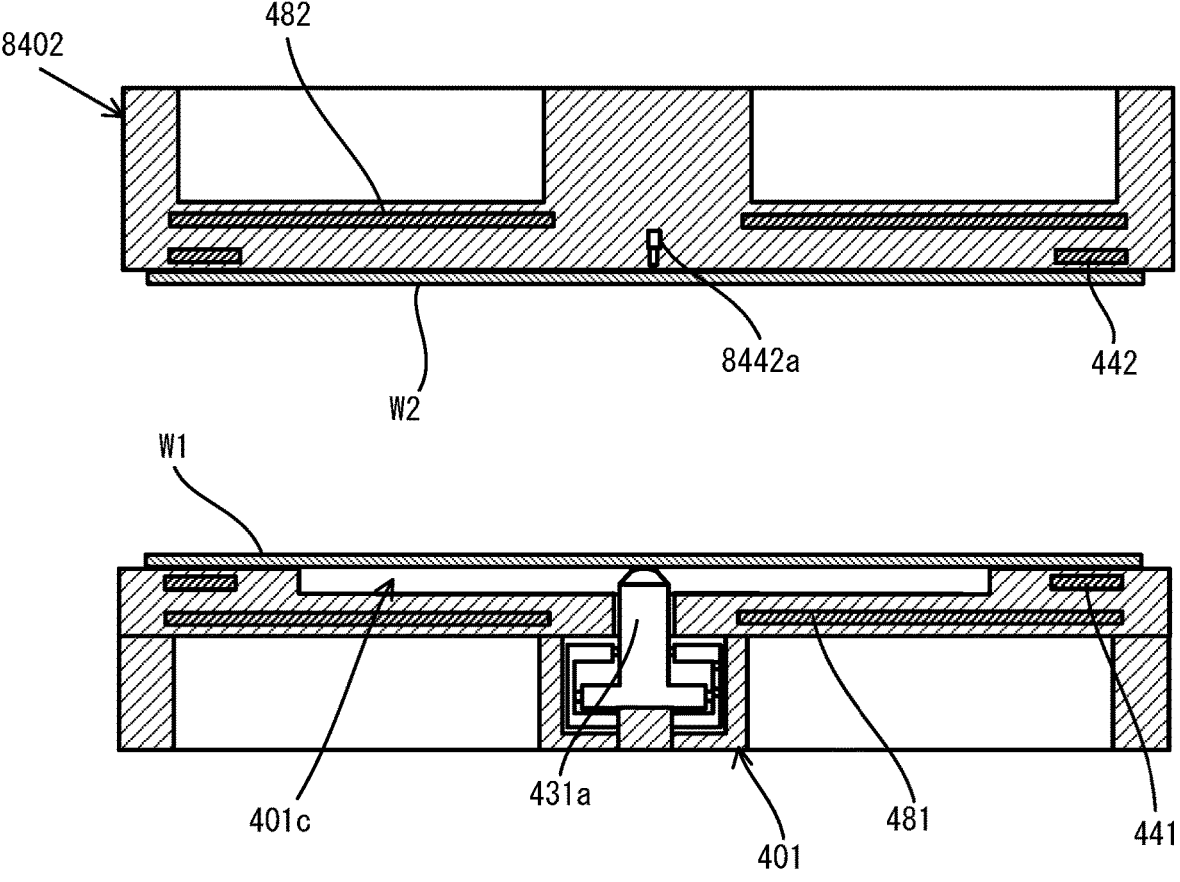
FIG. 25A is a schematic cross-sectional view of a stage and a head according to still another variation.
Figure 25B:
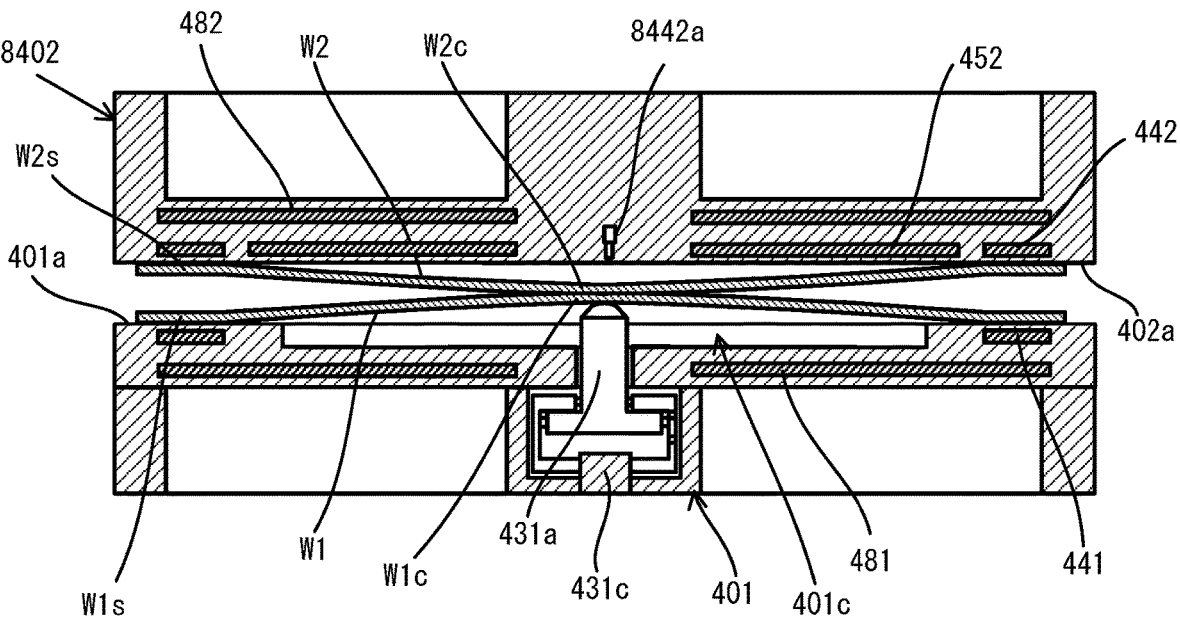
FIG. 25B is a schematic cross-sectional view illustrating a state in which central portions of substrate bonding surfaces held by the stage and the head according to the still another variation are brought into contact with each other.

In addition, the substrate bonding device according to the present disclosure may be a substrate bonding device in which a gas discharger (not illustrated) is disposed in the stage 401, 3401, or 4401 and the substrate W1 is bent by discharging gas into a space between the stage 401, 3401, or 4401 and the substrate W1 while the peripheral portion of the substrate W1 is held by the stage 401, 3401, or 4401. Alternatively, the substrate bonding device according to the present disclosure may be a substrate bonding device in which a gas discharger (not illustrated) is disposed in the head 402, 3402, or 4402 and the substrate W2 is bent by discharging gas into a space between the head 402, 3402, or 4402 and the substrate W2 while the peripheral portion of the substrate W2 is held by the head 402, 3402, or 4402. For example, the substrate bonding device according to the present disclosure may be a substrate bonding device in which a gas discharger 8442a that discharges gas onto the head 8402 is disposed in a head 8402. In this configuration, the gas discharger 8442a, by discharging gas into a space between the head 8402 and the substrate W2 while the peripheral portion of the substrate W2 is held onto the head 8402 by an electrostatic chuck 442 of the head 8402, bends the substrate W1 in such a manner that the central portion W2c of the substrate W2 protrudes toward the substrate W1 with respect to the peripheral portion W2s of the substrate W2, as illustrated in FIG. 25B. With regard to gas discharged from the gas discharger 8442a, pressure of the gas may be controlled or a flow rate or flow velocity of the gas may be controlled. The flow rate or flow velocity of the gas discharged from the gas discharger 8442a is preferably controlled in such a way that separation of the substrate W2 advances at the same speed as a spreading speed of a bonding wave that is generated when the substrates W1 and W2 are brought into contact with each other and spreads from the central portions W1c and W2c to the peripheral portions W1s and W2s of the substrates W1 and W2. For example, by controlling the flow rate of gas fed to the gas discharger 8442a, using a mass flow controller, the flow rate of the gas can be finely controlled.

When the substrates W1 and W2 are bonded to each other while only one of the substrates W1 and W2 is bent, there is a risk that a warpage occurs in the substrates W1 and W2 bonded to each other. In contrast, according to the present configuration, gas is discharged into a space between the substrate W2 and the head 8402 from the gas discharger 8442a disposed in the central portion of the head 8402 in order to separate the substrate W2 from the head 8402 after alignment between the substrates W1 and W2 is performed or after the central portions W1c and W2c of the substrates W1 and W2 are brought into contact with each other. Because of this configuration, it is possible to, while preventing distortion or warpage from occurring in the substrates W1 and W2, cause the aforementioned bonding wave to spread from the central portions W1c and W2c to the peripheral portions W1s and W2s of the substrates W1 and W2 and thereby bring the substrates W1 and W2 into contact with each other over the entire bonding surfaces.

Figure 26:
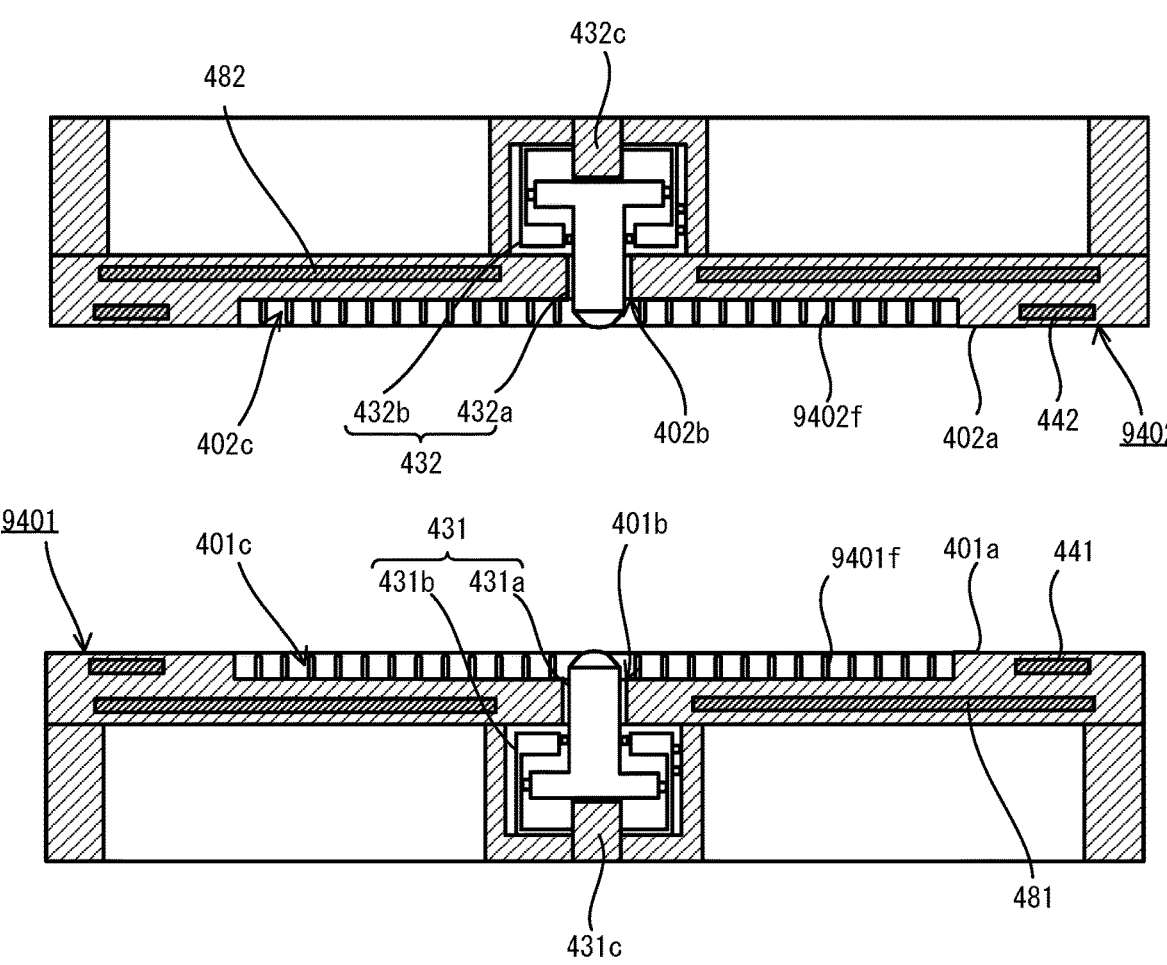
FIG. 26 is a schematic cross-sectional view of a stage and a head according to still another variation.

In Embodiment 1, the substrate bonding device may be a substrate bonding device in which a stage 9401 and a head 9402 include a plurality of protrusions 9401f and a plurality of protrusions 9402f arranged inside recessed portions 401c and 402c of the stage 9401 and the head 9402, respectively, as illustrated in, for example, FIG. 26.

In Embodiment 1, the steps from step S7 to step S12 may be omitted and the processing from step S13 onward may be directly performed after step S6.

In Embodiment 2, an example in which the substrate bonding device 2001 includes the particle beam sources 161 and 162 and irradiates the bonding surfaces of the substrates W1 and W2 with particle beams in the chamber 120 of the substrate bonding device 2001 was described. However, without being limited to the above-described example, the substrate bonding system may be a substrate bonding system that includes, separately from the substrate bonding device 2001, an activation treatment device that irradiates the bonding surfaces of the substrates W1 and W2 with particle beams and irradiates the bonding surfaces of the substrates W1 and W2 with particle beams in the activation treatment device before the substrates W1 and W2 are input to the substrate bonding device 2001. In addition, the particle beam sources 161 and 162 may be an ion gun. Note that, without being limited to irradiation with particle beams, plasma treatment in which exposure to plasma is performed may be performed. In this case, the substrate bonding system is only required to include an activation treatment device that activates the bonding surfaces of the substrates W1 and W2 by exposing the bonding surfaces of the substrates W1 and W2 to plasma before the substrates W1 and W2 are input to the substrate bonding device 2001. In addition, in Embodiment 2, the substrate bonding system may be a substrate bonding system in which a chamber in which an activation treatment step of activating the bonding surfaces of the substrates W1 and W2 is performed and a substrate bonding step chamber in which the substrates W1 and W2 are bonded to each other are separately disposed and the chamber for activation treatment and the substrate bonding step chamber are coupled to each other while high vacuum the degree of vacuum of which is higher than $10^{-5}$ Pa is maintained.

Although, in the embodiments, an example in which the head 402, 2402, or 3402 moves in the vertical direction with respect to the stage 401, 2401, or 3401 was described, the present disclosure is not limited to the example and the substrate bonding device according to the present disclosure may be a substrate bonding device in which, for example, the stage 401, 2401, or 3401 moves in the vertical direction with respect to the head 402, 2402, or 3402.

Although, in the embodiments, an example in which each of the first imager 501 and the second imager 502 is a so-called reflection-type imager that includes an imaging element and a coaxial illumination system was described, the configurations of the first imager and the second imager are not limited to the example. For example, the first imager and the second imager may each have a so-called transmission-type configuration that includes an imaging element (not illustrated) and a light source (not illustrated) arranged at positions facing each other with the substrates W1 and W2 interposed therebetween in the thickness direction of the substrates W1 and W2 and that captures images of the alignment marks MK1a, MK2a, MK1b, and MK2b with the imaging element and the light source arranged in such a way that the imaging element receives light emitted by the light source and transmitted through the substrates W1 and W2.

Note that the substrate bonding step according to the aforementioned embodiments cannot be applied to bonding that requires substrates that are to be bonded to each other to be pressed against each other in a direction in which the substrates come close to each other, such as conventional bonding between substrates on which resin layers are formed and bonding between substrates on which metal portions are formed. The substrate bonding step according to the aforementioned embodiments is a substrate bonding step that is applied to a case where the substrates W1 and W2 are bonded to each other by causing bonding between the substrates W1 and W2 to naturally advance by means of a bonding wave without pressing the substrates W1 and W2 against each other in a direction in which the substrates W1 and W2 come close to each other from the outside.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2021-029519, filed on Feb. 26, 2021, the entire disclosure of which is incorporated by reference herein.

INDUSTRIAL APPLICABILITY

The present disclosure is suitable for manufacturing of, for example, CMOS image sensors, memories, arithmetic elements, or MEMSes.

REFERENCE SIGNS LIST

1,2001 Substrate bonding device
2 Activation treatment device
3 Cleaning device
9 Controller
82 First transportation device
83 Load lock device
84 Second transportation device
120, 212 Chamber
121*a*, 832*a* Vacuum pump
121*b*, 832*b* Exhaust pipe
121*c*, 832*c* Exhaust valve
210, 401, 3401, 4401, 5401, 6401, 9401 Stage
213 Plasma chamber
215 Induction coil
216 High-frequency power source
401*a* Upper surface
401*b*, 402*b* Through-hole
401*c*, 402*c*, 3401*c*, 3402*c*, 4401*c*, 4402*c* Recessed portion
402, 3402, 4402, 5402, 6402, 7402, 8402, 9402 Head
402*a* Under surface
403 Stage driver
404 Head driver
405 XY-direction driver
406 Ascent/descent driver
407 Rotation driver
408 Second pressure sensor
411 Piezo-actuator
412 First pressure sensor
431 First pressing mechanism
431*a* First pressing rod
431*b* First pressing driver
432 Second pressing mechanism
432*a* Second pressing rod
432*b* Second pressing driver
441, 442, 451, 452, 461, 462 Electrostatic chuck
481, 482 Substrate heater
490 Distance measurer
500 Position measurer
501 First imager
502 Second imager
503 Window

504, 505 Mirror
811, 812 Feeding port
813 Take-out port
831 Waiting chamber
3441*a*, 3442*a*, 3451*a*, 3452*a* Suction hole
4401*a*, 4402*a* Peripheral portion
4401*b*, 4402*b* Inner side part
4401*d*, 4402*d*, 5401*d*, 5402*d* Rib
5401*a*, 5402*a* First protruding portion
5401*b*, 5402*b* Second protruding portion
9401*f*, 9402*f* Protrusion
A1 First area
A2 Second area
AC Contact area
GAa, GAb Captured image
MK1*a*, MK1*b*, MK2*a*, MK2*b* Alignment mark
S1 Space
W1, W2 Substrate

The invention claimed is:

1. A bonding method for bonding a first substrate and a second substrate to each other, the bonding method comprising:

a substrate holding step of holding the first substrate and the second substrate while only a peripheral portion is held with respect to at least one of the first substrate and the second substrate and a bonding surface of the first substrate and a bonding surface of the second substrate face each other, a first contact step of bringing a central portion of the first substrate and a central portion of the second substrate into contact with each other while bending the first substrate in such a manner that a central portion of the first substrate protrudes toward the second substrate with respect to a peripheral portion of the first substrate;

a second contact step of, after the first contact step, enlarging a contact area between the first substrate and the second substrate from central portions toward peripheral portions of the first substrate and the second substrate; and a bonding step of, after the second contact step, bonding the first substrate and the second substrate to each other by pressing only an entire peripheral portion of the first substrate against an entire peripheral portion of the second substrate to press the entire peripheral portion of the first substrate and the entire peripheral portion of the second substrate against each other in a direction in which the entire peripheral portion of the first substrate and the entire peripheral portion of the second substrate come close to each other while (i) a peripheral portion of the first substrate is held by a first substrate holder in which a recessed portion is formed in a second area on an inner side of a first area that faces the peripheral portion of the first substrate while the first substrate holder holds the first substrate and (ii) the first substrate and the second substrate are in contact with each other over entire bonding surfaces.

2. The bonding method according to claim 1, wherein, in the substrate holding step, the first substrate and the second substrate are held by electrostatic chucks.

3. The bonding method according to claim 1, wherein, in the second contact step, the bonding method enlarges a contact area between the first substrate and the second substrate from central portions toward peripheral portions of the first substrate and the second substrate by reducing a distance between a peripheral portion of the first substrate and a peripheral portion of the second substrate while a central portion of the first substrate and a central portion of the second substrate are butted against each other.

4. The bonding method according to claim 1, wherein, in the second contact step, the bonding method enlarges a contact area between the first substrate and the second substrate from central portions toward peripheral portions of the first substrate and the second substrate through intermolecular force generated between the first substrate and the second substrate by butting a central portion of the first substrate and a central portion of the second substrate against each other without pressing the first substrate and the second substrate against each other from an outside in a direction in which the first substrate and the second substrate come close to each other.

5. The bonding method according to claim 1 further comprising a hydrophilization step of, before the first contact step, hydrophilizing a bonding surface of the first substrate and a bonding surface of the second substrate.

6. The bonding method according to claim 1, wherein at least the first contact step, the second contact step, and the bonding step are performed under reduced pressure.

7. The bonding method according to claim 1 further comprising an activation treatment step of, before the first contact step, activating a bonding surface of the first substrate and a bonding surface of the second substrate, wherein at least the first contact step, the second contact step, and the bonding step are performed in an environment in which a degree of vacuum is higher than $10^{-5}$ Pa.

8. A substrate bonding device for bonding a first substrate and a second substrate to each other, the substrate bonding device comprising:
    a first substrate holder to hold a peripheral portion of the first substrate in which a recessed portion is formed in a second area on an inner side of a first area that faces a peripheral portion of the first substrate while the first substrate holder holds the first substrate;
    a second substrate holder to hold the second substrate while a bonding surface of the second substrate is caused to face a bonding surface of the first substrate;
    a holder driver to drive at least one of the first substrate holder and the second substrate holder in a direction in which the first substrate holder and the second substrate holder come close to or separate from each other; and
    a controller to control the holder driver to enlarge a contact area between the first substrate and the second substrate from central portions toward peripheral portions of the first substrate and the second substrate from a state in which the first substrate is held by the first substrate holder while the first substrate is bent in such a manner that a central portion of the first substrate protrudes toward the second substrate with respect to a peripheral portion of the first substrate and a central portion of the first substrate and a central portion of the second substrate are in contact with each other and press only an entire peripheral portion of the first substrate against an entire a peripheral portion of the second substrate to press the entire peripheral portion of the first substrate and the entire peripheral portion of the second substrate against each other in a direction in which the entire peripheral portion of the first substrate and the entire peripheral portion of the second substrate come close to each other by pressing the first substrate holder against the second substrate holder while the first substrate and the second substrate are brought into contact with each other over the entire bonding surfaces.

9. The substrate bonding device according to claim 8, wherein
    the first substrate holder includes a first electrostatic chuck to hold a peripheral portion of the first substrate, and
    the second substrate holder includes a second electrostatic chuck to hold a peripheral portion of the second substrate.

10. The substrate bonding device according to claim 9, wherein the second substrate holder has a flat surface on a side that holds the second substrate, has the second electrostatic chuck arranged in a third area that faces a peripheral portion of the second substrate while the second substrate holder holds the second substrate, and has a third electrostatic chuck arranged in a fourth area on an inner side of the third area.

11. The substrate bonding device according to claim 9, wherein
    at least one of the first substrate holder and the second substrate holder is formed of transparent glass, and
    the first electrostatic chuck or the second electrostatic chuck that is arranged in one of the first substrate holder and the second substrate holder that is formed of transparent glass is formed of transparent conductive film.

12. The substrate bonding device according to claim 8, wherein the first substrate holder is located vertically below the second substrate holder.

13. The substrate bonding device according to claim 12 further comprising an imager arranged on an opposite side to a side of the first substrate holder on which the first substrate is supported or an opposite side to a side of the second substrate holder on which the second substrate is supported, wherein
    the holder driver is further capable of relatively moving at least one of the first substrate holder and the second substrate holder with respect to the other in a direction orthogonal to a direction in which the first substrate holder and the second substrate holder face each other,
    on the first substrate, a first alignment mark is disposed,
    on the second substrate, a second alignment mark is disposed,
    the imager captures an image of the first alignment mark and the second alignment mark through the first substrate holder or the second substrate holder, and
    the controller further controls the holder driver to move at least one of the first substrate holder and the second substrate holder in such a way that a relative misalignment amount of the first substrate with respect to the second substrate decreases, based on a captured image of the first alignment mark and the second alignment mark captured by the imager.

14. The substrate bonding device according to claim 8, wherein the controller controls the holder driver in such a manner that at least one of the first substrate holder and the second substrate holder moves in a direction in which the first substrate holder and the second substrate holder come close to each other when a peripheral portion of the first substrate is brought into contact with a peripheral portion of the second substrate from a state in which a central portion of the first substrate and a central portion of the second substrate are in contact with each other.

15. The substrate bonding device according to claim 14, wherein the first substrate holder has, in a second area on an inner side of the first area on the first substrate holder, an annular recessed portion about a central portion of the second area formed.

16. The substrate bonding device according to claim 8, wherein the first substrate holder has at least one rib extending from a central portion of a recessed portion, the recessed portion being disposed in a second area on an inner side of the first area, to a periphery of the recessed portion on the first substrate holder and coming into contact with the first substrate.

17. The substrate bonding device according to claim 16, wherein the at least one rib exists in plural, and a plurality of ribs extends from a central portion of the recessed portion in a radial manner.

18. The substrate bonding device according to claim 8, wherein the first substrate holder further includes a plurality of protrusions that erects on a bottom of the recessed portion and each of which has a tip portion coming into contact with the first substrate while the first substrate holder holds the first substrate.

19. The substrate bonding device according to claim 8 further comprising a chamber to maintain a space in which the first substrate and the second substrate are arranged at a reduced pressure atmosphere.

20. The substrate bonding device according to claim 8, wherein the first substrate holder further includes a gas discharger to bend the first substrate in such a manner that a central portion of the first substrate protrudes toward the second substrate with respect to a peripheral portion of the first substrate by discharging gas into a space between the first substrate holder and the first substrate while the first substrate holder holds a peripheral portion of the first substrate.

21. The substrate bonding device according to claim 8 further comprising a particle beam source to activate a bonding surface of the first substrate and a bonding surface of the second substrate by irradiating a bonding surface of the first substrate and a bonding surface of the second substrate with a particle beam, wherein the substrate bonding device bonds the first substrate and the second substrate to each other in an environment in which a degree of vacuum is higher than $10^{-5}$ Pa.

22. A substrate bonding system comprising:

the substrate bonding device according to claim 8; and a cleaning device to clean a bonding surface of the first substrate and a bonding surface of the second substrate by discharging water on a bonding surface of the first substrate and a bonding surface of the second substrate before the first substrate and the second substrate are input to the substrate bonding device.

23. A substrate bonding system comprising:

the substrate bonding device according to claim 8; and an activation treatment device to activate a bonding surface of the first substrate and a bonding surface of the second substrate by exposing a bonding surface of the first substrate and a bonding surface of the second substrate to plasma before the first substrate and the second substrate are input to the substrate bonding device, wherein the substrate bonding device bonds the first substrate and the second substrate to each other in an environment in which a degree of vacuum is higher than $10^{-5}$ Pa.

\* \* \* \* \*